United States Patent [19]

Smith-Vaniz

[11] Patent Number: 4,796,027
[45] Date of Patent: Jan. 3, 1989

[54] APPARATUS FOR DATA TRANSMISSION FROM MULTIPLE SOURCES ON A SINGLE CHANNEL

[75] Inventor: William R. Smith-Vaniz, Darien, Conn.

[73] Assignee: Niagara Mohawk Power Corporation, Syracuse, N.Y.

[21] Appl. No.: 157,132

[22] Filed: Feb. 10, 1988

Related U.S. Application Data

[60] Continuation of Ser. No. 837,099, Mar. 6, 1986, abandoned, which is a division of Ser. No. 484,681, Apr. 13, 1983, Pat. No. 4,689,752.

[51] Int. Cl.$^4$ .............................................. G08C 15/06
[52] U.S. Cl. ........................ 340/870.03; 340/870.11; 340/870.13; 340/825.06; 340/825.69; 324/127
[58] Field of Search ............................... 324/126, 127; 340/870.03, 870.11, 870.13, 870.38, 825.06, 825.72, 825.69, 825.54, 870.05; 370/85, 91, 94

[56] References Cited

U.S. PATENT DOCUMENTS

| 3,942,170 | 3/1976 | Whyte | 340/310 R X |
| 4,158,810 | 6/1979 | Leskovar | 340/870.17 X |
| 4,332,027 | 5/1982 | Malcolm et al. | 370/94 |
| 4,573,115 | 2/1986 | Halgrimsen | 340/825.06 X |
| 4,604,618 | 8/1986 | Akiba et al. | 340/825.54 X |

OTHER PUBLICATIONS

Stephen D. Foss, Sheng H. Lin, and Roosevelt A. Fernandes, Dynamic Thermal Line Ratings, Part I, IEEE paper No. 82 SM 377-0, presented at IEEE PES 1982 Summer Meeting.
Stephen D. Foss, Howard R. Stillwill, Sheng H. Lin and Roosevelt A. Fernandes, Dynamic Thermal Line Ratings, Part II, IEEE paper No. 82 SM 378-8 presented at IEEE PES 1982 Summer Meeting.

Primary Examiner—Marshall M. Curtis
Assistant Examiner—Tyrone Queen
Attorney, Agent, or Firm—Lalos & Keegan

[57] ABSTRACT

Self contained radio transmitting modules are mounted on power conductors at various places along electrical transmission lines. The modules are capable of measuring current, voltage, frequency and power factor (or the Fourier components thereof), the temperature of the conductor and the temperature of the ambient air. Up to fifteen modules may transmit on a single channel to a single local receiver. Each module transmits at intervals which are an integral number. The intervals between transmissions of all modules do not have a common factor and the average interval is the desired transmission rate.

12 Claims, 56 Drawing Sheets

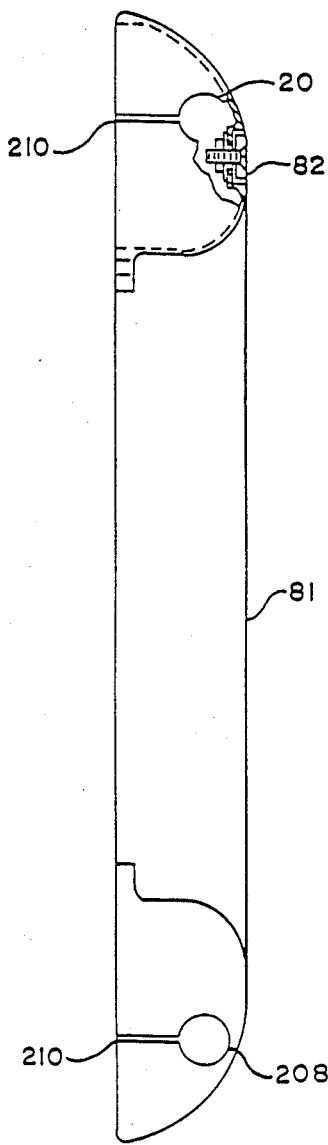
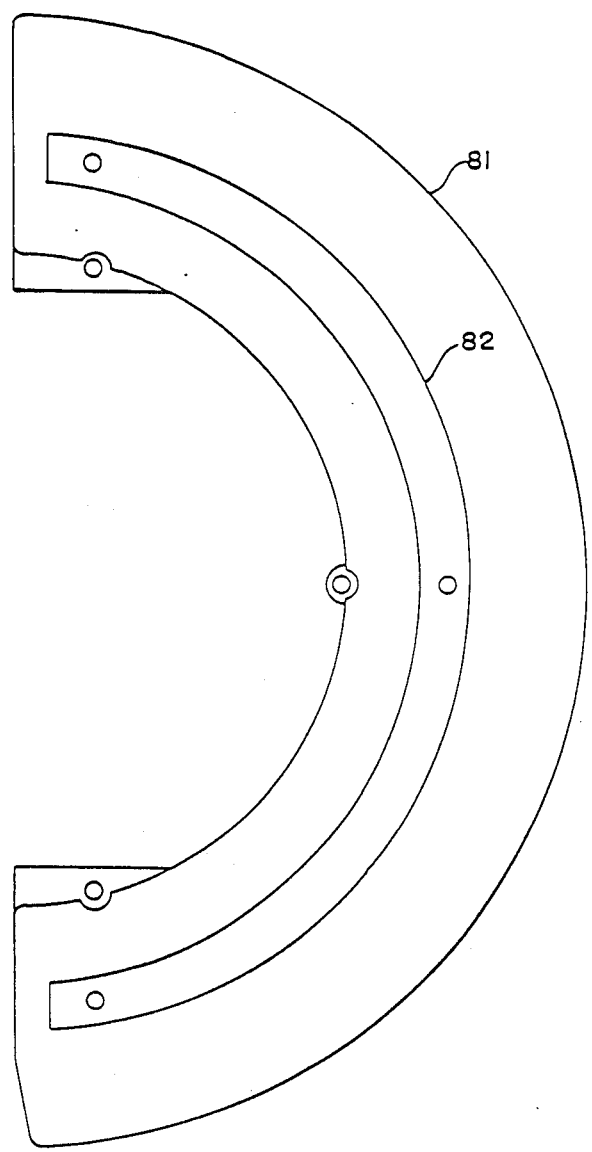
FIG. 9
FIG. 8

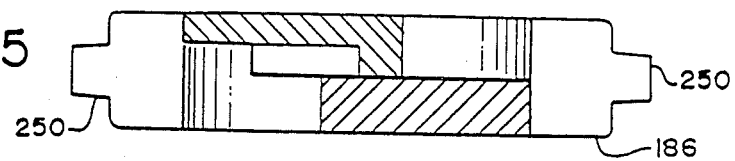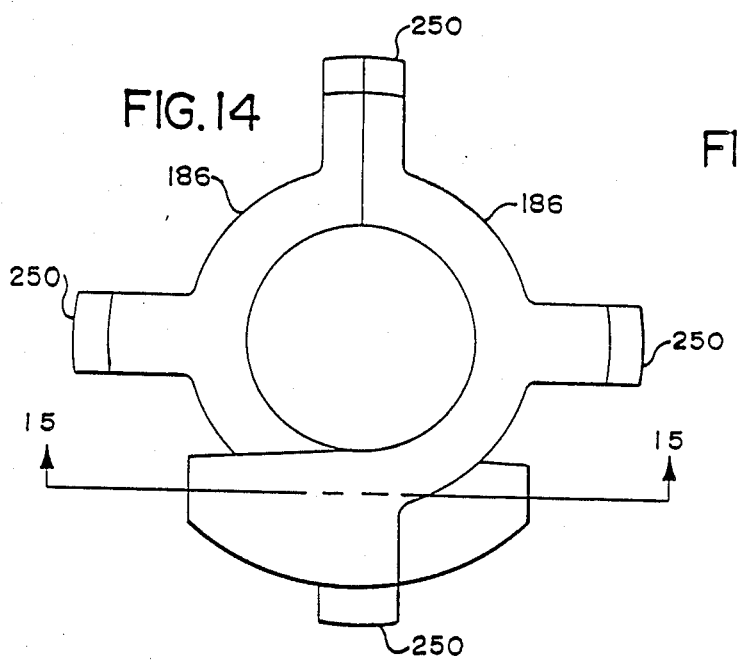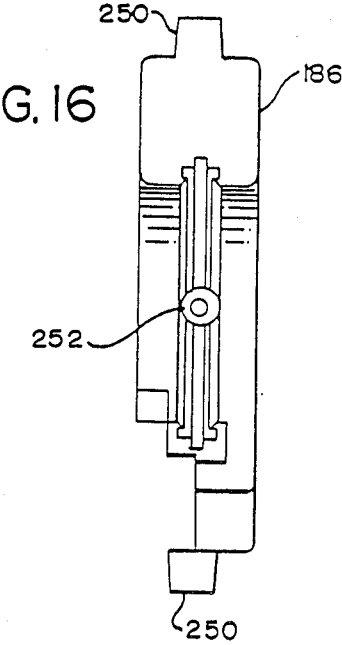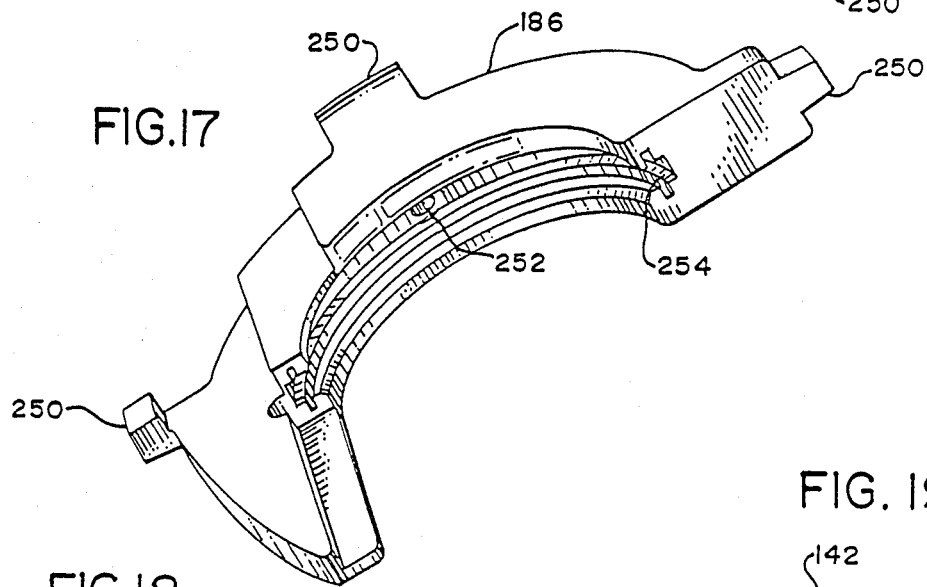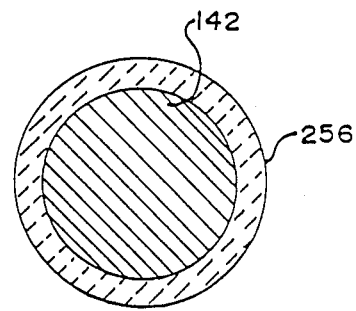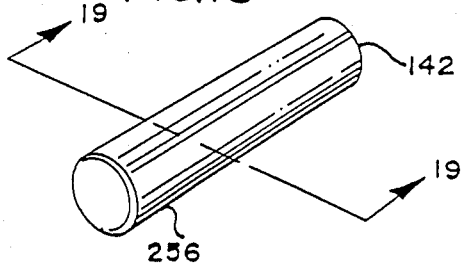

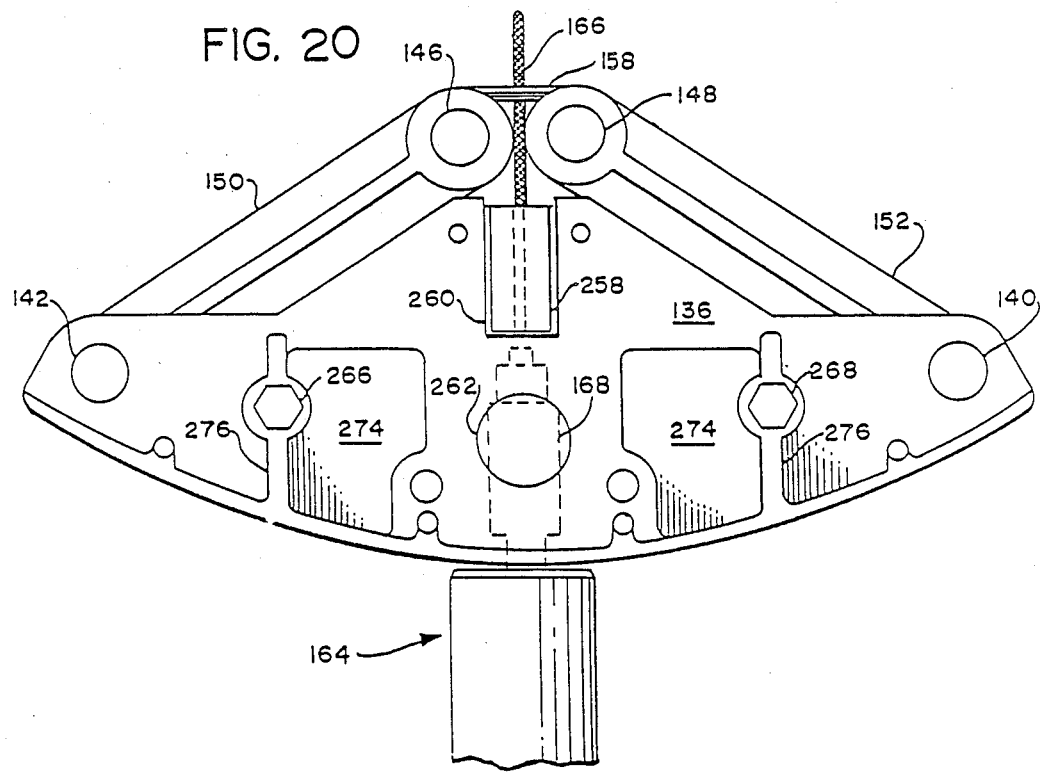
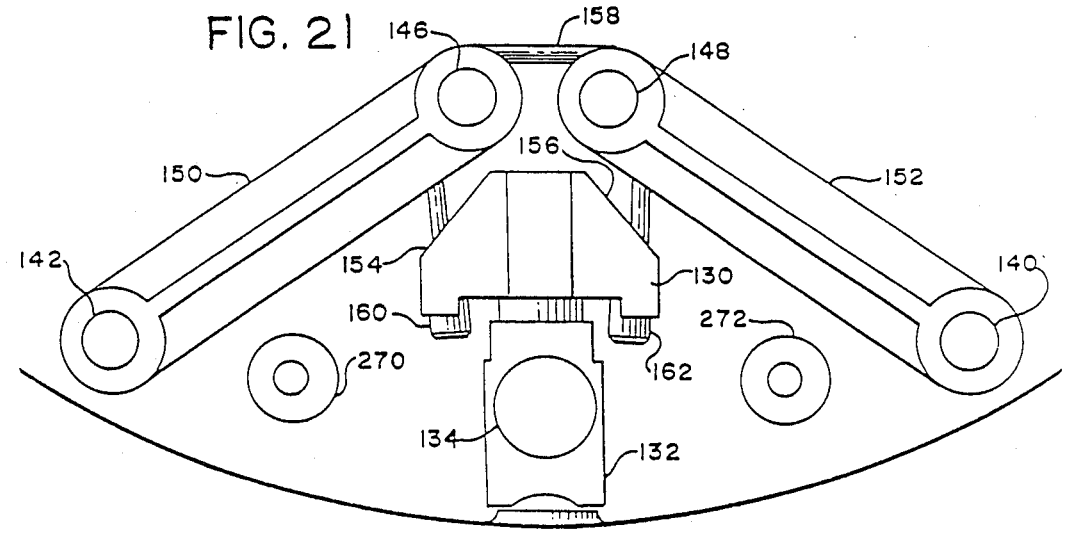

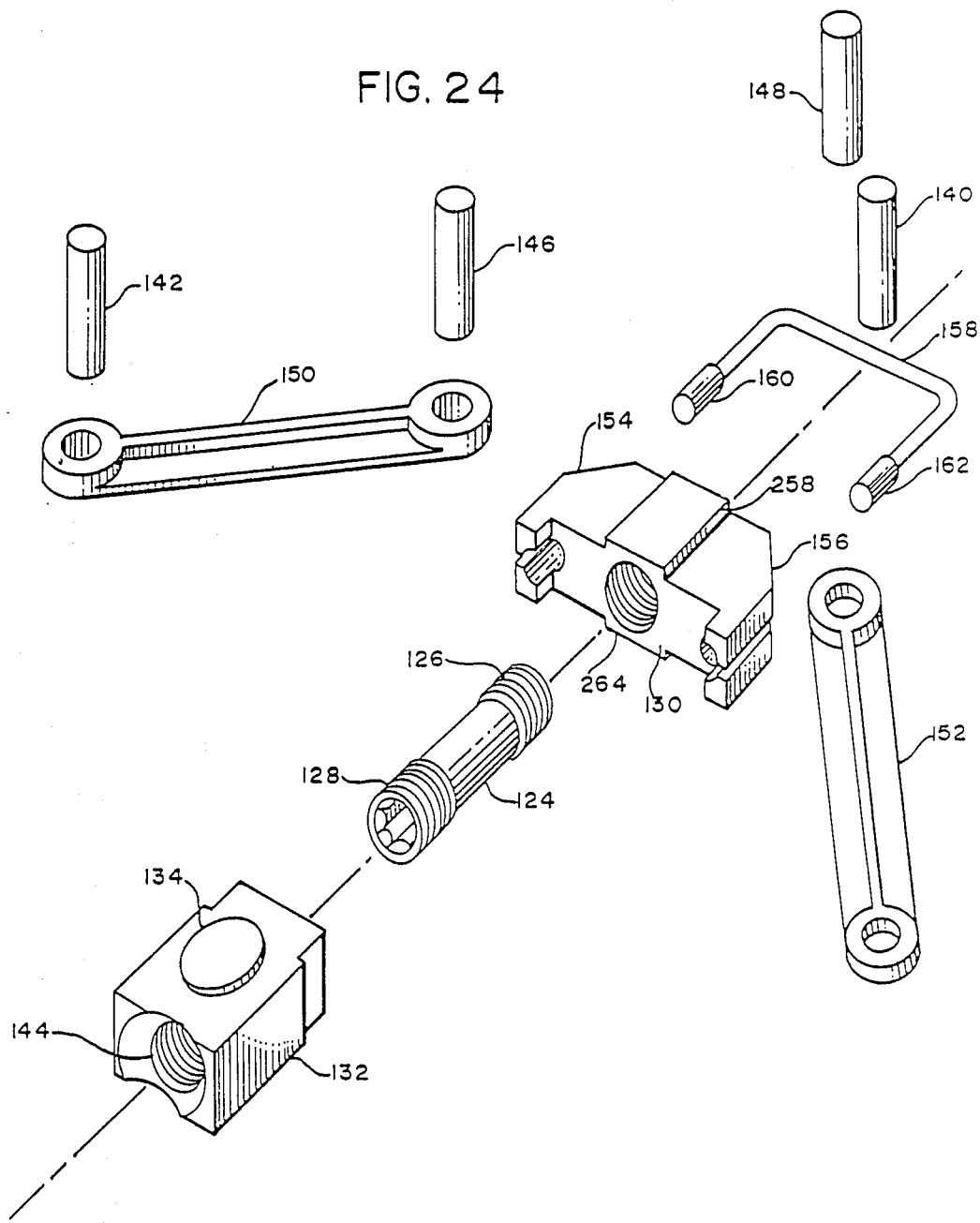

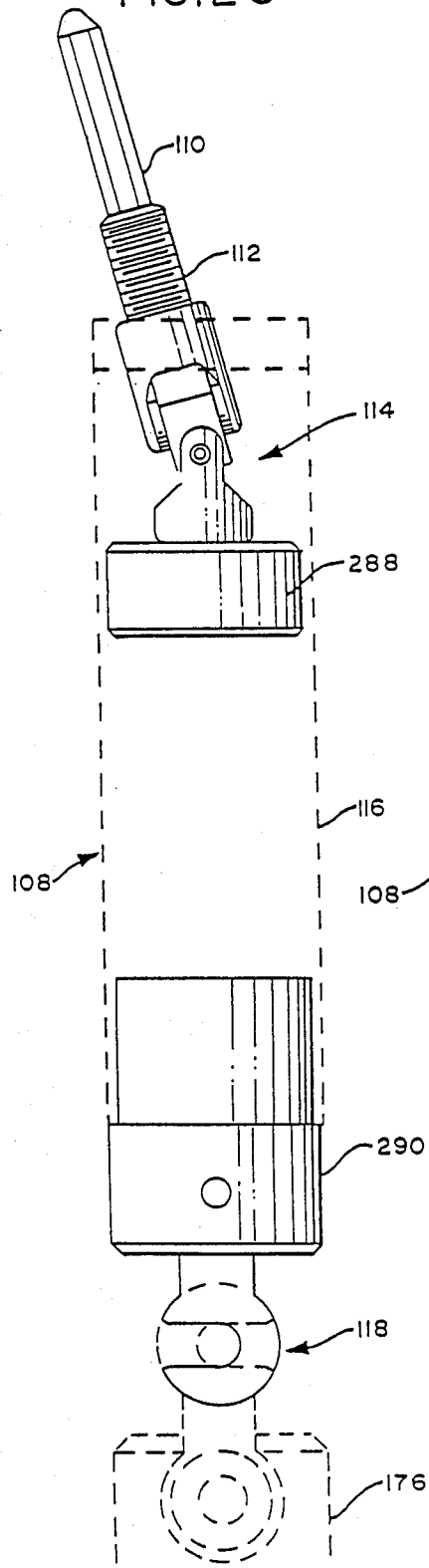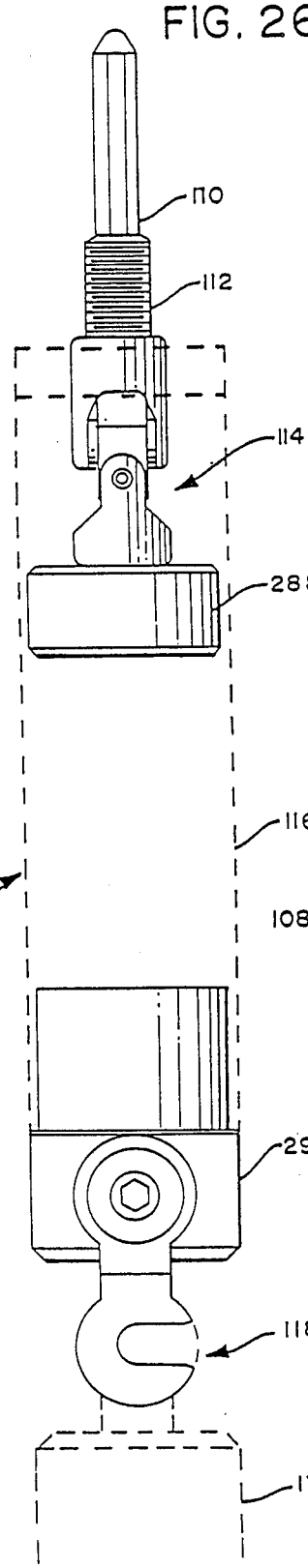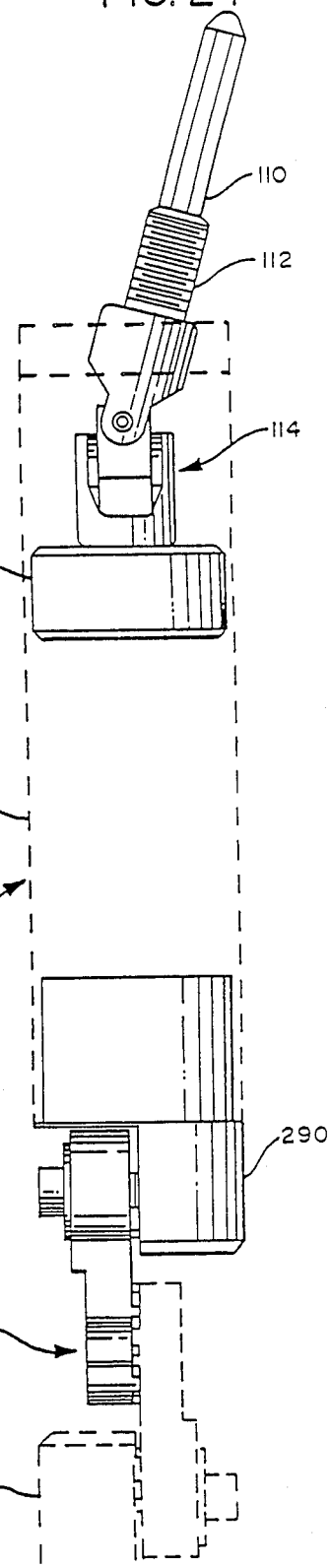

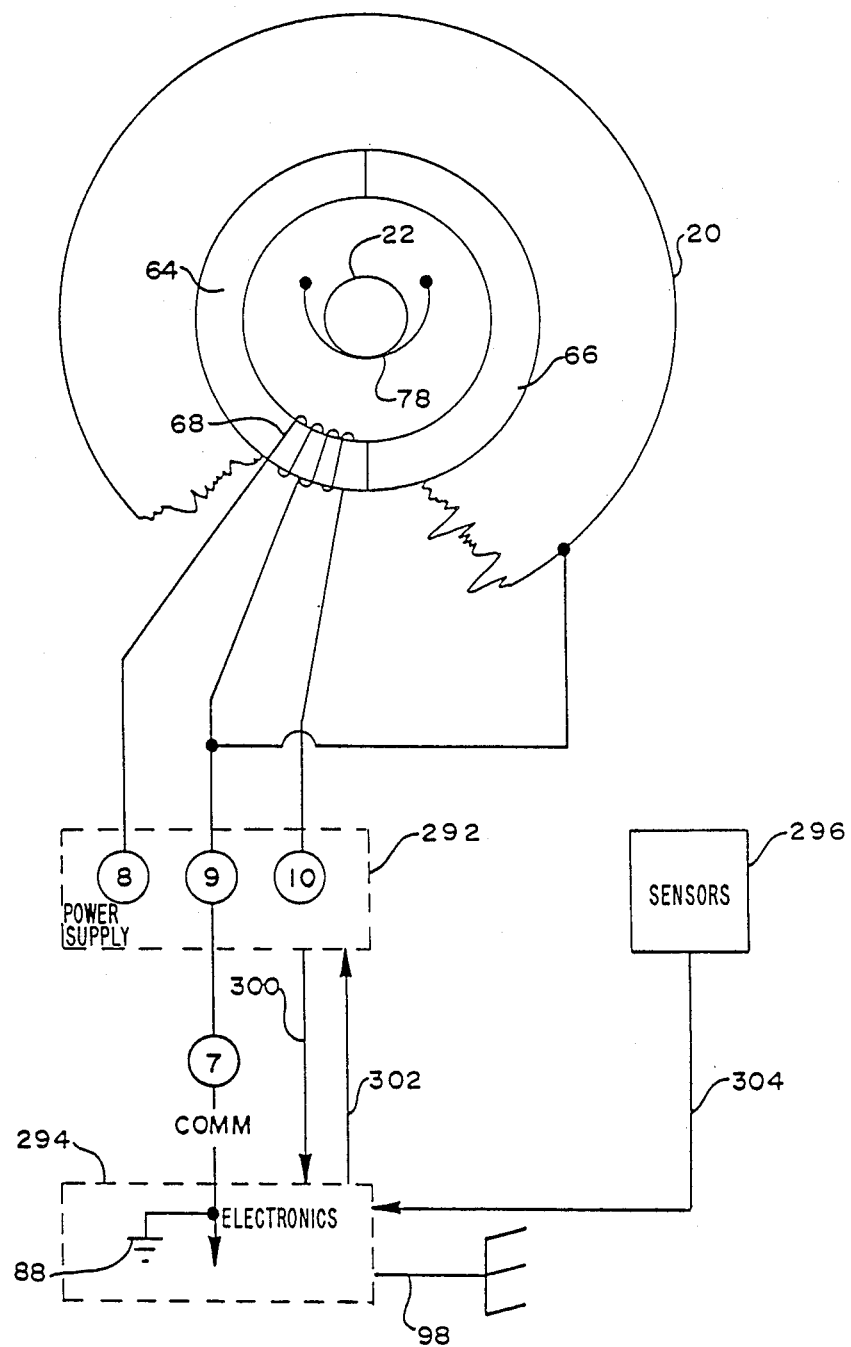

FIG. 38

|   | SPARE | AUX I.D. | DONUT I.D. |
|---|---|---|---|
| 0 | | | |
| 1 | $V_A$ | | |
| 2 | $V_B$ | | |
| 3 | $I_A$ | | |
| 4 | $I_B$ | | |
| 5 | AUXILLIARY DATA | | |
| 6 | CRC | | |

AUXILLIARY I D:  0100   TEMPERATURE 1
                 0110   TEMPERATURE 2
                 1000   CHECK GROUND
                 1010   CHECK VOLTAGE
                 1100   SPARE
                 1110   SPARE

THE MOST SIGNIFICANT BIT OF EACH WORD
IS TRANSMITTED
FIRST.

FIG. 65

| WORD | | | |
|---|---|---|---|
| 0 | GP | PH | |
| 1 | VOLTAGE SCALE FACTOR ||| |
| 3 | CURRENT SCALE FACTOR ||| |
| 5 | TEMPERATURE SCALE FACTOR ||| |
| 7 | TEMPERATURE OFFSET ||| |

FIG. 66

| WORD | | | | | | |
|---|---|---|---|---|---|---|
| 0 | DI | AC | VP | IT | DONUT ID | BUFFER AGE |
| 1 | $V_a$ |||||| |
| 3 | $V_b$ |||||| |
| 5 | $I_a$ |||||| |
| 7 | $I_b$ |||||| |
| 9 | TEMP |||||| |
| 10 | VEFF |||||| |
| 12 | IEFF |||||| |
| 14 | SCALED TEMP |||||| |
| 16 | TOTAL WATTS |||||| |
| 17 | WATT SECONDS |||||| |
| 18 | KILOWATT HOURS |||||| |

FIG. 67

| WORD | | | | | |
|---|---|---|---|---|---|
| 0 | IT | GP | PH | | LINK |
| 1 | | | | | VG |
| 2 | CORRECTION FACTOR #1 | | | | |
| 4 | CORRECTION FACTOR #2 | | | | |
| 6 | CORRECTION FACTOR #3 | | | | |
| 8 | CORRECTION FACTOR #4 | | | | |

FIG. 68

| WORD | | | | | |
|---|---|---|---|---|---|
| 0 | DI | AC | VP | IT | INPUT # |
| 1 | RAW SAMPLE #1 | | | | |
| 2 | RAW SAMPLE #2 | | | | |
| 3 | RAW SAMPLE #3 | | | | |
| 4 | RAW SAMPLE #4 | | | | |
| 5 | RAW SAMPLE #5 | | | | |
| 6 | RAW SAMPLE #6 | | | | |
| 7 | RAW SAMPLE #7 | | | | |
| 8 | RAW SAMPLE #8 | | | | |
| 9 | RAW SAMPLE #9 | | | | |
| 10 | COSINE COMPONENT (FROM FOURIER ANALYSIS) | | | | |
| 12 | SINE COMPONENT (FROM FOURIER ANALYSIS) | | | | |
| 14 | EFFECTIVE VALUE | | | | |
| 16 | TOTAL WATTS | | | | |
| 17 | WATT SECONDS | | | | |
| 18 | KILOWATT HOURS | | | | |

APPARATUS FOR DATA TRANSMISSION FROM MULTIPLE SOURCES ON A SINGLE CHANNEL

RELATED APPLICATION

This is a continuation of co-pending application Ser. No. 837,099 filed on Mar. 6, 1986, now abandoned, which is a divisional of application Ser. No. 484,681, filed Apr. 13, 1983, now U.S. Pat. No. 4,689,752.

This application is related to the prior United States patent application of Howard R. Stillwel and Roosevelt A. Fernandes entitled TRANSPONDER UNIT FOR MEASURING TEMPERATURE AND CURRENT ON LIVE TRANSMISSION LINES, U.S. Pat. No. 4,384,289, issued May 17, 1983, which application is incorporated herein by reference.

TECHNICAL FIELD

This invention relates to a system and apparatus for monitoring and control of a bulk electric power delivery system. More particularly it relates to such systems employing transmission line mounted radio transmitting electrically isolated modules, preferably mounted on all power conductors connected to both the primary and secondary sides of each power transformer to be monitored, on the highest temperature portions of transmission lines, and at intervals through the power delivery system. When so attached the modules form the basis for a dynamic state estimation for real-time computer control of an electric power delivery system.

Each module takes the form of a two piece donut that may be hot stick mounted on a live conductor utilizing a novel hinge clamp and novel hot stick tool.

Novel voltage measuring and fourier component measuring apparatus and a novel common channel unsynchronized transmission system are disclosed.

BACKGROUND ART

Various power line monitored sensors have been disclosed in the prior art. For example, see U.S. Pat. Nos. 3,428,896, 3,633,191, 4,158,810 and 4,268,818. It has been proposed to use sensors of this type and of the greatly improved form disclosed in the above-identified Stillwel and Fernandes application for dynamic line rating of electrical power transmission lines. See for example, papers numbered 82 SM 377-0 and 82 SM 378-8 entitled DYNAMIC THERMAL LINE RATINGS, PART I, DYNAMIC AMPACITY RATING ALGORITHM; and, DYNAMIC THERMAL LINE RATINGS, PART II, CONDUCTOR TEMPERATURE SENSOR AND LABORATORY FIELD TEST EVALUATION; papers presented at the Institute of Electrical and Electronic Engineers P.E.S. 1982 summer meeting. These papers are incorporated herein by reference. However, the full potential of this new technology has not been realized.

Today, for control and protection, power supply to and from an electrical substation over various transmission lines is monitored by separate devices (current transformers, potential transformers and reactive power transducers) for measuring electrical potential, power factor and current in the conductors of the transmission line and the conductors connected to substation power transformers. These measurements are transmitted in analog fashion by various wires to a central console at the substation where their values may or may not be digitized and sent to a central station for control of the entire power system. The wiring of these devices is difficult and expensive, and every excess wire in a substation presents an additional electrical shock hazard or an induction point for electromagnetic interference on protection/telemetry circuits. Furthermore, when a failure occurs, these sensor lines may be abruptly raised to higher voltages, thus increasing the possibility of shock and failure in the measurement system.

The high cost of capital, uncertain power utility load growth trends, coupled with increasing constraints in acquiring and licensing new facilities including right-of-way for transmission lines make greater use of existing power delivery facilities (remote generating stations, the EHV bulk power network, subtransmission and distribution facilities) a paramount consideration. With deferrals that have occured in new generation and power transmission facilities, all elements of the power system will be strained to a greater degree than in the past. In order to maintain current reliability levels under these conditions, additional real-time monitoring will be required to assist the dispatch operator and other bulk network functions conducted through a modern Power Control Center.

Some of the functions in a hierarchical modern Power Control Center, operating through Regional Control Centers down to the distribution level, that require a real-time Supervisory Control and Data Acquisition System are as follows:
1. State Estimation
2. On-Line Load Flow Detection
3. Optimum Power Flow Control for Real and Reactive Power Dispatch
4. Security (i.e. Stability) Constrained Economic Dispatch
5. Contingency Analysis
6. Automatic Generation Control and Minimum Area Control Error
7. Dynamic System Security Analysis
8. Energy Interchange Billing
9. System Restoration After an Emergency
10. Load Shedding and Generation Redispatch
11. Determination of Effects of Voltage Reduction and Real and Reactive Power
12. Synchronization of System Load Profiles to validate various computer models and to provide snap shots of maximum, minimum loads, peak day real and reactive powers on lines and equipment
13. Maintain Power Delivery Quality Including Harmonic Content for Critical Loads and Power Factor
14. Limit checking of voltage, line thermal loadings and rate of change under contingency conditions
15. Protective Relaying.

The key parameters that require measurement for a modern Power Control Center State Estimator and On-Line Load Flow that provide the input data base for the various functions listed above are:
Line and Transformer Bank or Bus Power (MW) Flows
Line and Transformer Bank or Bus Reactive Power (MVAR) Flow
Branch Currents (I), Bus Voltage and Phase Angles
Bus MW and MVAR Injections
Energy (MWh) and Reactive Energy (MVAR-h)
Circuit Breaker Status
Manual Switch Positions
Tap Changer Positions
Frequency (f)
Protective Relaying (Differential Currents, etc.) Operation Power Line Dynamic Ratings Based on Conductor Thermal (Temperature) Limits or Sag
Ambient Temperature/Wind Speed
Line and Equipment Power Factors
Sequence-of-Events Monitoring One of the major problems in implementing a modern Power Control System is to add instrumentation throughout the bulk transmission network at Extra High Voltage (up to 765 kV) line voltages and at distribution substations and feeders. This must be done without disrupting existing operations of equipment and facilities that are largely in place. Another requirement is to avoid adding too many transducers that might alter the burden on existing current transformers and degrade accuracy of existing metering or relaying instrumentation.

The toroidal conductor State Estimator Module and ground station processor, receiver/transmitter of the present invention eliminates the necessity for multiple wiring of transducers required with conventional current and potential transformers and collects all the data required from lines and station buses with a compact system. The invention results in significant investment, installation labor and time savings. It completely eliminates the need for multiple transducers, hard-wiring to current transformers and potential transformers and any degrading effects on existing relaying or metering links. The system can be retrofitted on existing lines or stations or new installations with equal ease and measures:

Line Voltage
Power Factor or Phase Angle
Power Per Phase
Line Current
Reactive Power Per Phase
Conductor Temperature
Ambient Temperature
Wind Speed
Harmonic Currents
Frequency
MW-h and MVAR-h (processed quantities)
Profiles of above quantities from stored values The state-estimator data collection system described in this application enables power utilities to implement modern power control systems more rapidly, at lower cost and with considerable flexibility, since the devices can be moved around using hot-sticks without having to interrupt power flow. The devices can be calibrated and checked through the radio link and the digital output can be multiplexed with other station data to a central processor via remote communication link.

Many problems had to be overcome to provide an electrically isolated state estimator module that can be hot stick mounted to energized conductors including the highest used in electrical transmission.

Among these were: The design of a positive acting mechanism for hinging the two parts of the module and securely clamping and unclamping them about a live conductor while they were supported by a hot stick. Measurement of the voltage of the conductor in a self-contained electrically isolated module. The desire to make many electrical measurements with a necessarily small and light module and common utilization of a single radio channel by the up to 15 modules which might be required at a single substation.

Such hot stick activated hinge and clamp mechanisms do not exist in the prior art. The voltage transformers and capacitive dividers of the prior art are not electrically isolated. Separate measurements of all electrical quantities desired would require too much apparatus in the module. Synchronization of module transmissions would require a radio receiver in each module.

DISCLOSURE OF THE INVENTION

Referring to FIG. 1, toroidal shaped sensor and transmitter modules 20 are mounted on live power conductors 22 by use of a special, detachable hot-stick tool 108 (see FIG. 2) which opens and closes a positively actuated hinging and clamping mechanism. Each module contains means for sensing one or more of a plurality of parameters associated with the power conductor 22 and its surrounding environment. These parameters include the temperature of the power conductor 22, the ambient air temperature near the conductor, the current flowing in the conductor, and the conductor's voltage, frequency, power factor and harmonic currents. Other parameters such as wind velocity and direction and solar thermal load could be sensed, if desired. In addition, each module 20 contains means for transmitting the sensed information to a local receiver 24.

Referring to FIG. 3, each toroidal module 20 is configured with an open, spoked area 26 surrounding the mounting hub 28 to permit free air circulation around the conductor 22 so that the conductor temperature is not disturbed. The power required to operate the module is collected from the power conductor by coupling its magnetic field to a transformer core encircling the line within the toroid. The signals produced by the various sensors are converted to their digital equivalents by the unit electronics and are transmitted to the ground receiver in periodic bursts of transmission, thus minimizing the average power required.

One or more of these toroidal sensor units, or modules, may be mounted to transmission lines within the capture range of the receiver and operated simultaneously on the same frequency channel. By slightly varying the intervals between transmissions on each module, keeping them integral numbers without a common factor and limiting the maximum number of modules in relation to these intervals, the statistical probability of interference between transmissions is controlled to an acceptable degree. Thus, one receiver, ground station 24, can collect data from a plurality of modules 20.

The ground station 24, containing a receiver and its antenna 30, which processes the data received, stores the data until time to send or deliver it to another location, and provides the communication port indicated at 32 linking the system to such location. The processing of the data at the ground station 24 includes provisions for scaling factors, offsets, curve correction, waveform analysis and correlative and computational conversion of the data to the forms and parameters desired for transmission to the host location. The ground station processor is programmed to contain the specific calibration corrections required for each sensor in each module in its own system.

Referring to FIG. 5, the ground stations 24 are connected to the Power Control Center 54 by appropriate data transmission links 32 (radio, land lines or satellite channels) where the measured data is processed by a Dynamic State Estimator which then issues appropriate control signals over other transmission links 33 to the switchgear 58 at electrical substations 44. Thus the power supply to transmission lines may be varied in accordance with their measured temperatures and measured electrical parameters. Similarly, when sensors are located in both the primary and secondary circuits of power transformers, transformer faults may be detected and the power supplied to the transformer controlled by the Dynamic State Estimator through switchgear.

In one aspect of the invention a Dynamic State Estimator may be located at one or more substations to control the supply of electrical power to the transformers located there or to perform other local control functions.

Thus, as shown in FIG. 4, an electrical substation 34 may be totally monitored by the electrically isolated modules 20 of the invention. Up to 15 of these modules may be connected as shown transmitting to a single receiver 24. The receiver may have associated therewith local control apparatus 36 for controlling the illustrative transformer bank 38 and the electrical switchgear indicated by the small squares 40. The modules 20 may be mounted to live conductors without the expense and inconvenience of disconnecting any circuits and require no wiring at the substation 34. The receiver 24 also transmits via its transmission link 32 the information received, from the modules 20 (for determining the total state of the electrical substation) to the Central Control Station 54 of the electrical delivery system.

The system of the invention is adapted for total monitoring and control of a bulk electrical power delivery system as illustrated in FIG. 5. Here, modules 20 are located throughout the delivery system monitoring transformer banks 40 and 42, substations 44 and 46, transmission lines generally indicated at 48 and 50, and feeder sections generally indicated at 52.

A number of modules are preferably located along transmission lines such as lines 48 and 50, one per phase at each monitoring position. By monitoring the temperature of the conductors they indicate the instantaneous dynamic capacity of the transmission line. Since they are located at intervals along the transmission line they can be utilized to determine the nature and location of faults and thus facilitate more rapid and effective repair.

The ground stations 24 collect the data from their local modules 20 and transmit it to the Power Control Center 54 on transmission links 33. The Power Control Center, in turn, controls automatic switching devices 56, 58 and 60 to control the system.

As illustrated in FIG. 5, ground station 24 located at transformer bank 42 may be utilized to control the power supplied to transformer bank 42 via a motorized tap system generally indicated at 62.

As shown in FIG. 6, the module 20 according to the invention comprises two halves of a magnetic core 64 and 66, and a power takeoff coil 68, and two spring loaded temperature probes 70 and 72 which contact the conductor and an ambient temperature probe 74.

In order to insure that the case 76 is precisely at the potential of the conductor 22 when the conductors are contacted by the probes 70 and 72, a spring 78 is provided, which engages the conductor 22 and remains engaged with the conductor and connects it to the case 76 before and during contact of the probes 70 and 72 with the conductor. Alternatively, or simultaneously, contact may be maintained through conductive inputs in the hub 28.

The electrical current in the conductor is measured by a Rogowski coil 80 shown in FIG. 7.

The voltage of the conductor is measured by a pair of arcuate capacitor plates 82 in the cover portions of the donut, only one of which is shown in FIGS. 8 and 9.

The electronics is contained in sealed boxes 84 within the donut 20 as shown in FIG. 10.

Block diagrams of the electronics of the donut 20 are shown in FIGS. 28 and 30.

Referring to FIG. 30, the voltage sensing plates 82 are connected to one of a plurality of input amplifiers generally indicated at 86. The input amplifier 86 connected to the voltage sensing plates 82 measures the current between them and local ground indicated at 88, which is the electrical potential of the conductor 22 on which the donut 20 is mounted. Thus the amplifier 86 provides a measure of the current flowing between the plates 82 and the earth through a capacitance $C_1$ (see FIGS. 32 and 33). That is, it measures the current collected by the plates 86 which would otherwise flow to local ground. This is a direct measure of the voltage of the conductor with respect to earth.

As also shown in FIG. 30, the temperature transducers 70, 72, and 74, and Rogowski coil 80 are each connected to one of the input amplifiers 86. An additional temperature transducer may be connected to one of the spare amplifiers 86 to measure the temperature of the electronics in the donut. The outputs of the amplifiers are multiplexed by multiplexer 90 and supplied to a digital-to-analog converter and computer generally indicated at 92, coded by encoder 94, and transmitted by transmitter 96 via antenna 98, which may be a patch antenna on the surface of the donut as illustrated in FIG. 3.

As illustrated in the timing diagram of FIG. 34, the current and voltage are sampled by the computer 92 nine times at one-ninth intervals of the current wave form; each measurement being taken in a successive cycle. The computer initially goes through nine cycles to adjust the one-ninth interval timing period to match the exact frequency of the current at that time, and then makes the nine measurements. These measurements are transmitted to the ground station 24 and another computer 334 at the ground station (FIG. 62) calculates the current, voltage, power, reactive power, power factor, and harmonics as desired; provides these to a communications board 106; and thus to a communications link 32.

For a maximum of fifteen donuts for which it is desired to transmit information each second or two, the relative transmission intervals can be chosen to be between 37/60ths and 79/60ths of a second; each transmission interval being an integral number of 60ths of a second which do not have a common factor. This form of semi-random transmission according to the invention will insure 76% successful transmission with less than two seconds between successful transmissions from the same donut in the worst case.

The hot stick mounting tool of the invention generally indicated at 108 in FIG. 3 is shown in detail in FIGS. 25, 26, and 27. It comprises a Allen wrench portion 110 and a threaded portion 112, mounted to a universal generally indicated at 114. Universal 114 is mounted within a shell 116 which in turn is mounted to a conventional hot stick mounting coupling generally indicated at 118; and thus the hot stick 176.

When the hot stick tool 108, as shown in FIG. 3, is inserted into the opening 122 in the donut 20, the Allen wrench portion engages barrel 124 (FIG. 24) which is oppositely threaded on each of its ends 126 and 128. Threaded portion 126 is engaged with a mating threaded portion of a cable clamp 130 and threaded portion 128 engages a mating threaded portion 144 of a nut 132. The nut 132 is fixed by means of bosses 134 in plates 136 and 138, mounted to hinge pins 140 and 142 (FIG. 23). Thus, when the hot stick tool 108 is inserted, and barrel 124 rotated in one direction, cable clamp 130 is brought towards nut 132, while when barrel 124 is rotated in the other direction, cable clamp 130 moves away from nut 132. Threaded portion 144 of nut 132 engages the threaded portion 112 of the hot stick tool 108, such that when cable clamp 130 and nut 132 are spread apart the threaded portion 112 of the hot stick tool is threaded into nut 132 so that the donut module 20 may be supported on the tool 108.

Since hinge pins 140 and 142 are located near the outer edge of the donut 20 and fixed pins 146 and 148 are affixed to the donut more inwardly, if the pins 146 and 148 are spread apart, the donut will open to the position shown in FIG. 6 and if the pins 146 and 148 are brought together, the donut will close. The pins 142 and 146 and 140 and 148 are joined by respective ramp arms 150 and 152. When cable clamp 130 is separated from nut 132, the ramp arms, and thus pins 146 and 148, are spread apart by the wedge portions 154 and 156 of cable clamp 130. At the same time the threaded portion 112 of the hot stick tool 108 engages the threaded portion 144 of nut 132 so that the donut 20 is securely mounted to the tool 108. A cable 158 passes around pins 146 and 148 and is held in cable clamp 130 by cable terminating caps 160 and 162. Thus when cable clamp 130 and nut 132 are brought together, the cable 158 pulls fixed pins 146 and 148 together to securely close the donut 20 and clamp it about the conductor 22. Shortly after it is drawn tight, the threaded portion of the hot stick tool 108 disengages the threaded portion 144 of nut 132 by continued turning in the same direction.

If for any reason the donut 20 cannot be removed from a conductor 22 by using the hot stick tool 108, another hot stick tool generally indicated at 164 in FIG. 20 may be used to cut the cable 158. Tool 164 has a file 166 mounted thereon for this purpose. It may also be provided with a threaded portion 168 to engage the threaded portion 144 of nut 132 after the cable 158 has been severed.

OBJECTS OF THE INVENTION

It is therefore an object of the invention to provide a system and apparatus for monitoring and control of an electric power delivery system.

Another object of the invention is to provide such a system predominantly employing radio transmitting modules mounted to power conductors.

A further object of the invention is to provide such a system greatly reducing, if not eliminating, the use of wiring to transmit measurements at an electrical substation.

Still another object of the invention is to provide such a system of determining the state of a substation dynamically.

Yet still another object of the invention is to provide such a system for determining the state of an electrical power delivery system dynamically.

Yet still another object of the invention is to provide such a system for determining dynamic thermal line ratings.

A further object of the invention is to provide such a system for monitoring and controlling the status of electrical power station equipment.

Another object of the invention is to provide such a system wherein the sensors are capable of measuring, as desired, current, voltage, frequency, phase angle, the fourier components of current and voltage from which other quantities may be calculated, the temperature of the conductor to which they are attached, or the temperature of the ambient air surrounding the conductor to which they are attached.

Another object of the invention is to provide a state estimator module to sense various power quantities including those necessary for dynamic line ratings that can be rapidly, safely and reliably installed and removed from an energized high voltage transmission facility, up to 345 KV line to line.

A further object of the invention is to provide a state estimator module that can be installed and removed with standard utility "hot stick" tools with an adaptor tailored for the module and for operation by a single lineman or robot.

Still another object of the invention is to provide a "hot stick" mountable unit that is light weight, compact in size, can be remotely calibrated, is toroidal in shape with a metallic housing consisting of a central hub suitable for various conductor sizes with the "hot stick" tool capable of opening and closing with toroidal housing around the conductor; the hub being provided with ventilating apertures and thermally insulated inserts which grip the transmission line.

A still further object of the invention is to provide a module of the above character that is brought to conductor potential before delicate electric equipment contacts the conductor.

Yet another object of the invention is to provide a state estimator module that maintains positive engagement with a hot stick mountable tool except when it is "snap shut" around the conductor.

Yet still another object of the invention is to provide a hinge clamp for a module of the above character.

A yet still further object of the invention is to provide a hinge clamp of the above character that may be opened by an alternative hot stick mounted tool in case of failure of the hinge clamp.

Another object of the invention is to provide an electrically isolated voltage sensor for a state estimator module of the above character.

Still another object of the invention is to provide an unsynchronized single channel radio transmission system for a plurality of modules of the above character.

Other objects of the invention will in part be obvious and will in part appear hereinafter. The invention accordingly comprises the functions and relationship thereof and the features of construction, organization and arrangement of parts, which will be exemplified in the system and apparatus hereinafter set forth. The scope of the invention is indicated in the claims.

BRIEF DESCRIPTION OF THE DRAWINGS

For a fuller understanding of the nature and objects of the invention reference should be had to the following detailed description taken in connection with the accompanying drawings, in which:

FIG. 8 is a top view of one of the covers;

FIG. 9 is a side view of one of the covers, partly in cross section;

FIG. 14 is an enlarged view of the conductor clamping jaws shown in FIG. 12;

FIG. 15 is a cross section taken along the line 15—15 of FIG. 14;

FIG. 16 is a side view showing the inside of one of the jaws shown in FIG. 14;

FIG. 17 is a enlarged perspective view of one of the jaws of FIG. 14;

FIG. 18 is a view of one of the pins of the hinge clamp mechanism of the invention;

FIG. 19 is a cross sectional view thereof taken along the line 19—19 of FIG. 18;

FIG. 20 is a fragmented partially diagrammatic top view of the hinge clamp of the invention and the tool utilized to open it if it jams;

FIG. 21 is a top view similar to FIG. 20 showing the hinge clamp mechanism of the invention when the state estimator module of the invention is clamped about a conductor;

FIG. 24 is an exploded cross sectional view of the working mechanism of the hinge clamp of the invention;

FIG. 25 is a diagrammatic front view of the hot stick hinge clamp operating tool of the invention;

FIG. 26 is a back view thereof;

FIG. 27 is a side view thereof;

FIG. 28 is a schematic block diagram of the electronics of the state estimator of the invention;

FIG. 38 is a diagram of the message transmitted by the donuts 20;

FIGS. 65, 66, 67, and 68 are diagrams of tables and buffers utilized in the program of FIG. 64.

The same reference characters refer to the same elements throughout the several views of the drawings.

BEST MODE FOR CARRYING OUT THE INVENTION

The State Estimator Module

General

Figure 1:
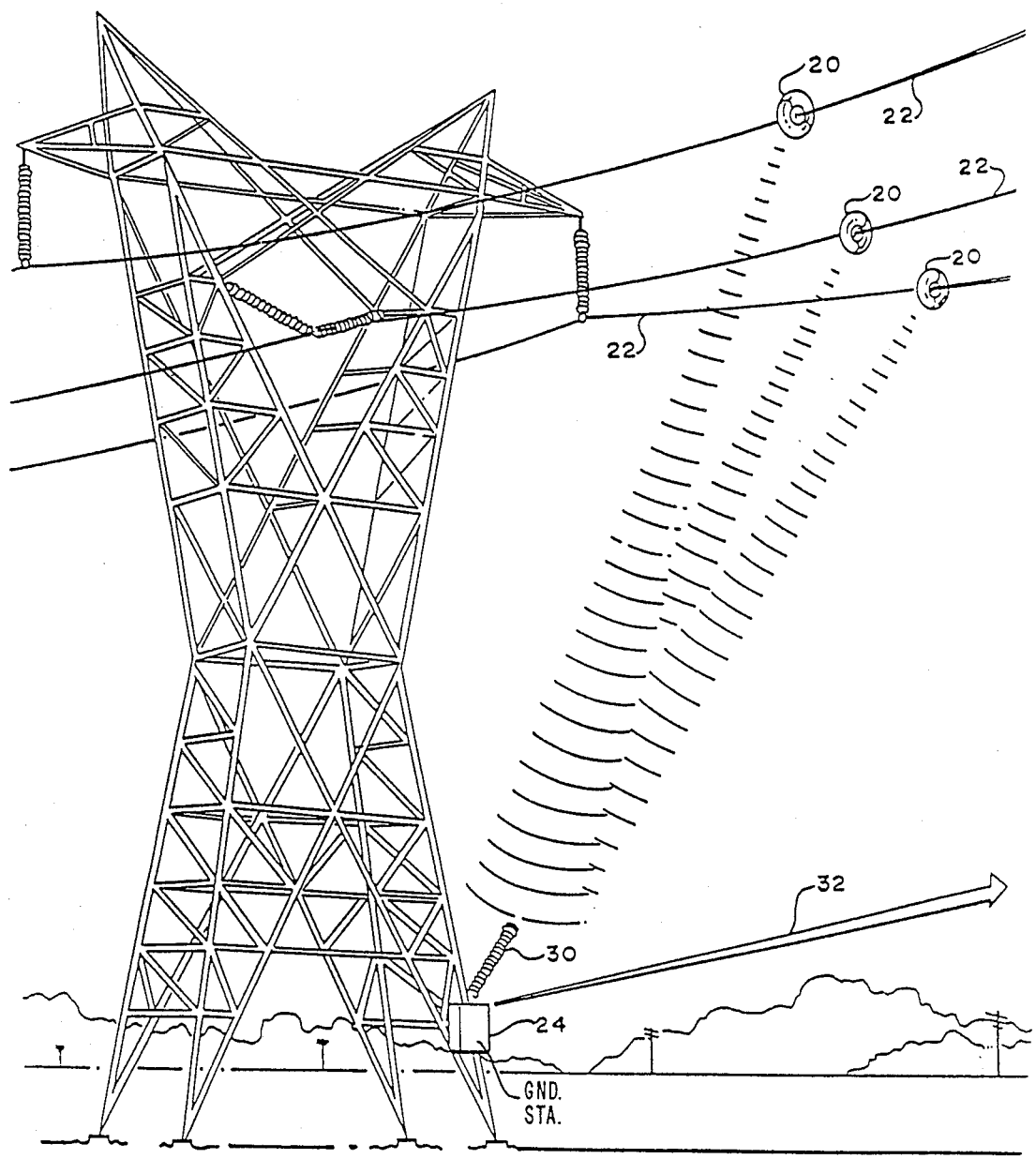
FIG. 1 is a perspective view of the state estimator module of the invention installed on an electrical transmission line.
Figure 2:
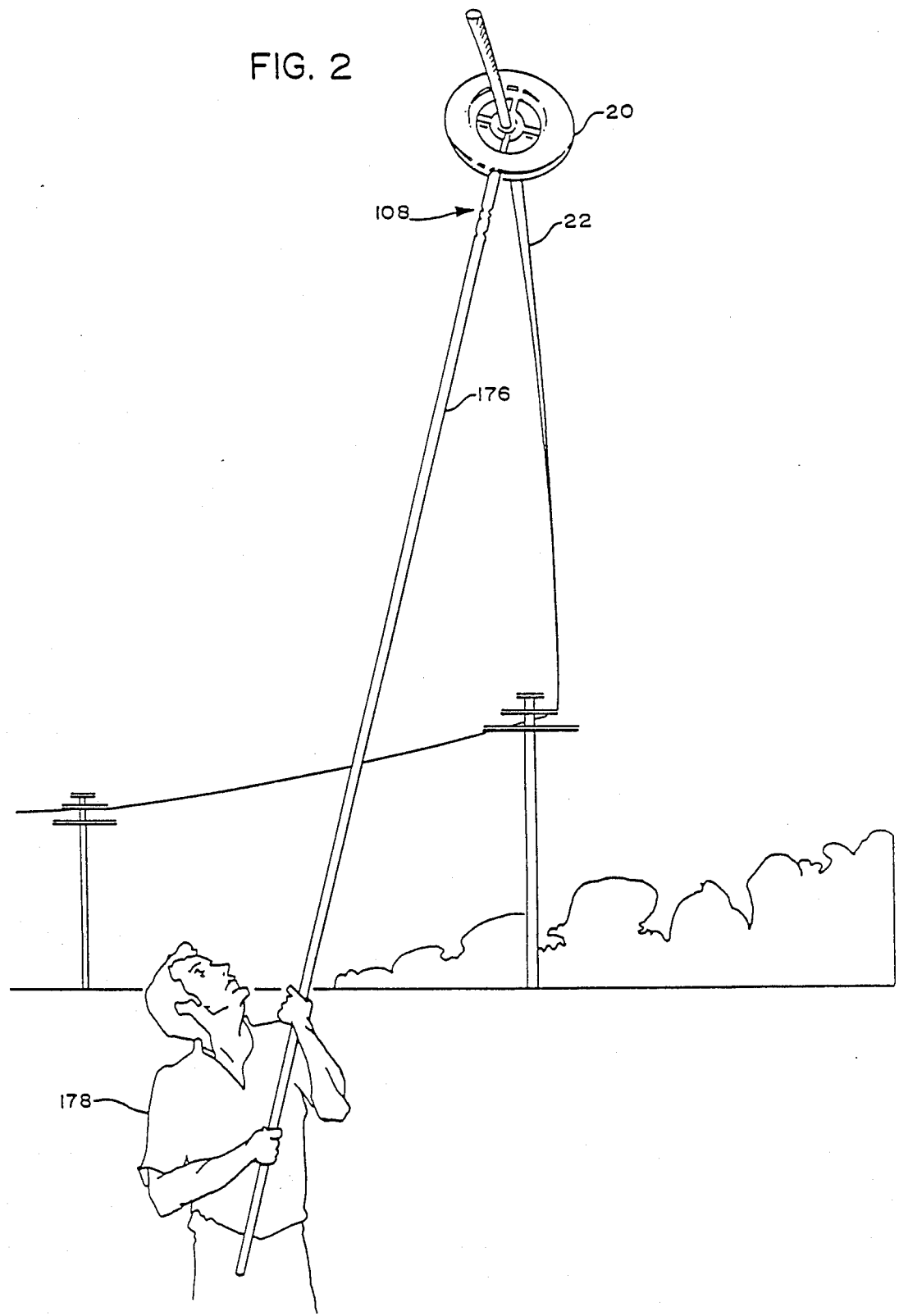
FIG. 2 is a perspective view showing how a state estimator module according to the invention may be hot stick mounted to a live conductor.

The state estimator modules 20 ("Donuts") clamp to a high-tension power conductor 22 and telemeter power parameters to a ground station 24 (FIG. 1). Each module obtains its operating power from the magnetic field generated by the current flowing in the high-tension conductor 22. Each module is relatively small and shaped like a donut, with a $12\frac{5}{8}''$ major diameter and a maximum thickness of $4\frac{3}{4}''$. It weighs approximately 16 pounds and may be mounted in the field in a matter of minutes using a "hot stick" (FIG. 2).

Typically, three donuts 20 are used on a circuit; one for each phase. Each donut is equipped to measure line current, line to neutral voltage, frequency, phase angle, conductor temperature and ambient temperature. Digital data is transmitted by means of a 950 MHz FM radio link in a 5-10 millisecond burst. A microcomputer at the ground station 24 processes data from the 3 phase set and calculates any desired power parameter such as total circuit kilowatts, kilovars, and volt-amps. Individual conductor current and voltage is also available. This data may then be passed on to a central monitoring host computer (typically once a second) over a data link 32.

Figure 4:
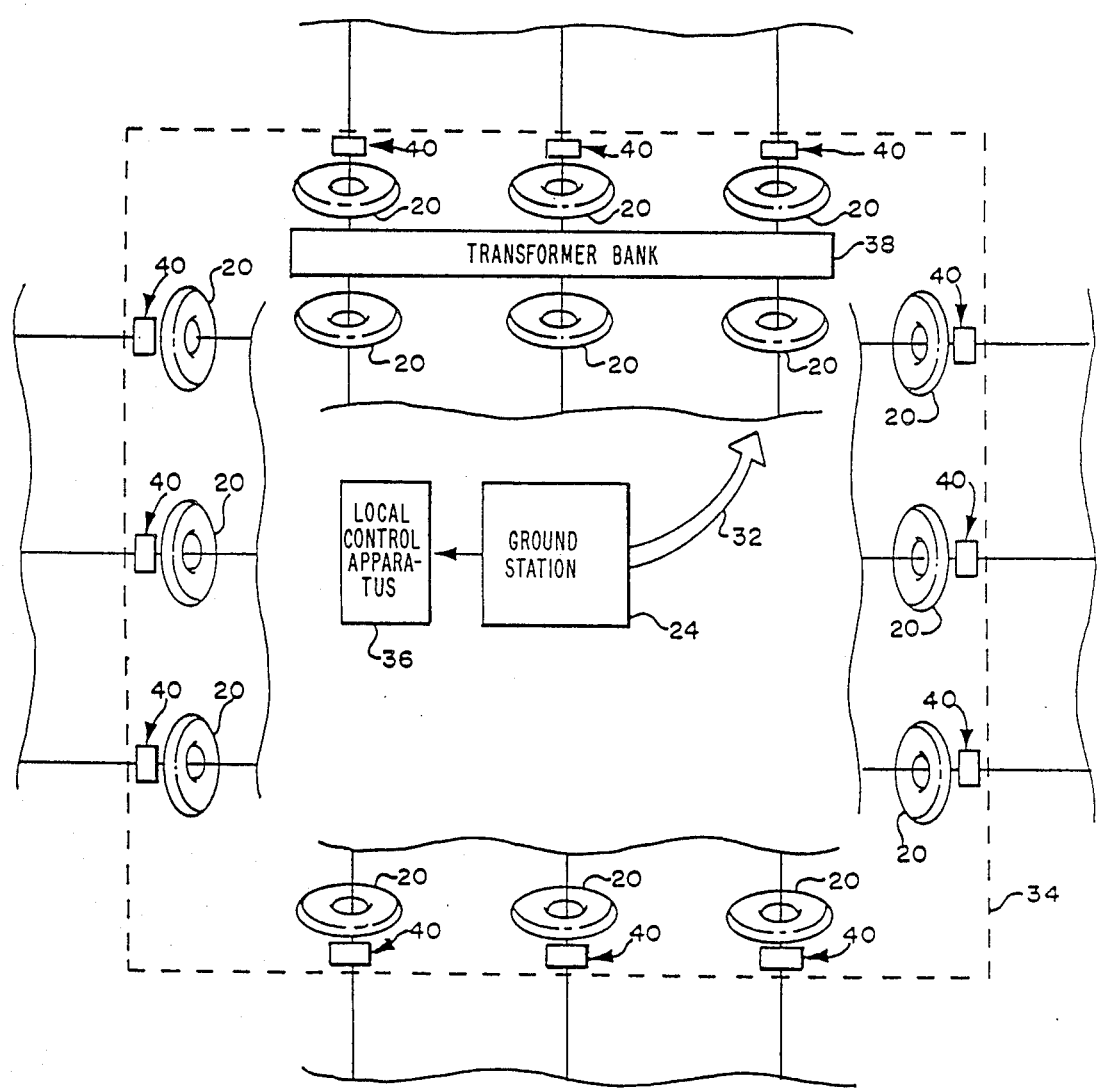
FIG. 4 is a diagrammatic view of a substation totally monitored by means of the system of the invention.

One ground station 24 may receive data from as many as 15 donuts 20, all on the same RF frequency (FIG. 4). Each donut transmits with a different interval between its successive transmission bursts, ranging from approximately 0.3 seconds to 0.7 seconds. Thus, there will be occasional collisions, but on the average, greater than 70% of all transmissions will get through.

Environmental operating conditions include an ambient air temperature range of $-40°$ F. to $+100°$ F.; driving rain, sleet, snow, and ice buildup; falling ice from conductor overhead; sun loading; and vibrations of conductors 22.

Current measurements over a range of 80-3000 amperes must be accurate to within 0.5%. Voltage measurements over a range of 2.4-345 KV (line-line) must be accurate to within 0.5%. Conductor diameters range from 0.5 to 2 inches.

Figure 13:
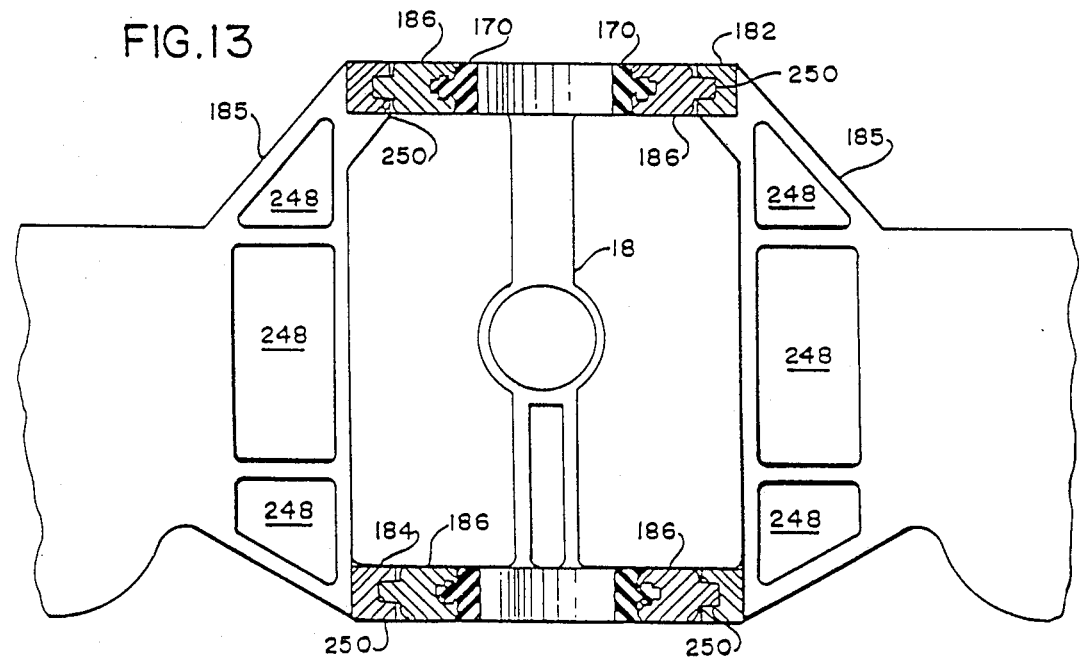
FIG. 13 is a cross sectional view taken along the line 13—13 of FIG. 12.

All exterior surfaces are rounded and free from sharp edges so as to prevent corona. The module weighs approximately 16 pounds. It is provided with clamping inserts for different conductor diameters which are easily removeable and replaceable. The conductor clamping does not damage the conductor, even after prolonged conductor vibration due to the use of neoprene conductor facings 170 in the inserts 186 (FIG. 13).

The special hot stick tool 108 is inserted into the donut 20. Turning of the hot stick causes the donut to split so that it may be placed over a conductor. Turning the hot stick in the opposite direction causes the donut to close over a conductor and clamp onto it tightly. The tool 108 may then be removed by simply pulling it away. Reinsertion and turning will open the donut and allow it to be removed from the line.

Conductor temperature probes 70 and 72 (FIG. 6) are spring loaded against the conductor when the donut is installed. The contacting tip 174 (FIG. 10) is beryllia and inhibits corrosion and yet conducts heat efficiently to the temperature transducer within. It is also a nonconductor of electricity so as not to create a low resistance path from the conductor to the electronics.

The hub and spoke area in the center of the donut 20 and the temperature probe placement are designed with as much free space as possible so as not to affect the temperature of the conductor.

Figure 10:
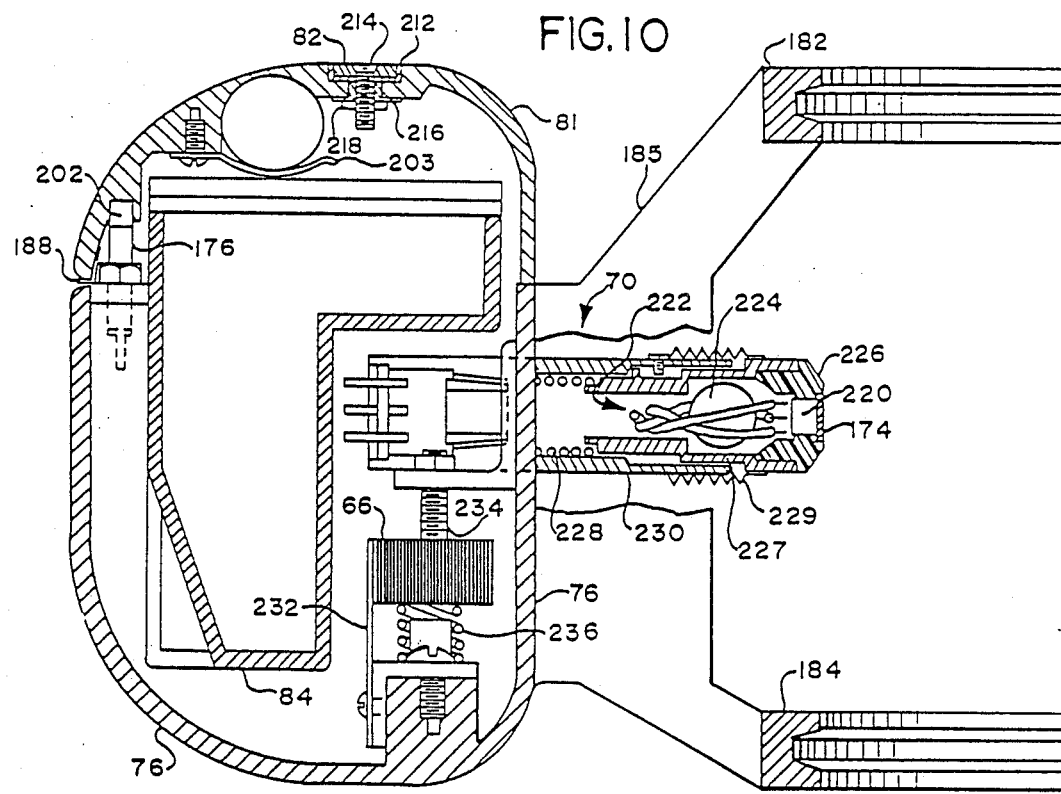
FIG. 10 is an enlarged cross sectional view taken along the line 10—10 of FIG. 6 with the cover in place.

All electronics within the donut are sealed in watertight compartments 84 (FIG. 10).

The radio frequency transmitter power of the donut 20 is typically 100 milliwatts. However, it may be as high as 4 watts. The donut 20 is protected against lightning surges by MOV devices and proper grounding and shielding practice. All analog and digital circuitry is CMOS to minimize power consumption.

No potentiometers or other variable devices are used for calibration in donut 20. All calibration is done by the ground station 24 by scaling factors recorded in computer memory.

Each donut is jumper programmable for current ranges of 80–3000 amperes or 80–1500 amperes.

Figure 7:
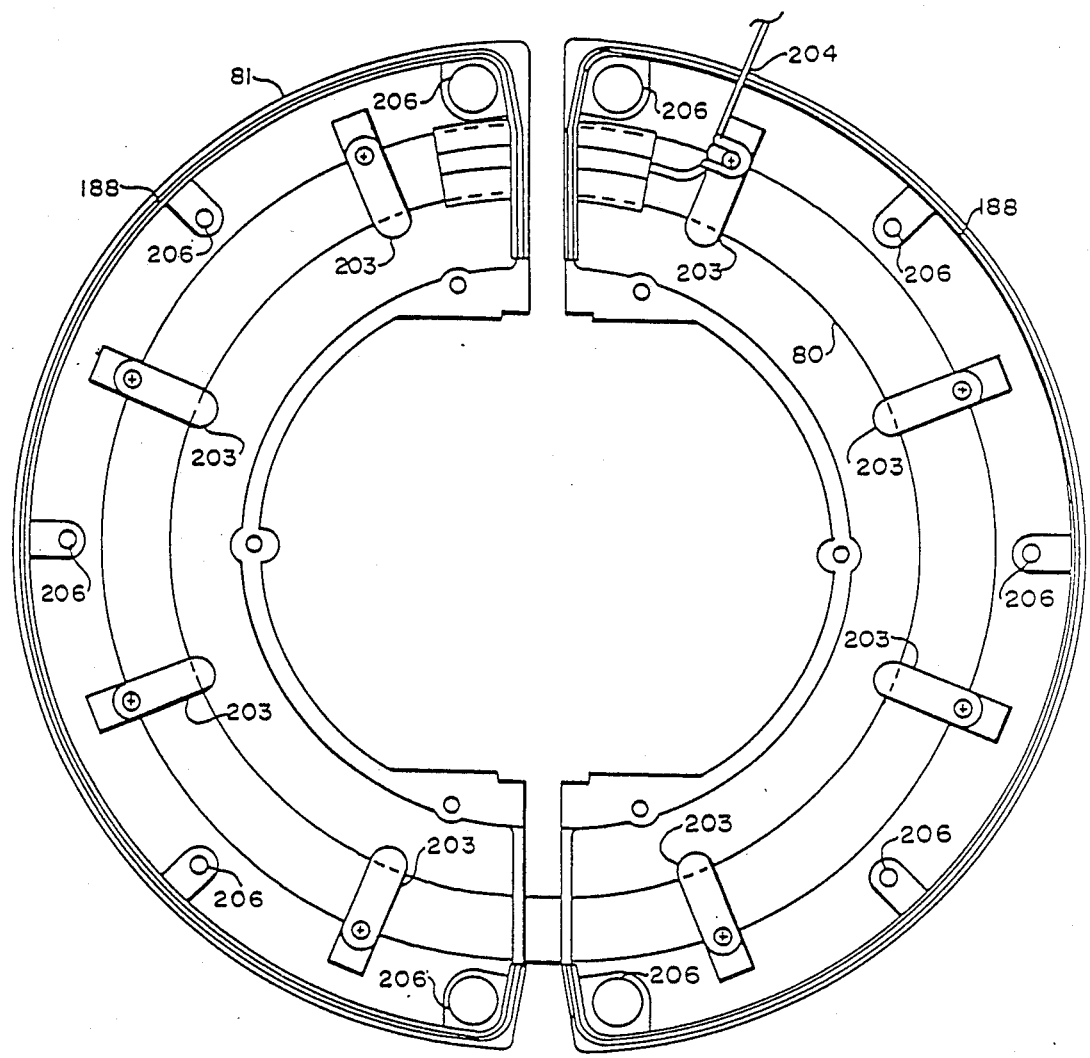
FIG. 7 is a bottom view of the covers of a state estimator module according to the invention.

Current is measured by using a Rogowski coil 80 (FIG. 7). Voltage is measured by two electrically insulated strips of metal 82 (FIG. 8) imbedded flush on the exterior of one face of the donut. These strips act as one plate of a capacitor at the potential of the conductor. The other plate is the rest of the universe and is essentially at calibrated ground (neutral) potential with respect to the donut. The amount of current collected by the donut plate from ground is thus proportional to the potential of the donut and the conductor on which it is mounted.

Power to operate donut electronics is derived from a winding 68 on a laminated iron core 64-66 which surrounds the line conductor. This core is split to accommodate the opening of the donut when it clamps around the conductor. The top and bottom portions of the aluminum outer casing of the donut are partially insulated from each other so as not to form a short circuited turn. The insulation is shunted at high frequency by capacitors 176 (FIG. 10) to insure that the top and bottom portions 76 and 81 are at the same radio frequency potential.

The data is transmitted in Manchester code. Each message comprises the latest measured Fourier components of voltage and current and another measured condition called the auxiliary parameter, as well as an auxiliary parameter number to identify each of the five possible auxiliary parameters. Thus, each message format is as follows:

| | |
|---|---|
| Donut Identification Number | 4 bits |
| Auxiliary Parameter Number | 4 bits |
| Voltage Sine Component (Fourier Fundamental) | 12 bits |
| Voltage Cosine Component (Fourier Fundamental) | 12 bits |
| Current Sine Component (Fourier Fundamental) | 12 bits |
| Current Cosine Component (Fourier Fundamental) | 12 bits |
| Auxiliary Parameter | 12 bits |
| Cyclic Redundancy Check | 12 bits |

The auxiliary parameter rotates among 5 items on each successive transmission as follows:

| Auxiliary Parameter No. | Parameter |
|---|---|
| 0 | Conductor Temperature |
| 1 | Ambient Exterior Temperature |
| 2 | Check Ground (0 volts nominal) |
| 3 | Check Voltage (1.25 volts nominal) |
| 4 | Interior Temperature |

More specifically, and referring to FIG. 2, the hot stick tool 108 may be mounted on a conventional hot stick 176 so that the module 20 may be mounted on an energized conductor 22 by a man 178.

Figure 3:
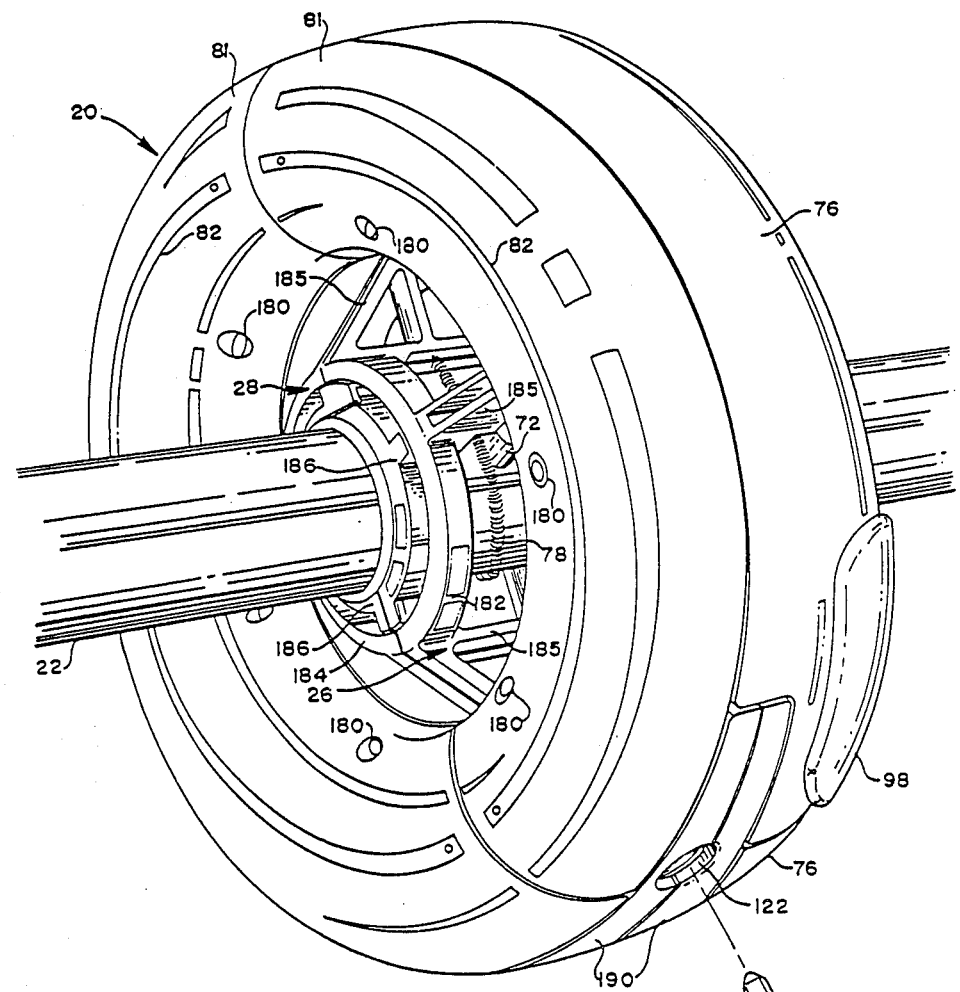
FIG. 3 is a perspective view of a state estimator module according to the invention mounted to a conductor.

In FIG. 3 it can be seen how the hot stick tool 108 provided with an Allen wrench portion 110 and a threaded portion 112 fits within a hole 122 provided in the donut 20 mounted on conductor 22. The donut comprises two bottom portions 76 and two covers, or top portions 81, held together by six bolts 180. Each bottom portion 76 is provided with a top hub 182 and a bottom hub 184 (see also FIG. 13), supported on three relatively open spokes 185.

Conductor temperature probes 70 and 72 (see also FIG. 6) are aligned within opposed spokes 185.

Identical clamping inserts 186 are held within opposed hubs 182 and 184 (see FIG. 13) and clamp conductor 22 with hard rubber facings 170 provided therein. The tops 81 (FIG. 3) are each provided with an arcuate flat flush conductor 82 insulated from the housing for measuring voltage and one of the bottom portions 76 is provided with a patch antenna 98 for transmitting data to the ground station.

Although the top portions 81 are each provided with a non-conductive rubber seal 188 (FIG. 7) and the area around the hinge is closed by cover plates 190, water escape vents are provided in and around the access opening 122, which due to the hot stick mounting is always at the lower portion of the donut 20 when installed on a conductor 22.

Figure 6:
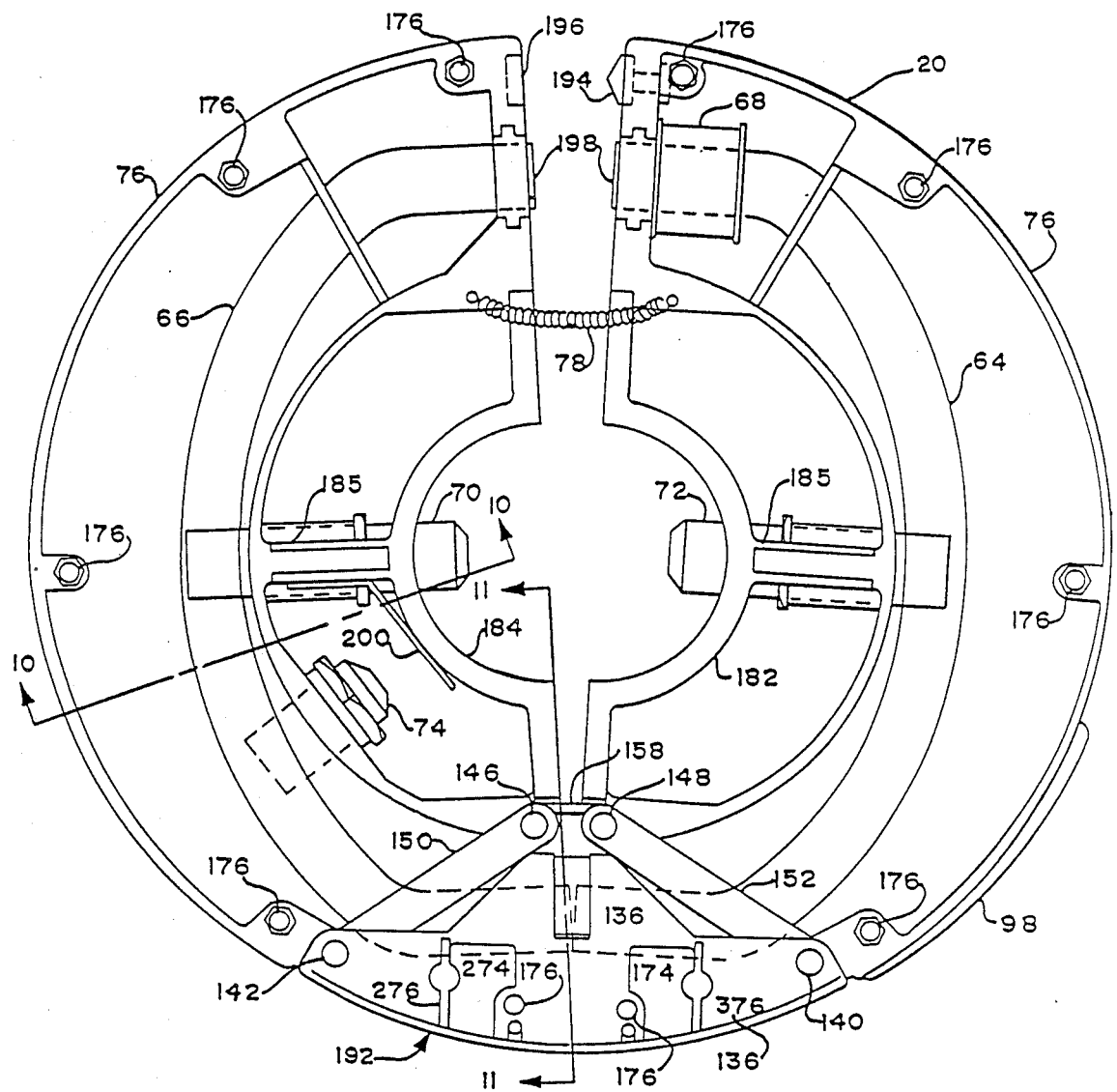
FIG. 6 is a top view of a state estimator according to the invention with the covers thereof removed.

Now referring to FIG. 6, a hinge mechanism is provided, generally indicated at 192. It comprises hinge pins 140 and 142, mounted in a top plate 136 and a bottom plate 138 (see FIG. 23). When opening or closing, the bottom portions 76 along with their covers 81 rotate about pins 140 and 142. The two halves of the donut 76—76 are drawn together to clamp the conductor by bringing fixed pins 146 and 148 together by means of cable 158. They are separated by pushing a wedge against wedge arms 150 and 152 to separate pins 146 and 148 which are affixed to the bottom portion 76—76.

To make certain that the bottom portion 76—76 of the donut 20 are at the potential of the conductor, a spring 78 is provided which continuously contacts the conductor during use and contacts it before it comes in contact with the temperature probes 70 and 72, protecting them against arcing.

To insure that the unit comes together precisely, a locating pin 194 and locating opening 196 are provided. The multi-layer power transformer cores 64 and 66 come together with their faces in abutting relationship when the unit is closed. They are spring loaded against each other and mounted for slight relative rotations so that the flat faces, such as the upper faces 198 shown in FIG. 6 will fit together with a minimum air gap when the unit is closed. The temperature probes 70 and 72 are spring loaded so that they press against the conductor when the unit is closed. The ambient probe 74 is provided with a shield 200 covering the hub area so that it looks at the temperature of the shield 200 rather than the temperature of the conductor.

The temperature probes 70 and 72 are located in alignment with opposed spokes 185 so as to provide the least amount of wind resistance so that the conductor at the probes 70 and 72 will be cooled by the ambient air in substantially the same way as the conductor a distance away from the module 20.

The ten radio frequency shunting capacitors 176 can also be seen in FIG. 6, as well as the patch antenna 98.

Now referring to FIG. 7, a Rogowski coil 80 is affixed to the covers 81 by eight brackets 202 and is connected by lead 203 to the electronics in the bottom portions 76 (FIG. 10). The non-conductive rubber seal 188 may be seen in FIG. 7, as well as recesses 206 for stainless steel fiber contacting pads 202 which contact the RF shunting capacitors 176 (FIG. 10).

Now referring to FIGS. 8 and 9, the capacitor plate 82 can be seen mounted flush with the surface of one of the covers 81. It may also be seen in FIG. 9 how the openings 206-208 for the Rogowski coil are provided with slots 210 to prevent the formation of a short circuiting path around it.

Now referring to FIG. 10, the arcuate capacitor plates 82 are insulated from the case 81 by teflon or other non-conducting material 212. The surface gap between the capacitor plate 82 and the surface of the case 81 is 0.005 inches. The plates 82 are mounted to the tops 81 by means of screws 214 passing through insulated bushings 216 and nuts 218, or by other comparable insulated mounting means. Connection between the capacitor plates 82 and the electronics may be made by means of the screws 214. A stainless steel wool pad 202 may be seen in FIG. 10 connecting to the shunt capacitor 176 which may be in the form of a feed through capacitor. The insulating seal 188 is shown next to the shunt capacitor 176.

The temperature probe 70 comprises an Analog Device AD-590 sensor 220 mounted against a beryllia insert 174 which contacts the conductor 22. The three conductors generally indicated at 222 connect the electronics to the sensor 220 through an MOV 224.

The sensor 220 and beryllia insert 174 are mounted in a probe head 226 which in turn is mounted to a generally cylindrical carriage 227 pushed out by spring 228 to force the beryllia insert 174 against the conductor. A rubber boot 229 protects the interior of the probe 70. The probe head 226 is formed of an electrical and heat insulating material. The probe 72 is mounted in a cylindrical post 230 which preferably is adjustable in and out of the lower casing 76 for adjustment to engage conductors of differing diameters. The other conductor temperature probe 72 is identical.

An electronics box 84 is mounted within each of the two bottom portions 76 and top portion 81. The boxes 84 are hermetically sealed. The power pickup transformer core 66 and its mating transformer core 64 (FIG. 6) in the other half of the module is pressed by leaf spring 232 against the mating core 64 and is pushed against post 234 by means of spring 236 so that the flat faces 198 of the two cores 64 and 66, shown in FIG. 6, will come together in a flat face to face alignment when the module is closed.

Figure 11:
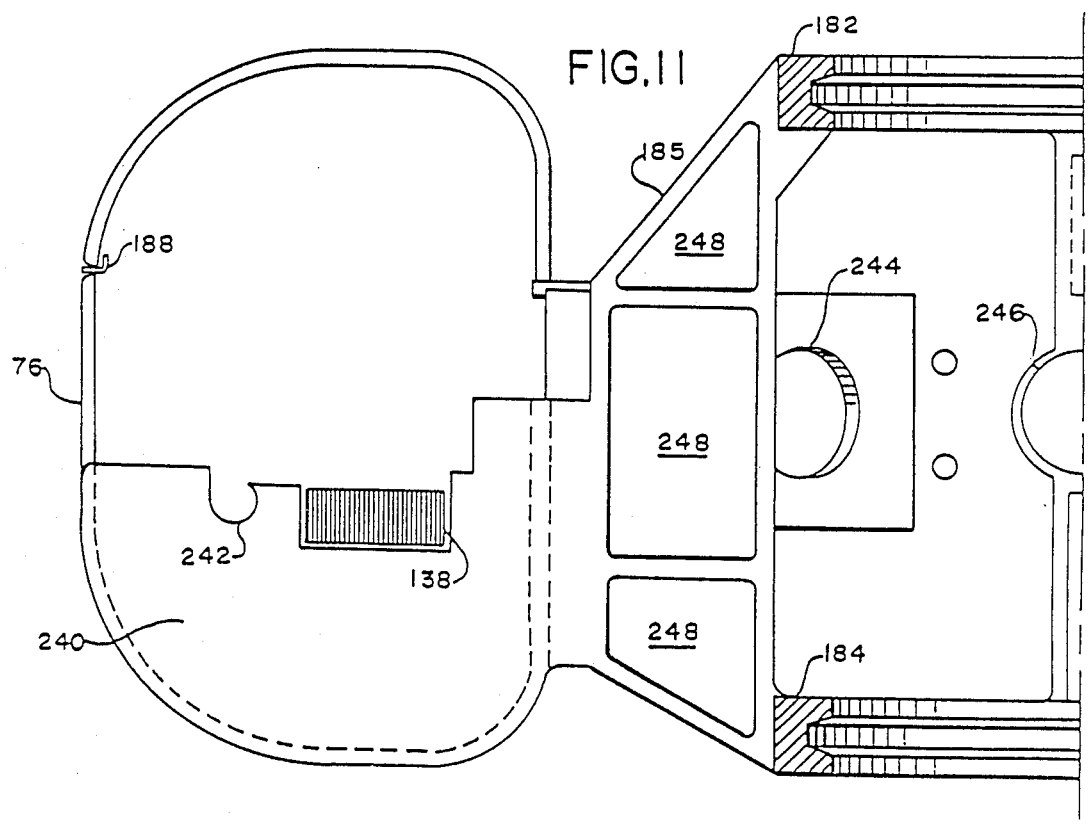
FIG. 11 is an enlarged cross sectional view taken along the line 11—11 of FIG. 6 with the cover in place.

Referring now to FIG. 11, it can be seen how the end face 238 of the core 66 passes through the end plate 240 of lower portion 76. Opening 242 is provided for electrical wiring connecting the sealed circuit containers 84 in both halves of the device. It should be noted how opening 242 is open, again to prevent encircling the wiring.

The opening 244 for the ambient sensor 74 and the opening 246 for the conductor sensor 70 may be seen in FIG. 11. The hubs 182 and 184 and spokes 185 may be seen in FIGS. 10 and 11 although the openings 248 in the spoke 185 of FIG. 10 are not shown in order that the temperature probe 70 may be shown in detail.

Figure 12:
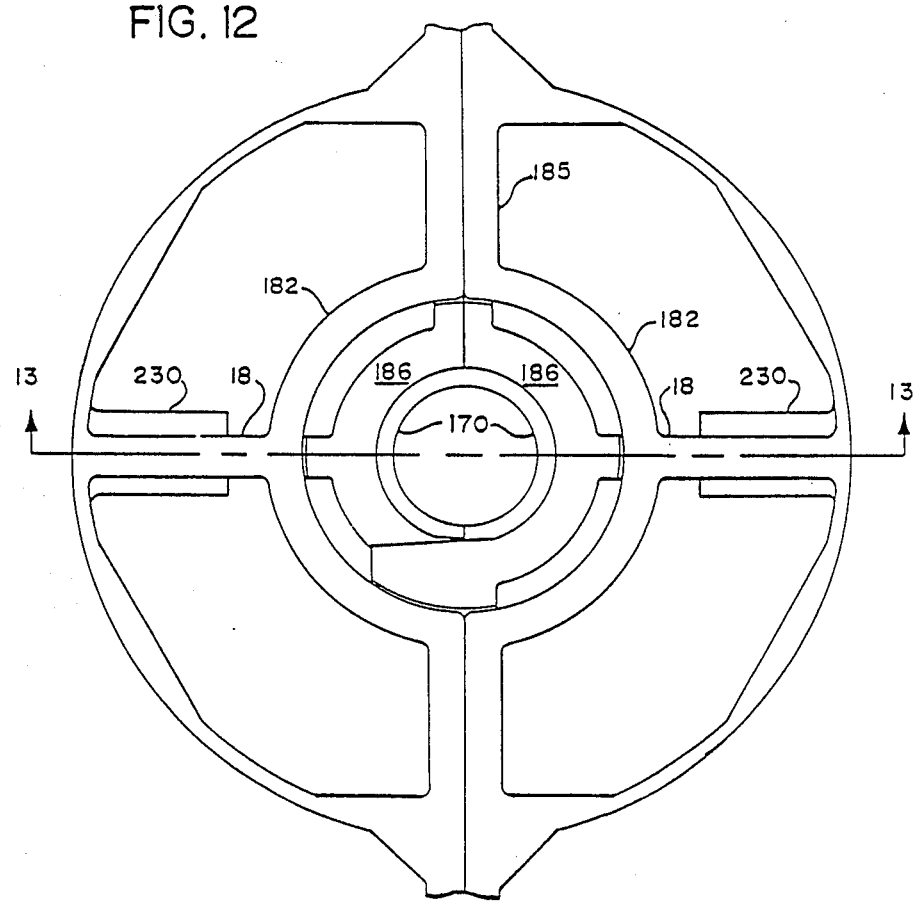
FIG. 12 is an enlarged fragmentary view of the hub portion of the state estimator module of FIG. 6.

Now referring to FIGS. 12 and 13, it can be seen how the clamping inserts 186 fit within the hubs 182 and 184 and how the facings 170 fit within the inserts 186. The inserts 186 are made in sets having differing inner diameters to accommodate conductors 22 of differing diameters.

As shown in FIGS. 15 through 17, the clamping inserts 186 are provided with alignment tabs 250 which fit into the hubs 182 and 184. Each of the insert 186 is identical, one being upside down with respect to the other when installed as shown in FIG. 14. Each is provided with a screw hole 252 for screw mounting them within hubs 182 and 184 and are provided with a raceway 254 for insertion of and to hold the hard conducting neoprene rubber facings 170, which may be of material, having a hardness of 70 durometer on the Shore A scale. The facings 170 are preferably filled with a conducting powder, such as graphite, to establish electrical contact with the conductor 22.

One of the pins 142 of the hinge is shown in FIG. 18. All of the pins are provided with a non-conducting ceramic coating 256 which may be plasma sprayed thereon, so that the pins do not provide, together with the plates 136 and 138 of the hinge (FIG. 23), a shorted turn.

Now referring to FIG. 20, an emergency hot stick mountable tool 164 can be used to open the donut 20 if for any reason the hinge clamp jams. This tool comprises an elongated file 166 used to cut the cable 158. After the cable 158 has been cut, a threaded portion 168 of the emergency tool may be threaded into the thread portion 144 of nut 132 (see FIG. 24) to remove the opened donut 20.

Also, in FIG. 20, it can be seen how the cable clamp 130 is provided with a raised key portion 258 which guides the cable clamp's motion in a guideway opening 260 in the top plate 136. Also, the circular opening 262 in the top plate 136 may be seen, in which the boss 134 of nut 132 fits to keep it from moving. A similar boss on the bottom of the nut 132 fits into a circular opening in bottom plate 138, as does a similar key 264 on the bottom of cable clamp 130 fit into a guiding opening in bottom plate 138. The plates 136 and 138 are secured together by bolts 266 and 268 and are held apart by spacers 270 and 272 (FIGS. 21 and 23) about the bolts 266 and 268. Cover plate 136 is machined with openings 274 and ribs 276 to make it as strong and light as possible.

FIG. 21 shows the hinge clamp mechanism with the top plate 136 removed and the donut 20 closed, the cable 158 pulling pins 146 and 148 tightly together.

Figure 22:
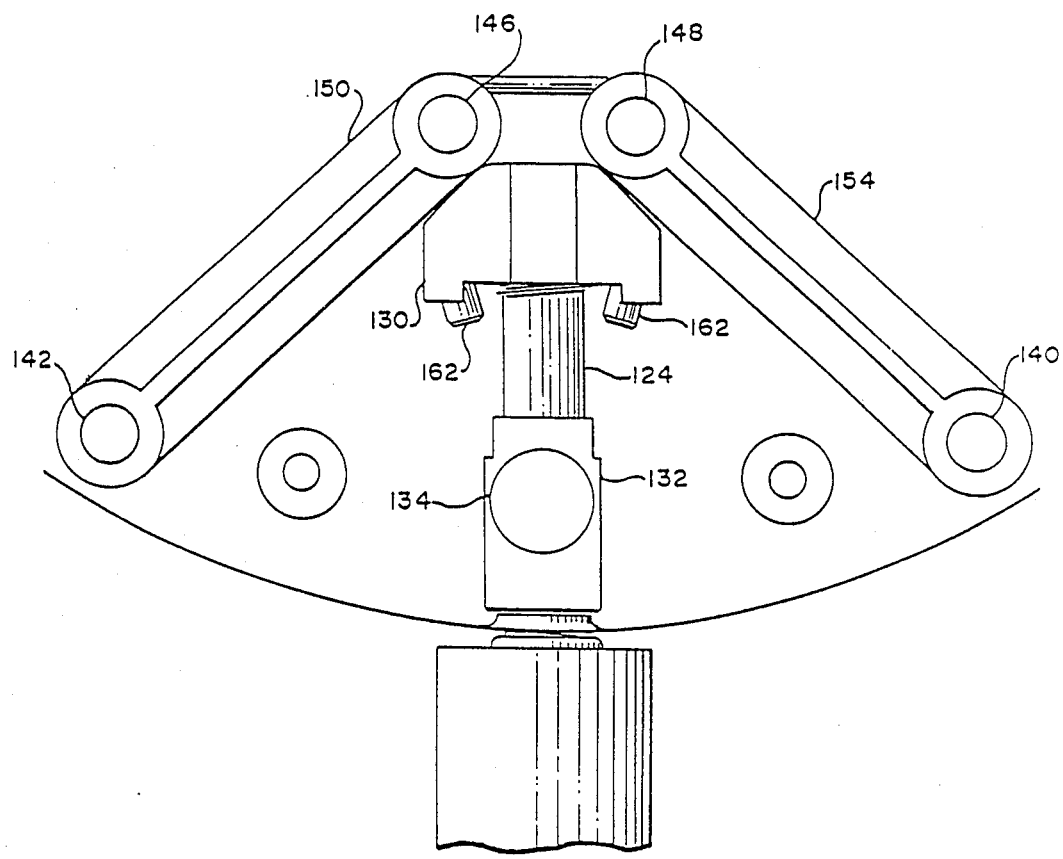
FIG. 22 is a view similar to FIG. 21 showing the hinge clamp mechanism when the state estimator module of the invention is opened for engagement or removal from a conductor.

In FIG. 22 the hinge clamp mechanism is shown with top plate 136 removed and the cable clamp 130 spread apart from the nut 132 by the barrel 124. The wedges 154 and 156 have pushed ramp arms 150 and 154 to spread apart fixed pins 146 and 148, to open the donut.

Figure 23:
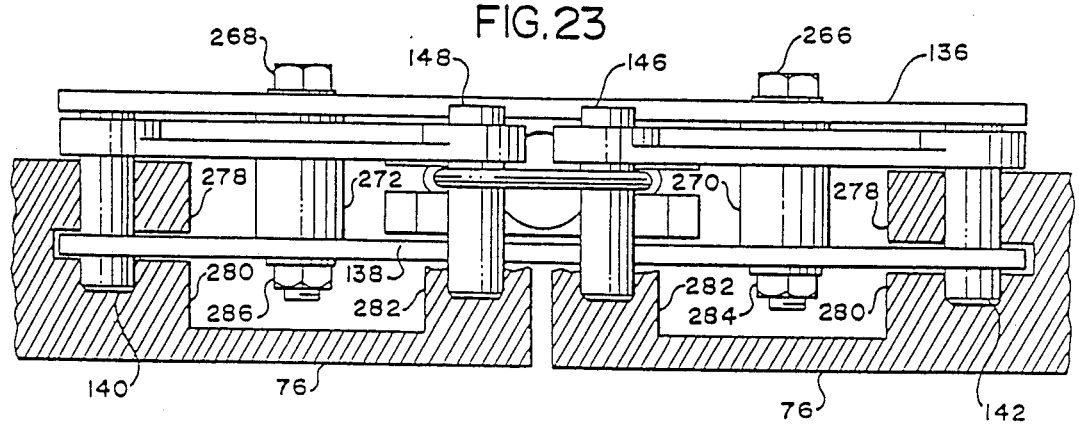
FIG. 23 is a fragmentary side view, partially in cross section taken from the top of FIG. 22.

In FIG. 23 it can be seen how hinge pins 140 and 142 fit into receiving portions 278 and 280 of each bottom portion 76 of the donut 20. Similarly, fixed pins 146 and 148 fit into portions 282 which are shown partly cut away in FIG. 23. Portions 282 are located closer to the central axis of the donut 20 than hinge pins 142.

Also seen in FIG. 23 are the nuts 284 and 286 on the bolts 266 and 268.

As previously described the hot stick tool 108 (FIGS. 25, 26 and 27) for mounting to a conventional hot stick 176 comprises a conventional hot stick mounting coupling 118, a barrel portion 116, a universal joint 114 which accommodates misalignment of the line of the stick 120 and the receiving opening 122 (see FIG. 3) in the donut 20. Also seen in FIGS. 25, 26, and 27 are the donut engaging Allen wrench portion 110 and threaded portion 112 of the hot stick tool 108, and the sleeve 116 which holds the base 288 of the universal 114 rigidly to the mounting 290 for the hot stick tool mounted portion of the coupling 118.

State Estimator Module Electronics

The state estimator module electronics are shown in their overall configuration in FIG. 28. They comprise a power supply 292, digitizing and transmitting electronics 294, sensors indicated by the box 296, and antenna 98.

Figure 29:
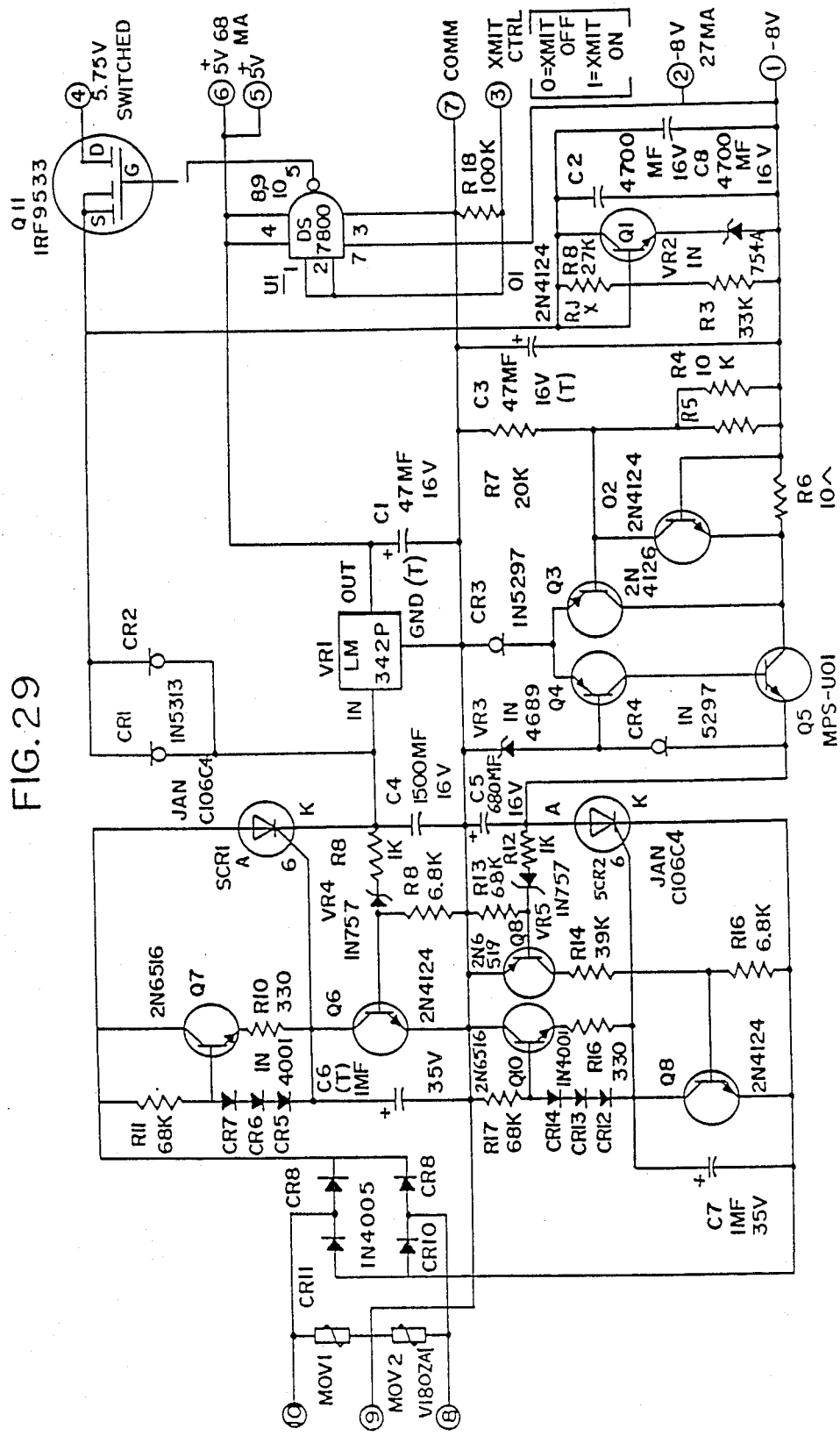
FIG. 29 is a detailed schematic electrical circuit diagram of the power supply of the state estimator of the invention.

The center tap 9 of the power pickoff coil 68 is connected to the aluminum shell of the module 20, which in turn is connected directly to the power conductor 22 by spring 78 and by the conducting facings 170 (FIGS. 12 and 13). Thus, the power conductor 22 becomes the local ground as shown at 88 for the electronics 294. The power supply supplies regulated +5 and −8 volts to the electronics 294 and an additional switched 5.75 volts for the transmitter as indicated at 300. The electronics 294 provides a transmitter control signal on line 302 to control the power supply to the transmitter. The sensors 296 provide analog signals as indicated at 304 to the electronics 294. The detailed schematic electrical circuit diagram of the power supply 292 is shown in FIG. 29.

Figure 30:
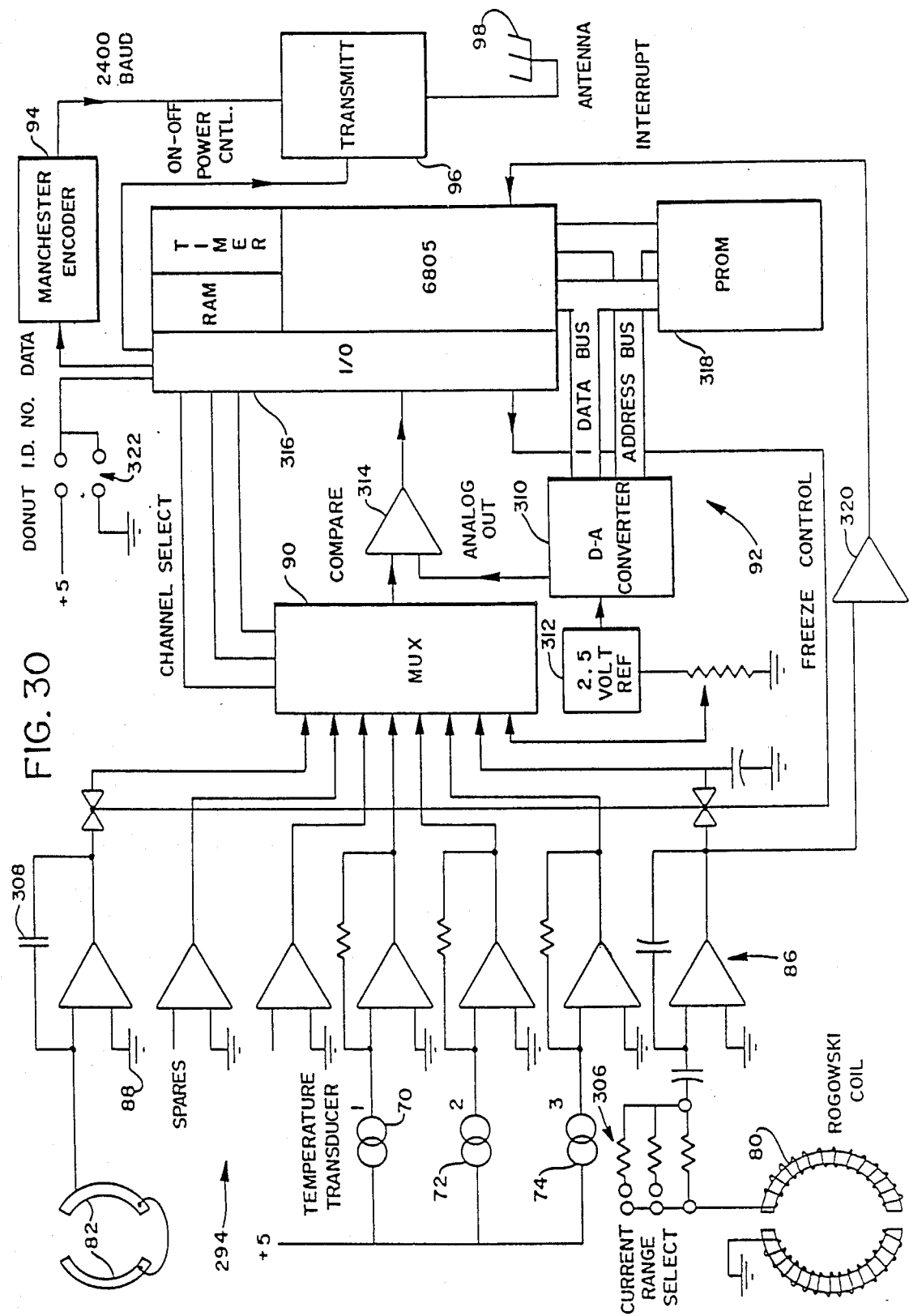
FIG. 30 is a detailed electrical schematic block diagram of a portion of the electronics illustrated in FIG. 28.

FIG. 30 is a schematic block diagram of the electronics 294. As shown therein, the Rogowski coil 80 is connected to one of a plurality of input amplifiers 86 through current range select resistors 306. The voltage sensing plates 82 are connected to the uppermost amplifier which is provided with a capacitor 308 in the feedback circuit which sets gain and provides an amplifier output voltage in phase with line to neutral high tension voltage. It also provides integrator action for the measurement of current the same way as the amplifier connected to the Rogowski coil. Thus amplifier 86 connected to the voltage sensing plate 82 is a low impedance current measuring means connected between the power conductor 22 (i.e., ground 88) and the plates 82.

Each of the temperature transducers 72 and 74 is connected to a separate one of the amplifiers 86 as shown. Spare amplifiers are provided for measurement of additional characteristics such as the interior temperature of the donut 20. Each of the amplifiers 86 is connected for comparison with the output of digital analog converter means 310, 2.5 volt reference source 312 at comparator 314 by the multiplexer 90 under control of the digital computer 316. The digital computer may be a Motorola CMOS 6805 microprocessor having I/O, RAM, and timer components. A programmable read only memory 318 is connected thereto for storing the program. A zero crossing detector 320 detects the zero crossings of the current in the Rogowski coil 80 and provide basic synchronization. The donut ID number is selected by jumpers generally indicated at 322. The digitized data assembled into appropriate messages is encoded in Manchester code by the encoder 94 and supplied to a 950 megahertz transmitter 96 which then supplies it to the antenna 98.

Figure 31A:
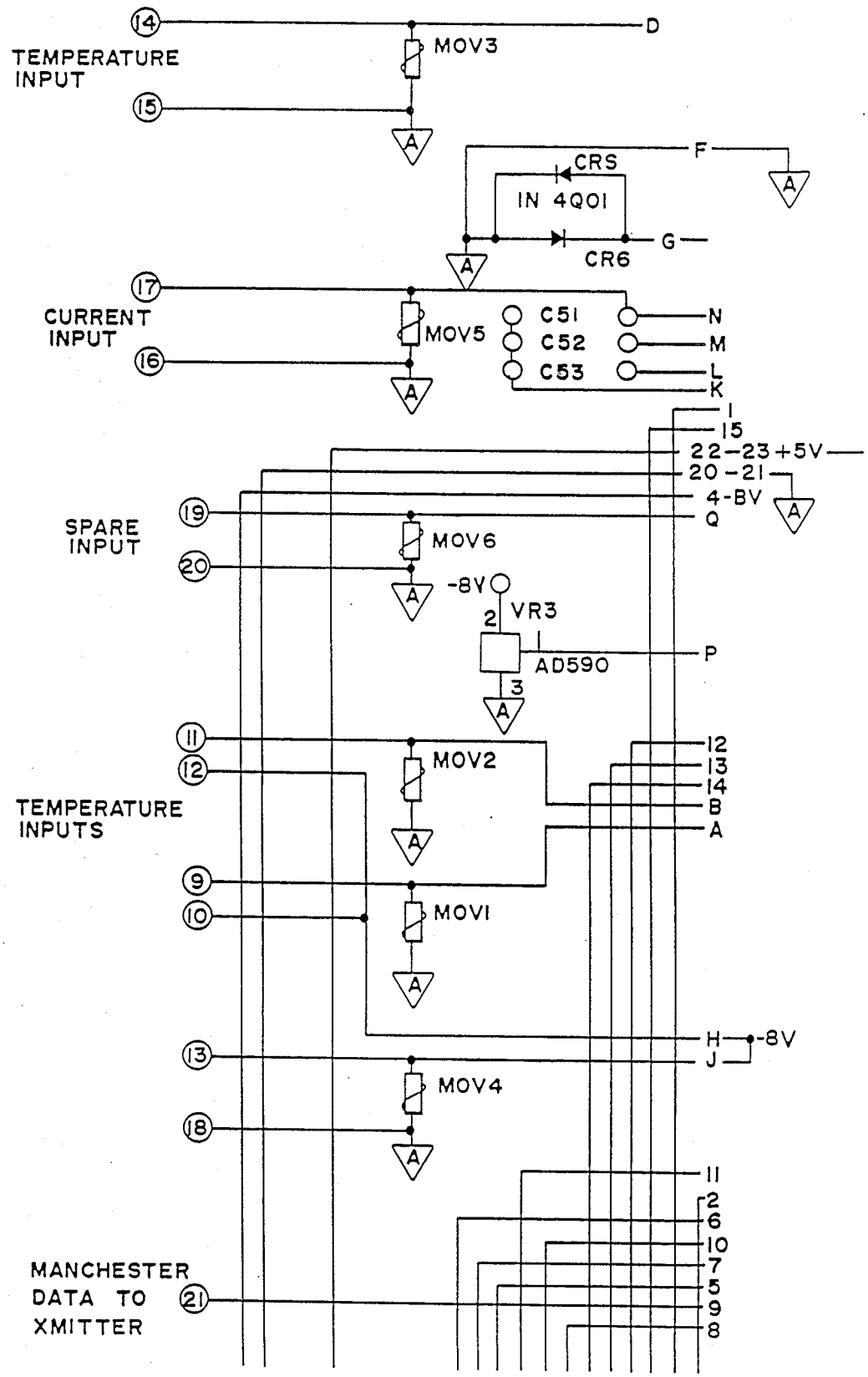
FIG. 31, comprising FIGS. 31A through 31D which may be put together as shown in FIG. 31E, is a detailed schematic electrical circuit diagram of the electronics shown in FIG. 30.
Figure 31B:
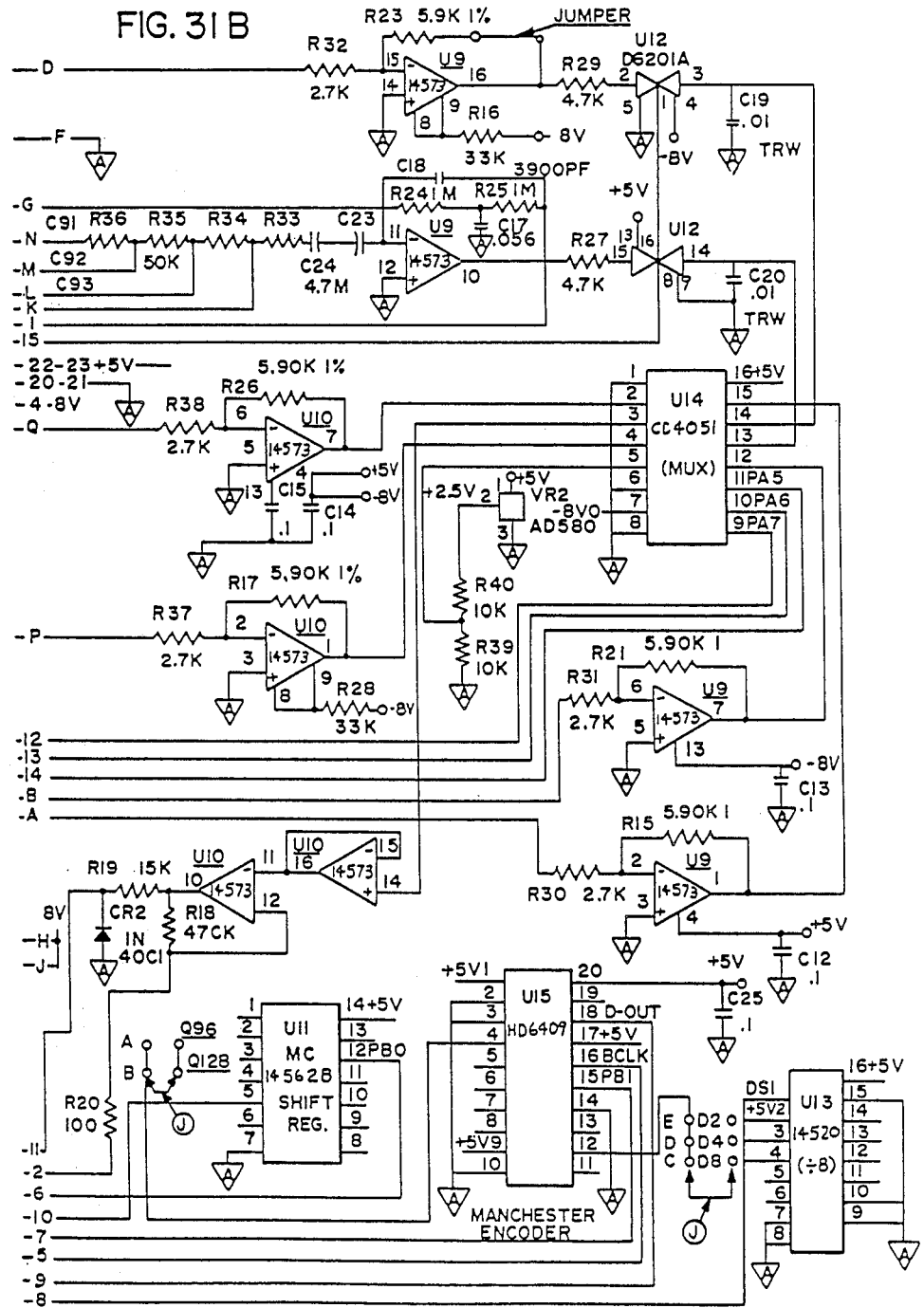
Figure 31:
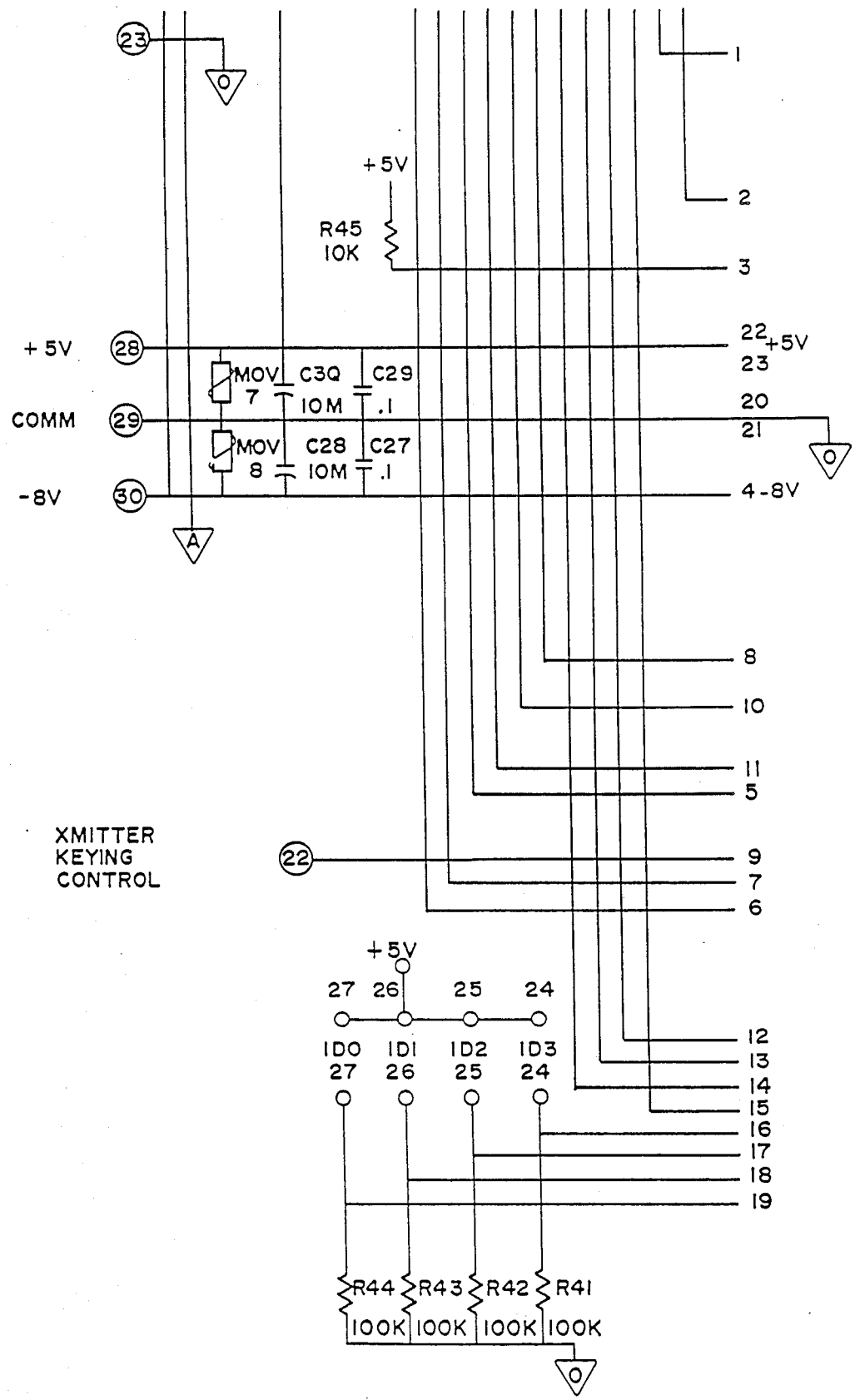
Figure 31D:
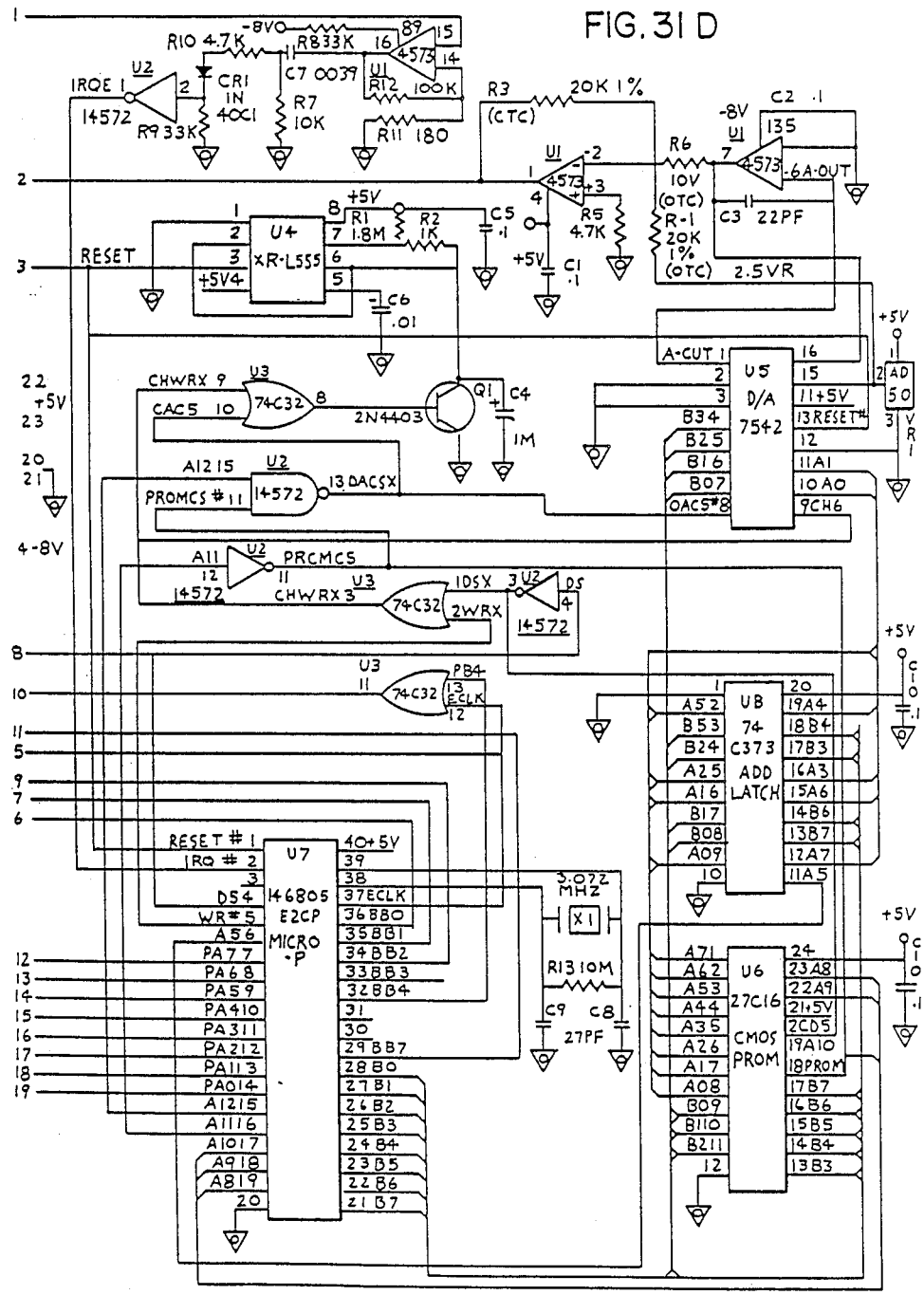
Figure 31:
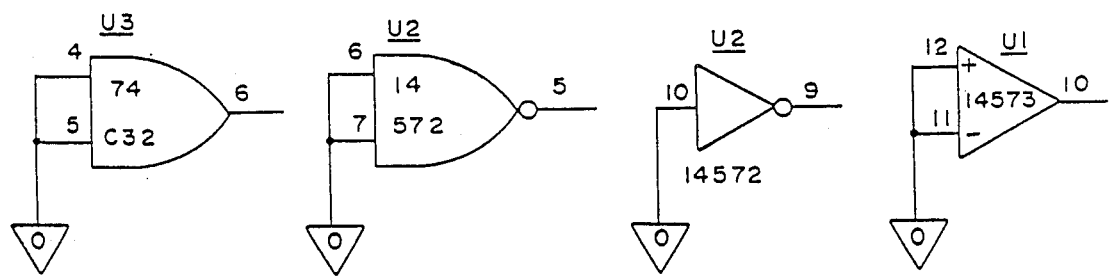
Figure 31:
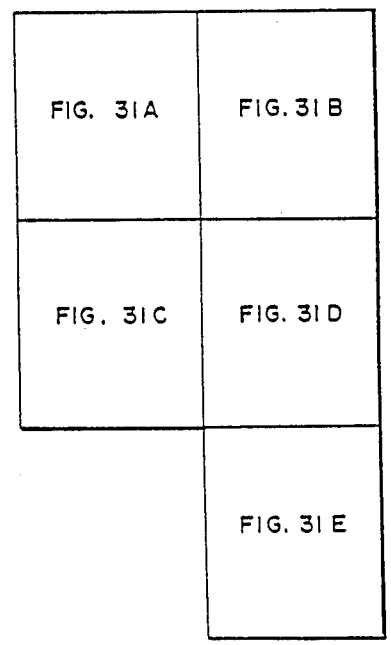

The schematic electrical circuit diagram of the electronics 294 is shown in FIG. 31, comprising FIGS. 31A through 31D which may be put together to form FIG. 31 as shown in FIG. 31E. The grounds therein are shown as triangles. A inside the triangle indicates an analog ground and D a digital ground. Both are connected to the common terminal as indicated in FIGS. 28 and 31C.

The Voltage Sensor

Figure 32:
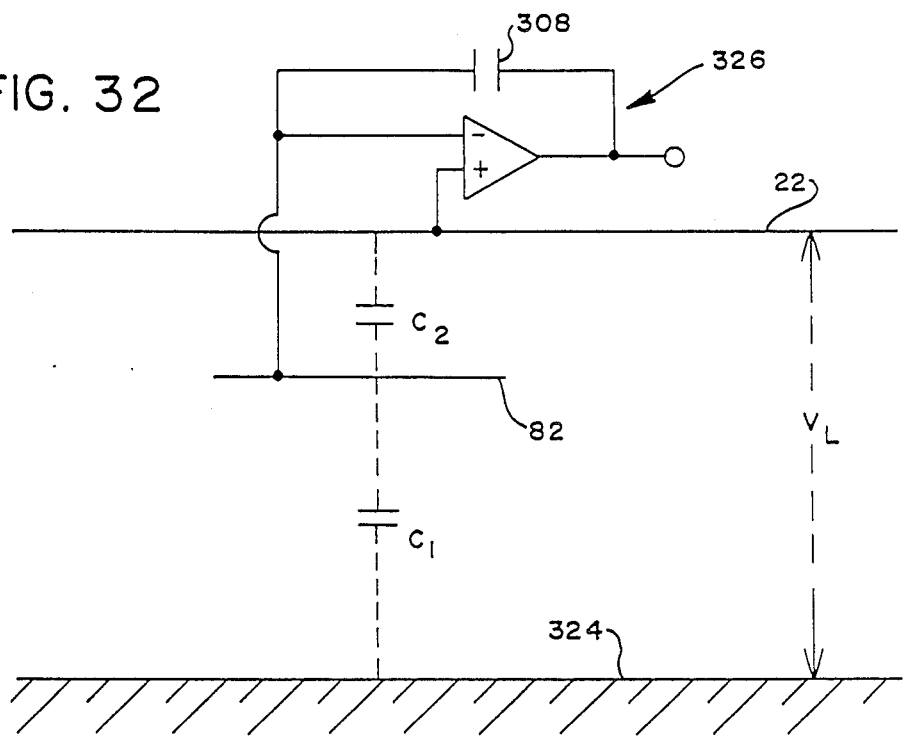
FIGS. 32 and 33 are schematic electrical circuit diagrams illustrating the voltage measurement system according to the invention.

The operation of the voltage sensor may be understood with reference to FIG. 32. We wish to measure the alternating current voltage $V_L$ between the conductor 22 and the ground 324. The metal plates 82 form one plate of a capacitive divider between conductor 22 and ground, comprising the equivalent capacitor C1 between ground and plate 82 and equivalent C2 between conductor 22 and the plate 82.

The voltage $V_L$ between ground and the conductor 22 is thus divided across the equivalent capacitor C1 and C2.

Prior art methods have attempted to measure the potential developed across capacitance C2. However this capacitance can change value and affect the accuracy of the measurement. It may also develop a spurious voltage across it due to the high electric field in the vicinity of the high voltage conductor 22. The low impedance integrating operational amplifier of the invention, generally indicated at 326, shunts capacitance C2 and effectively eliminates it from the circuit. The potential of plates 82 is therefore made to be the same as that of conductor 22 through the operational amplifier 326. Now the potential between the plates 82 and ground 324 is the potential $V_L$ between the line 22 and the ground 324. Therefore, the current in the capacitance $C_1$ is now directly proportional to the voltage $V_L$. Therefore, the low impedance integrater connected operational amplifier 326 will provide an AC output voltage exactly proportional to the current in the capacitance $C_1$ and thus directly proportional to the high voltage $V_L$ on the conductor 22.

Figure 33:
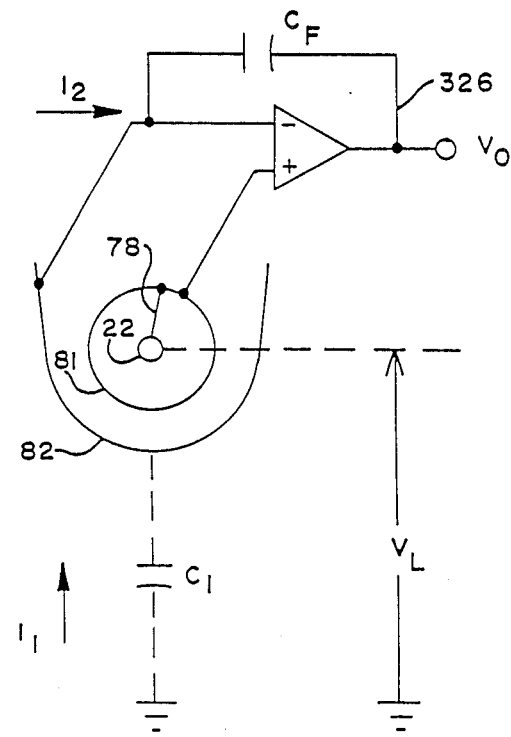

Now referring to FIG. 33, all of the circuitry including the integrater connected operational amplifier 326 is housed within a metal housing 81, which is connected to the conductor 22 via the spring 78. The plates 82 are on the outside of the housing 81 and must be electrically insulated from it. The plates 82 cannot protrude from the housing 81 since this would invite corona on very high voltage lines. It therefore must either be flush with the surface of the housing 81 or recessed slightly in it.

Unfortunately rain water or snow collecting on the surface will provide a path of high dielectric constant shunting the high electric field about the conductor 22 so that the current $I_2'$ to the operational amplifier 326 will not be equal to the current $I_1$ in the capacitance $C_1$. Thus the measurement will be in error.

In order to minimize this effect the width and length of the sensing plates must be made very large in comparison with the width of the gap separating them from the housing and if any protective coating is used over the sensing plate it must have no appreciable thickness. Furthermore, the outer surface of the sensing plate must conform, as closely as possible, with the outer surface of the housing 81.

Thus the sensing plates 82 shown in FIGS. 8, 9, and 10, are made very long and have gaps to the housing at their ends of only 0.020 inches and gaps 212 along them of 0.005 inches in width. The plates 82 are approximately ⅜ths of an inch in width, which is of course very much greater than the gaps of 0.05 inches and 0.020 inches.

When constructed in this manner, water droplets covering the metallic sensing plate and bridging the adjacent housing do not materially affect the measurement of $V_L$. This is true because:
1. the sensing plates 82 are directly exposed and water overlying them which has a high dielectric constant, simply conducts the capacitive current $I_1$ directly to the plate;
2. the amount of current shunted by water at the gap between the plates 82 and the housing 81 is very small in proportion to the amount collected by the much larger area sensing plates themselves;
3. the alternating current lost through the shunt path across the gap between the plates 82 and housing 81 is very small because of the low input impedance of the integrater connected operational amplifier 326.

Deriving the Fourier Components of Current and Voltage

Since the state estimator module 20 is mounted in isolation on a high-tension transmission line it is desirable to derive as much information as possible from the sensors contained within it with a minimum of complexity and to transmit this raw data to the ground station 24 (FIG. 1). Calculation of various desired quantities may then be made on the ground.

It is therefore convenient to sample and hold both the current and voltage simultaneously and to send these quantities to the ground sequentially by pulse code modulation.

When it is desired to derive phase and harmonic data rather than merely transmitting the root mean square of the voltage and current to the ground, the shape of the waveforms and their relative phase must be transmitted.

We do this by transmitting Fourier components. We sample the waveform of both current and voltage at intervals of 1/9th of a cycle. However, rather than doing this during one cycle, we do this making one measurement at each cycle, changing the interval over nine cycles.

The ground station can then easily compute the quantities of interest, for example, RMS amplitude of voltage and current, their relative phase and harmonic content.

Since current and voltage are sampled simultaneously, their relative phases are the same as the relative phases of the sample sequence. The harmonic structures are also the same, so that, except for brief phenomena, any desired analysis may be made by the ground station.

The data transmissions take place in a five to ten second millisecond interval, which is synchronized with the zero crossing of the donut 20. With this information, the relative phase of three phases of a transmission line as shown in FIG. 1 may be derived.

In the embodiment disclosed herein we only compute the fundamental Fourier components of $V_A$ and $V_B$ and $I_A$ and $I_B$ which are:

$$V_A = \frac{2}{S_T} \cdot \sum_{S=1}^{S_T} V_S \cdot \cos\left(\frac{2\pi}{S_T} \cdot S\right)$$

$$V_B = \frac{2}{S_T} \cdot \sum_{S=1}^{S_T} V_S \cdot \sin\left(\frac{2\pi}{S_T} \cdot S\right)$$

$$I_A = \frac{2}{S_T} \cdot \sum_{S=1}^{S_T} I_S \cdot \cos\left(\frac{2\pi}{S_T} \cdot S\right)$$

$$I_B = \frac{2}{S_T} \cdot \sum_{S=1}^{S_T} I_S \cdot \sin\left(\frac{2\pi}{S_T} \cdot S\right)$$

where $S_T$ equals the total number of samples in the apparatus disclosed 9, S equals the sample, and $V_S$ and $I_S$ are the value of the measured voltage and current at each sample S. From these the RMS voltage V and current I may be derived by the formulas:

$$V = [(V_a)^2 + (V_B)^2]^{\frac{1}{2}}$$

$$I = [(I_A)^2 + (I_B)^2]^{\frac{1}{2}}$$

real power is:

$$(V_B \times I_B) + (V_A \times I_A)$$

and reactive power is:

$$(V_A \times I_B) - (V_B \times I_A).$$

If it is desired to have information about the shape of the waveform (that is harmonic data) more samples may be taken and the desired Fourier harmonic components calculated and transmitted.

"Random" Transmissions on a Single Radio Channel

As shown in FIG. 4, a single substation 34 may have as many as fifteen donuts 20 transmitting data to a single receiver 24. Since radio receivers are expensive and radio frequency channel allocations are hard to obtain, it is desirable to have all units share a single channel. For weight and economy it is desirable to minimize the equipment in the donuts 20 at the expense of complicating the receiver 24.

Idealy, all donuts 20 transmitting on a single channel would transmit, in turn, in assigned time slots. Unfortunately, the only way to synchronize them according to the prior art would be to provide them each with a radio receiver.

Our donuts 20 are programmed to send out short burst transmissions at "random" with respect to each other, and to do so often enough that occasional interference between two or more transmissions does not destroy a significant portion of the data. This is accomplished by assigning to each donut 20 transmitting to a single receiver 24 a fixed transmission repetition interval so that no synchronization is required. The interval between transmissions of each of the donuts is an integral number and these numbers are chosen so that no two have a common factor.

For example, for fifteen donuts, we choose the intervals W measured in sixtieths of a second according to the following table:

| Donut Number | W |
|---|---|
| 0 | 37 |
| 1 | 41 |
| 2 | 43 |
| 3 | 47 |
| 4 | 51 |
| 5 | 53 |
| 6 | 59 |
| 7 | 61 |
| 8 | 64 |
| 9 | 65 |
| 10 | 67 |
| 11 | 71 |
| 12 | 73 |
| 13 | 77 |
| 14 | 79 |

It is desirable that the message length be reduced to a bare minimum in order to minimize simultaneous message transmission. One way we accomplish this is to transmit "auxiliary" information in repeating cycles of five transmissions.

Timing of the Measurements and Transmissions

Figure 34:
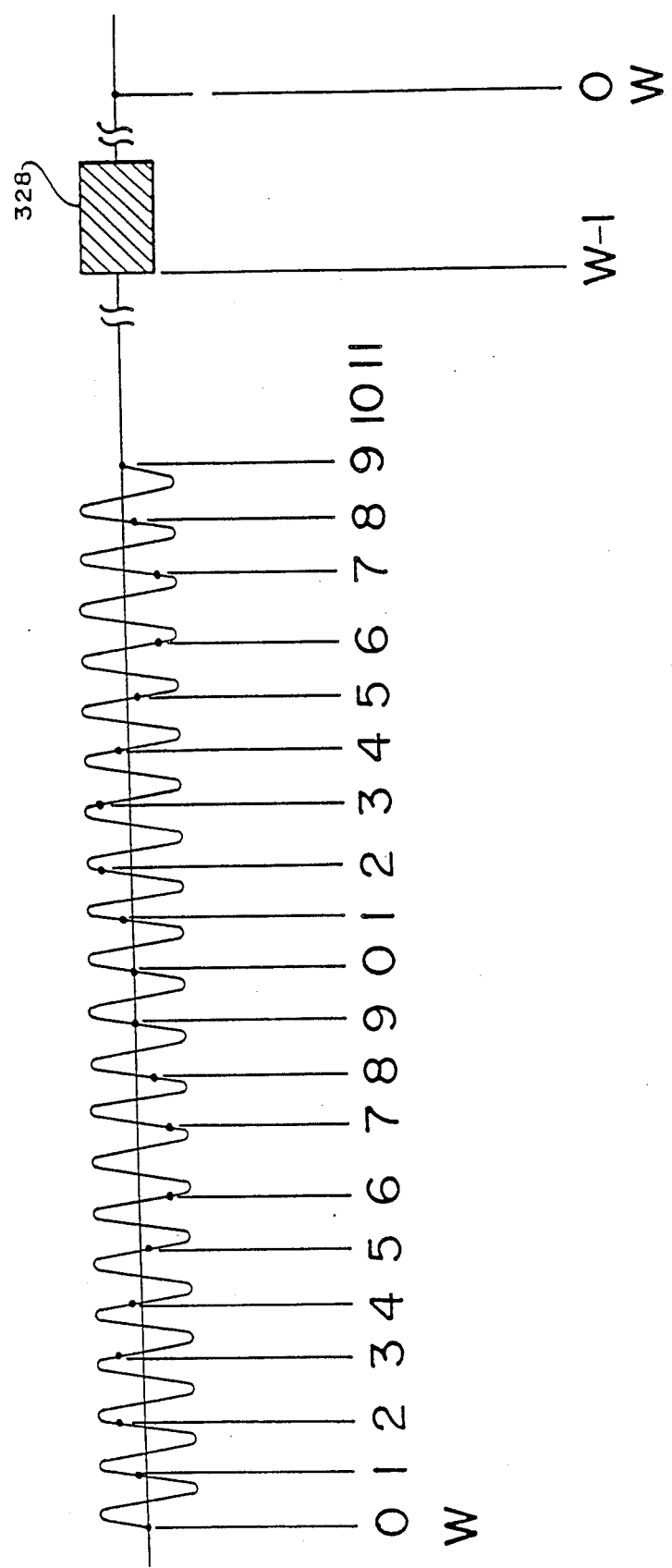
FIG. 34 is a timing diagram of the electronics illustrated in FIG. 30.

A timing diagram is shown in FIG. 4, where the sine wave is the current as measured by the Rogowski coil. At zero crossing labeled $\phi$ timing is started. During the next cycle labled 1 and succeeding cycles through the eighth, the nine successive Fourier measurements $I_S$ and $V_S$ are made. During the ninth cycle the period of the previous eight cycles is utilized to define the sampling interval and the Fourier samples of the current and voltage are again taken during the next eight cycles. These measurements are utilized to compute $V_A$, $V_B$, $I_A$ and $I_B$. At the end of the next cycle labeled 9 at the $\phi$ crossings, twenty-one cycles have occurred. During the followup period of time, up to a total of $W-1$ cycles, the program loads shift registers with the identification number of the donut, the auxiliary number, the Fourier components $V_A$, $V_B$, $I_A$, $I_B$, the digitized auxiliary parameters and the CRC (a check sum). At $W-1$ the transmission 328 begins and takes place over a short interval of 5 to 10 milliseconds, (approximately 5 milliseconds in the apparatus disclosed). Then at the $\phi$ crossing at the end of the cycle beginning at $W-1$, that is after W cycles, the program is reset to $\phi$ going back to the left hand side of the timing diagram of FIG. 34.

In the program discussed below there is a timer labeled Z which is set to $\phi$ at the far left, beginning $\phi$ cross over. It is reset to Z=21 at the end of the twenty-first cycle, the second nine to the right in FIG. 34.

The Donut Software

Scope

The state estimator module 20 (sometimes called herein the substation monitor) is a MC146805E2 microprocessor device.

Introduction

The "Donut" software specification is divided into three major sections, reflecting the three tasks performed by the software. They are:

Data structures,

The background processing that performs the bulk of the "Donut" operations. Included are transmitter control, sample rate timing, analog value conversion, and general "housekeeping", Common utility sub-routines, The interrupt processing that handles A.C. power zero-crossing interrupts and maintains the on-board clock which is used for cycle timing, and The restart processing that occurs whenever the microprocessor is restarted.

The program listings are found in Appendix A of U.S. Pat. No. 4,689,752, incorporated herein by reference.

Notation Conventions (a) Logic Statements

Program modules are described via flowcharts and an accompanying narrative. The flowcharts use standard symbols, and within each symbol is noted the function being performed, and often a detailed logic statement.

Detailed statements conform to the following conventions:

IX: Index Register

SP: Stack Pointer

PC: Program Counter

A,B: Register A or B

CC: Condition Codes

Y: Contents of register or contents of memory location Y.

(y): Contents of memory location addressed by the contents of register or contents of memory location y.

A,X: Contents of location whose address is A-IX.

y(m−n): Bits m-n of the contents of register y or the contents of memory location y.

a→b: a replaces b. The length of the move (one or two bytes) is determined by the longer of a or b.

For instance:

ABC→XYZ: Move the contents of memory location ABC to memory location XYZ.

IX→XYZ: Save the Index Register in location XYZ.

(IX)→XYZ: Store the contents of the address pointed to by the Index Register in location XYZ.

$\phi$,X→XYZ: Same as above.

XYZ+2,X→SP: Move the bytes in location XYZ+2+(IX) and XYZ+3+(IX) to the Stack Pointer.

IX→(XYZ): Store the Index Register in the memory location pointed to by location XYZ.

(IX)→(XYZ): Store the contents of the memory location pointed to by the Index Register in the memory location pointed to by location XYZ.

ABC (2-3): Bits 2-3 of memory location ABC.

(b) Subroutine Calls

Figure 35:
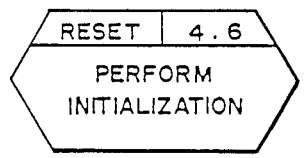
FIG. 35 shows a sub-routine call as utilized in the flow charts of FIGS. 40 through 61.

Subroutine calls contain the name of the subroutine, a statement of the sub-outline, a statement of its function, and the flowchart section which describes it as shown in FIG. 35.

Data Structures

Figure 36:
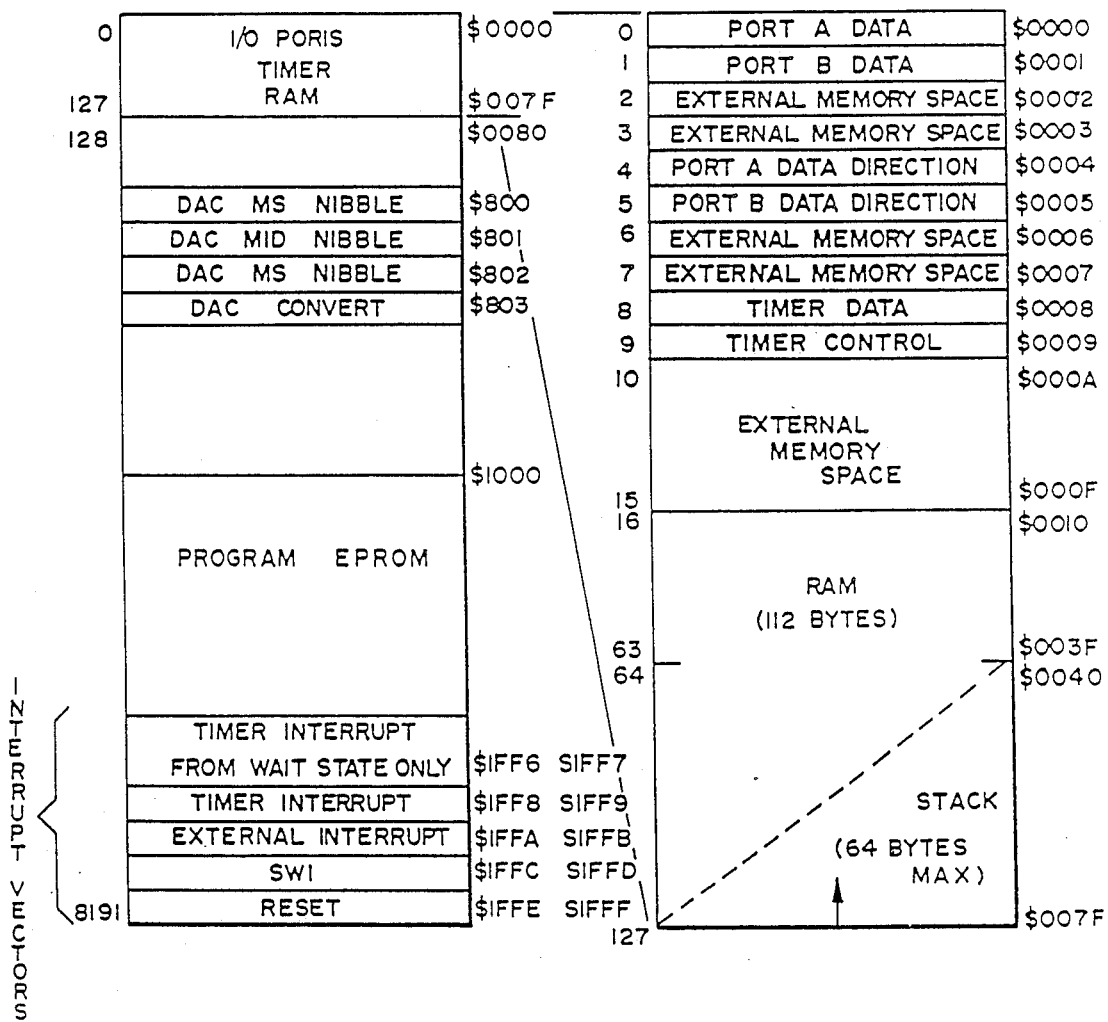
FIG. 36 is a memory map of the program.
Figure 37:
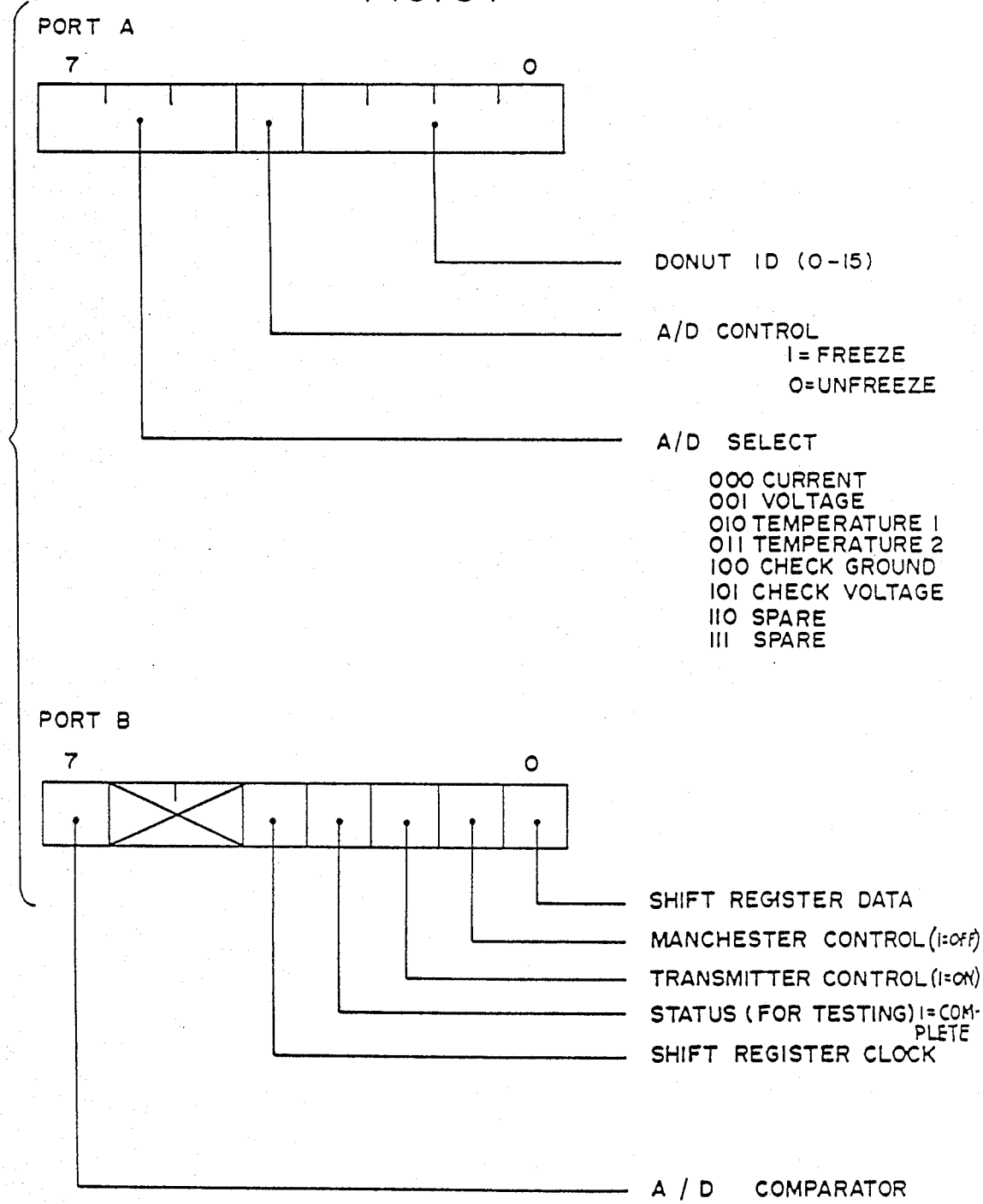
FIG. 37 is a diagram of PIA port assignments of the program.

The memory map is shown in FIG. 36, the PIA Definitions in FIG. 37, and the Data Transmission Format in FIG. 38.

Background Processing

Figure 39:
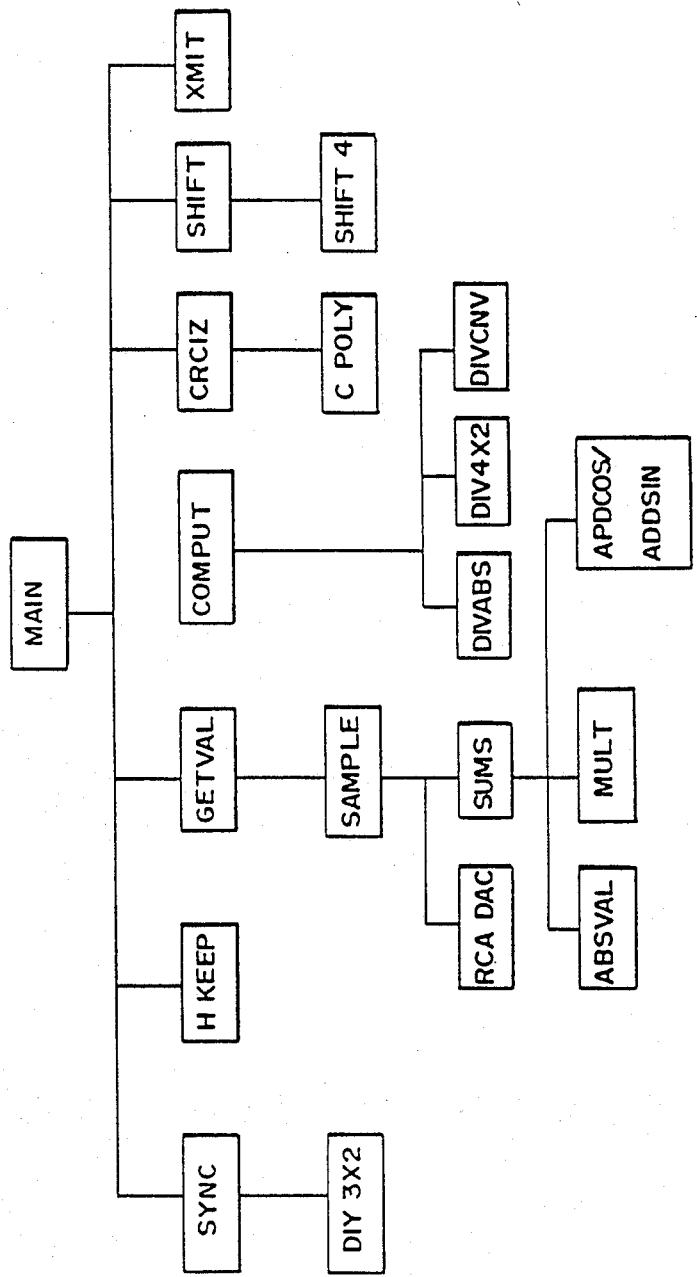
FIG. 39 is a diagram of task management of the program.

The Background Processing Hierarchy is shown in FIG. 39.

Figure 40:
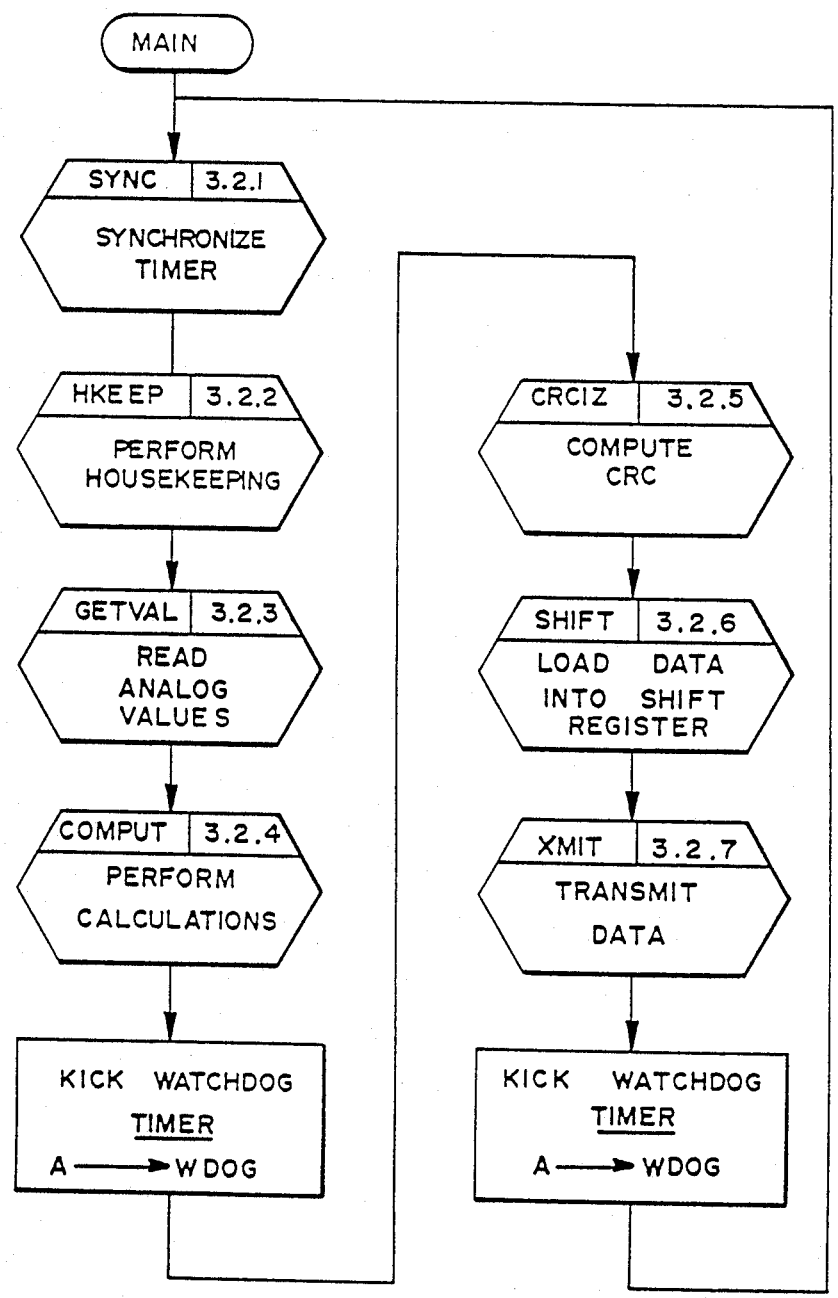
FIGS. 40 through 61 are flow charts of the subroutines of a program that may be utilized in the donuts 20.

Substation Monitor Mainline (MAIN) FIG. 40

PURPOSE: MAIN is the monitor background processing loop.

ENTRY POINT: MAIN

CALLING SEQUENCE: JMP MAIN (from RESET)

REGISTER STATUS: A, X not preserved.

TABLES USED: None.

CALLED BY: RESET

CALLS: SYNC, HKEEP, GETVAL, COMPUT, CRC12, SHIFT, XMIT
EXCEPTION CONDITIONS: None.
DESCRIPTION:

MAIN calls SYNC to time the AC frequency and compute the sampling rate, HKEEP to perform general initialization, and GETVAL to sample the analog values. COMPUT is called to finish the Fourier calculations, the watchdog timer is kicked, and CRC12 is called to calculate the CRC value for the data to be transmitted. SHIFT is called to load the shift register, XMIT is called to transmit the data to the ground station, the watchdog is kicked, and the entire cycle is repeated.

Figure 41:
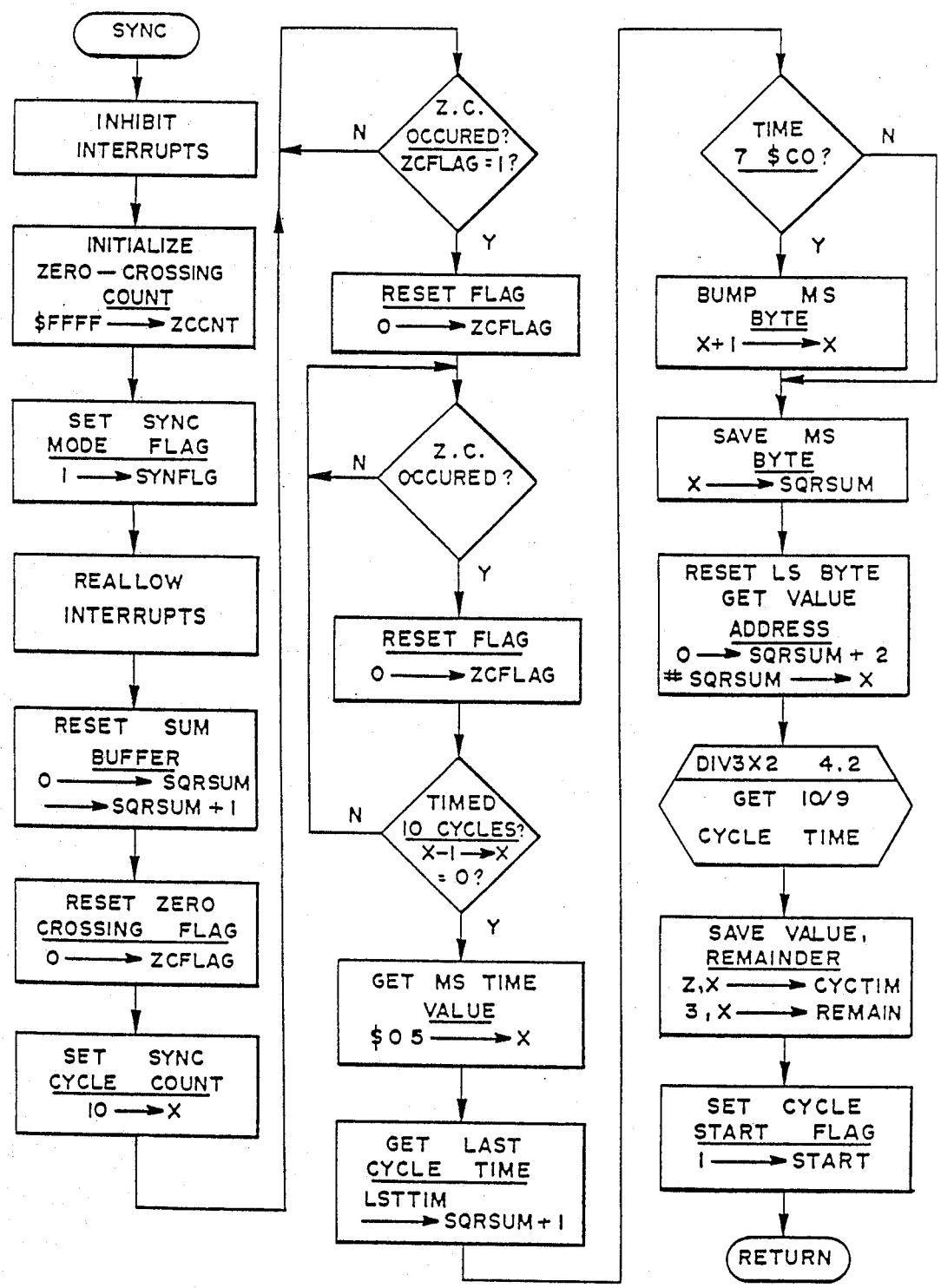

Synchronize Timing (SYNC) FIG. 41

PURPOSE: SYNC times the AC frequency and calculates the sampling interval.
ENTRY POINT: SYNC
CALLING SEQUENCE:
JSR SYNC
Return
REGISTER STATUS: A, X not preserved.
TABLES USED: None.
CALLED BY: MAIN
CALLS: DIV3X9
EXCEPTION CONDITIONS: None.
DESCRIPTION:

SYNC initializes the zero crossing count and sets the sync mode flag. The sum buffer is cleared for use as a time accumulator, the zero crossing occurred flag is reset, and the cycle counter is set to 10. The zero crossing occurred flag is monitored until 10 zero crossing interrupts have occurred, at which point the time value is moved to the sum buffer. DIV3X2 is called to divide the 10 cycle time by 9, the quotient is saved as the sampling time, the start flag is set, and a return is executed.

Figure 42:
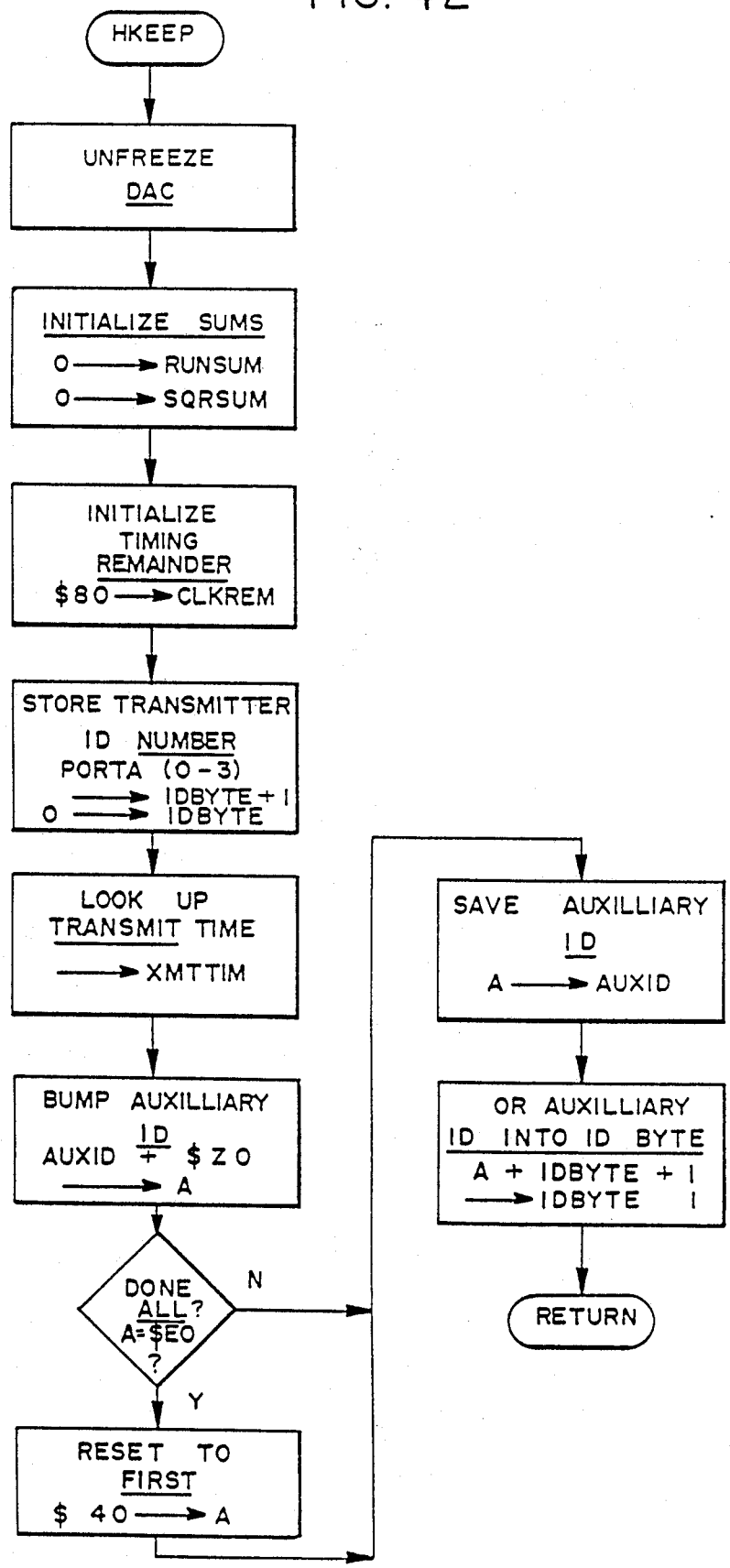

Perform Housekeeping (HKEEP) FIG. 42

PURPOSE: HKEEP performs cycle initialization.
ENTRY POINT: HKEEP
CALLING SEQUENCE:
JSR HKEEP
Return
REGISTER STATUS: A, X not preserved.
TABLES USED: TIMTBL—Timing Interval Table
CALLED BY: MAIN
CALLS: None.
EXCEPTION CONDITIONS: None.
DESCRIPTION:

HKEEP releases the DAC tracking register, clears the sum buffers, and resets the timing value remainder. The Donut I.D. number is read and stored in the data buffer, the cycle interval time is retrieved from the TIMTBL based on the I.D. number, and the auxiliary data I.D. number is bumped. A return is then executed.

Figure 43:
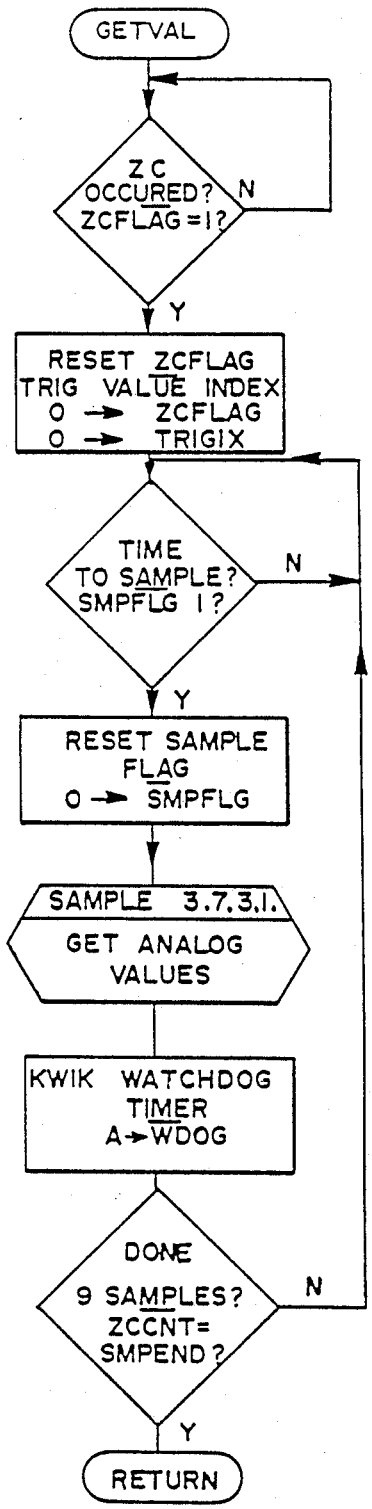

Collect All Data (GETVAL) FIG. 43

PURPOSE: GETVAL reads the nine data samples.
ENTRY POINT: GETVAL
CALLING SEQUENCE:
JSR GETVAL
Return
REGISTER STATUS: A, X not preserved.
TABLES USED: None.
CALLED BY: MAIN
CALLS: SAMPLE
EXCEPTION CONDITIONS: None.
DESCRIPTION:

GETVAL monitors the time-to-sample flag. When set, the flag is reset, SAMPLE is called to sample the analog values, and the watchdog timer is kicked. When the cycle has been repeated nine times, a return is executed.

Figure 44:
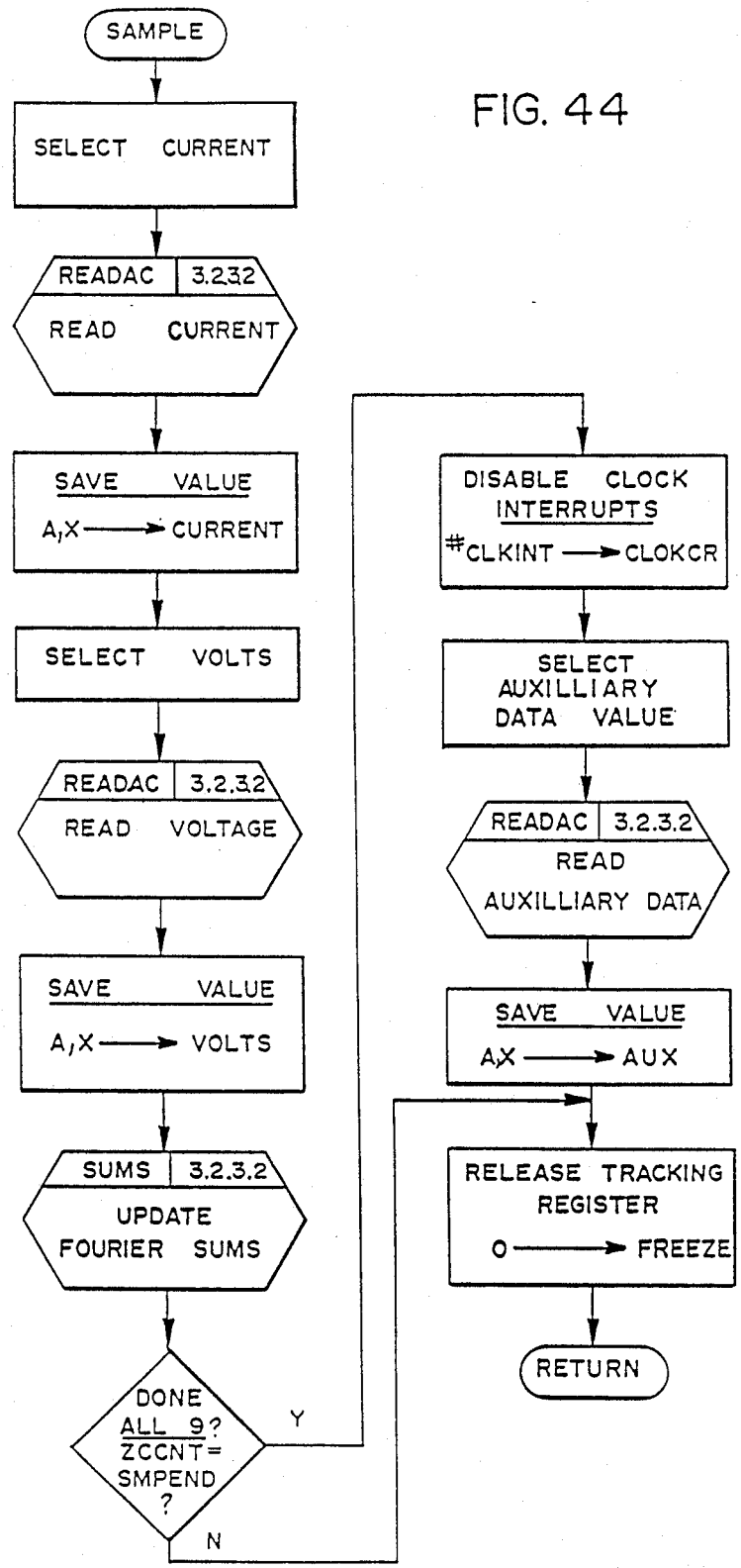

Read Analog Values (SAMPLE) FIG. 44

PURPOSE: SAMPLE reads and saves the analog values.
ENTRY POINT: SAMPLE
CALLING SEQUENCE:
JSR SAMPLE
Return
REGISTER STATUS: A, X not preserved.
TABLES USED: None.
CALLED BY: GETVAL
CALLS: READAC, SUMS
EXCEPTION CONDITIONS: None.
DESCRIPTION:

SAMPLE calls READAC to read the current and voltage values and SUMS to update the Fourier sums. A return is executed unless all nine samples have been taken, in which case READAC is called to read the auxilliary data value. The analog value tracking register is released, and a return is executed.

Figure 45:
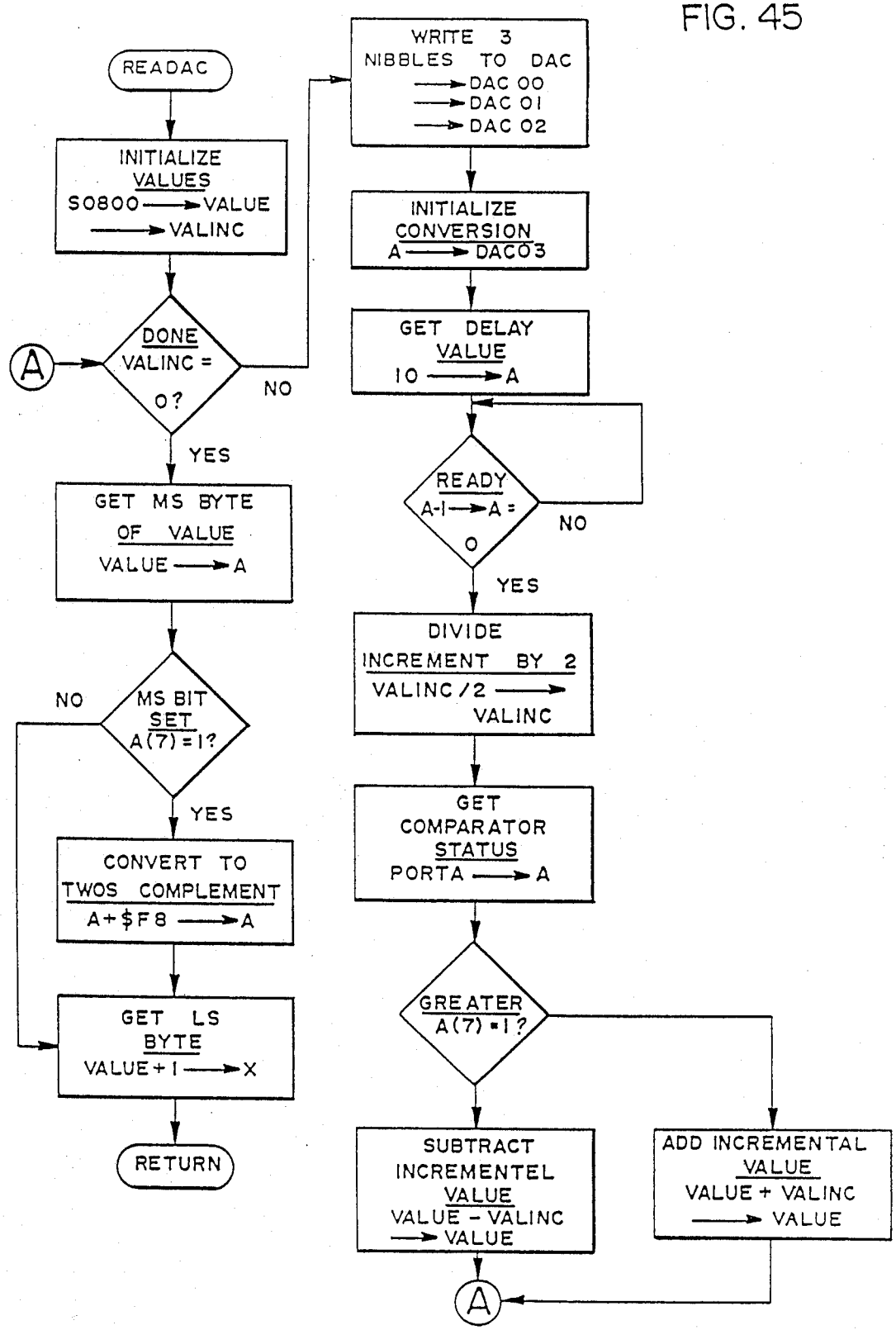

Read DAC/Comparator Circuit (READAC) FIG. 45

PURPOSE: READAC converts the analogs to digital values.
ENTRY POINT: READAC
CALLING SEQUENCE:
JSR READAC
Return
A, X=12 bit value
REGISTER STATUS: A, B, X not preserved
TABLES USED: None
CALLED BY: SAMPLE
CALLS: None
EXCEPTION CONDITIONS: None
DESCRIPTION: READAC initializes the trial and incremental values. The trial value is written to the DAC as three four-bit values, and the DAC conversion is initiated. A short register-decrement delay loop allows the DAC time to convert, the incremental value is divided by two, and the comparator input is checked. The incremental value is subtracted/added to the test value if the test value was higher/lower than the actual analog value.

When the incremental value reaches zero, the value is converte to true two's complement and a return is executed with the value in A, X.

Figure 46:
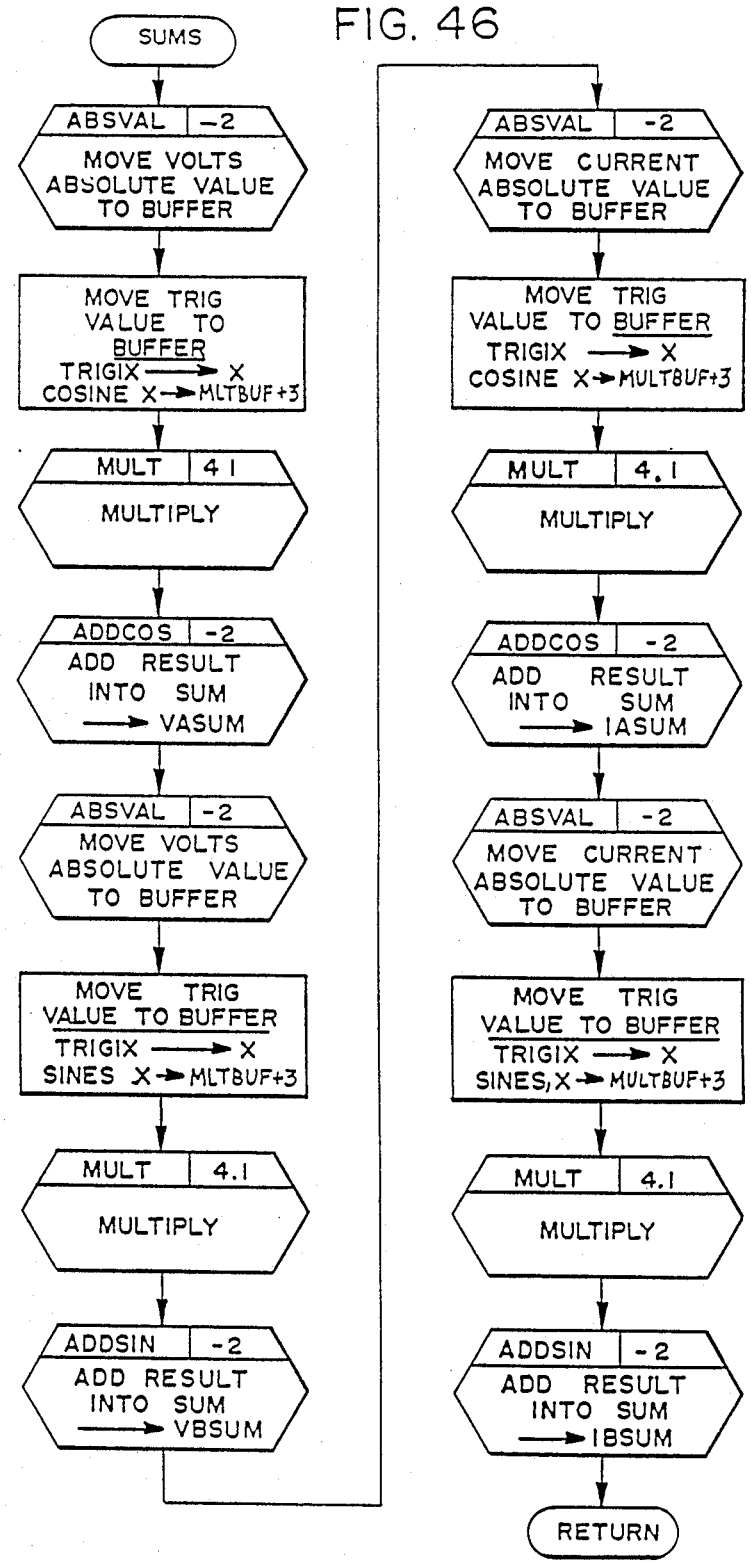

Maintain Fourier Sums (SUMS) FIG. 46

Figure 47:
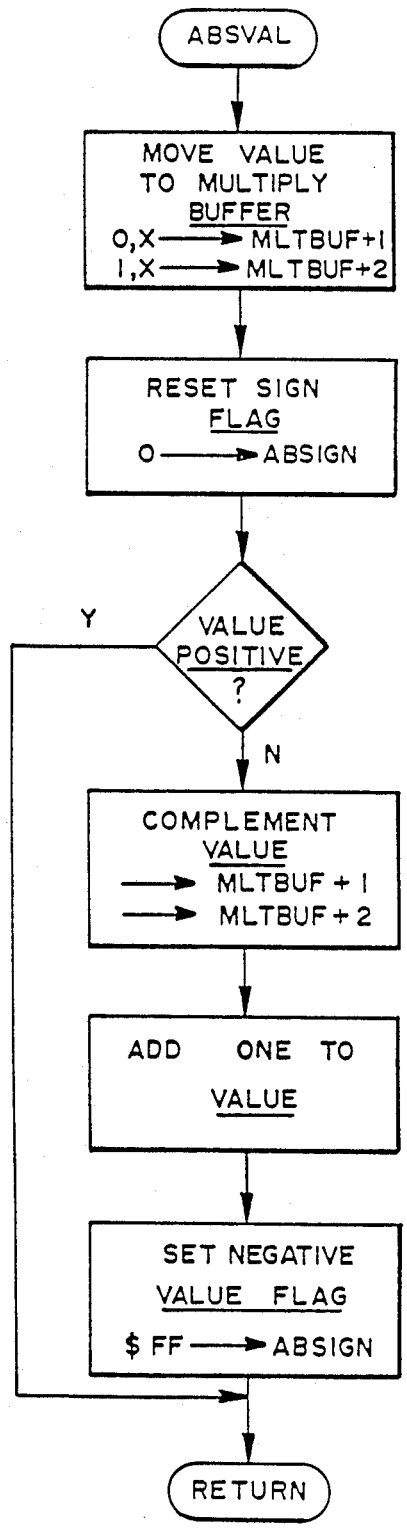
Figure 48:
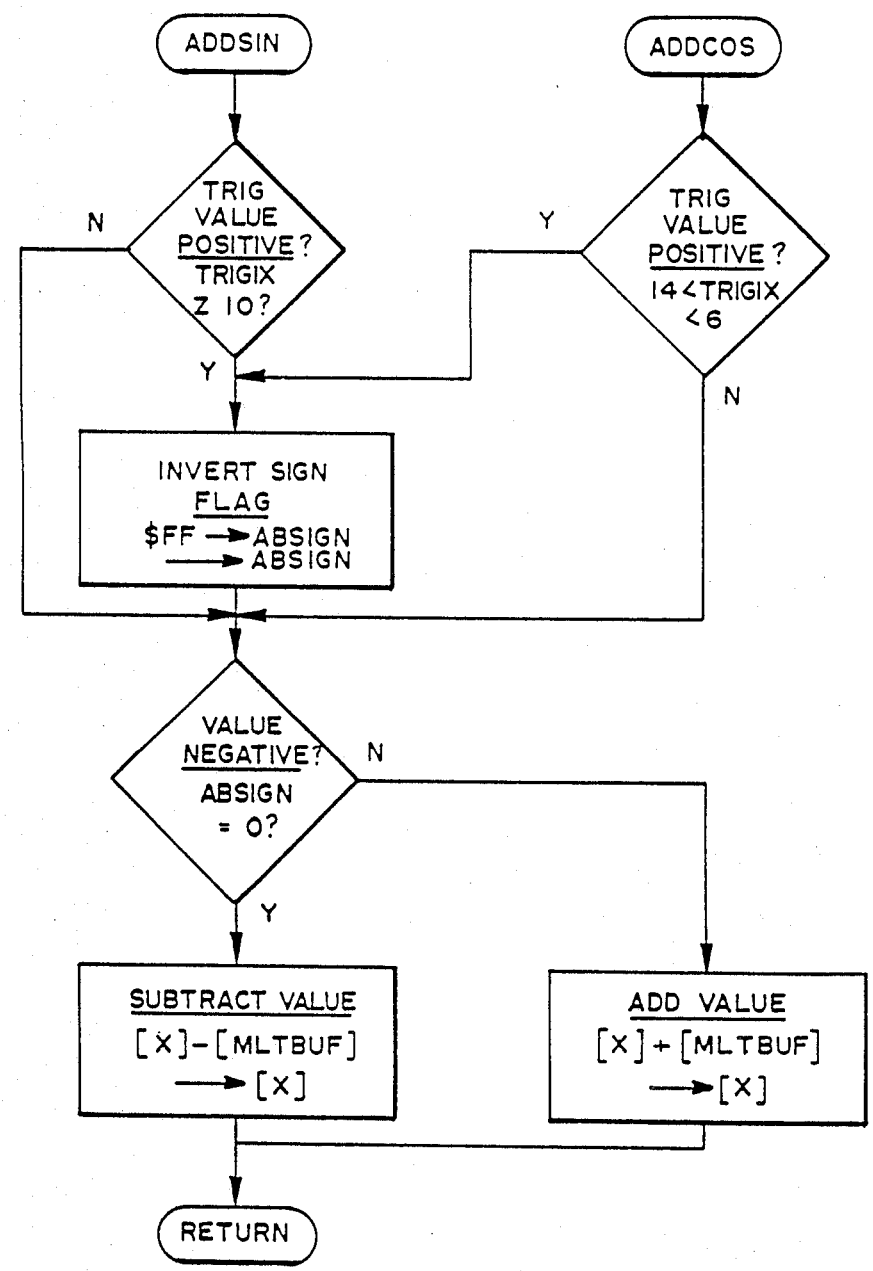

PURPOSE: SUMS multiplies the analog values by the trigonometric values of the phase angles and sums the results.
ENTRY POINT: SUMS
CALLING SEQUENCE:
JSR SUMS
Return
REGISTER STATUS: A, X not preserved.
TABLES USED:
COSINE—Table of cosine values
SINES—Table of sine values
CALLED BY: GETVAL
CALLS:
MULT Local subroutines: ABSVAL, ADDCOS/ADDSIN—FIGS. 47 and 48
EXCEPTION CONDITIONS: None.
DESCRIPTION:

SUMS calls ABSVAL to move the absolute value of the analog value to the multiply buffer, moves the trig value to the buffer, and calls MULT to perform the multiplication. ADDCOS or ADDSIN is called to add the product to the appropriate sum buffer. This cycle is repeated for the sine and cosine values for both voltage and current.

Figure 49:
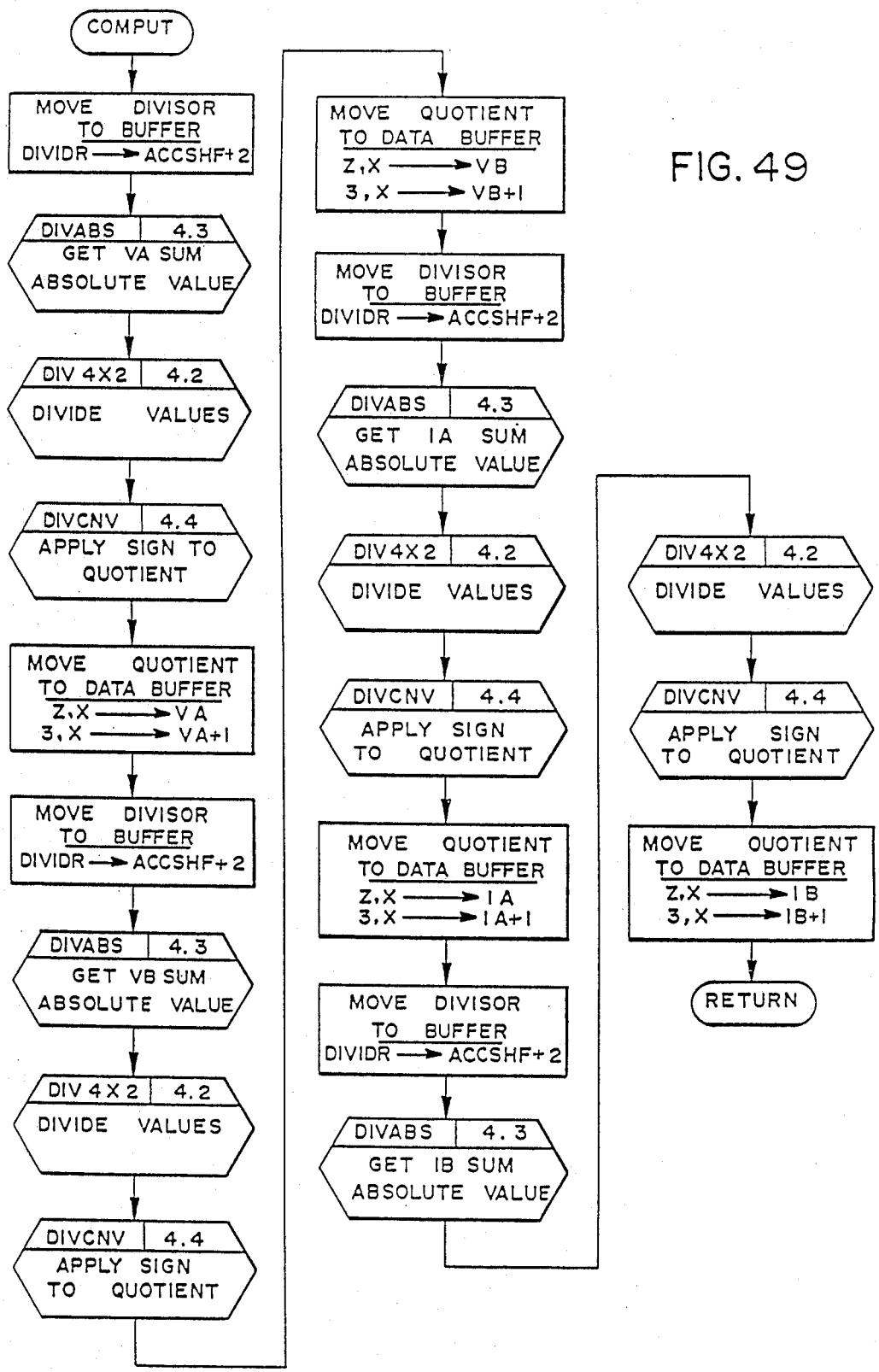

Perform Data Manipulations (COMPUT) FIG. 49

PURPOSE: COMPUT performs necessary scaling functions.
ENTRY POINT: COMPUT
CALLING SEQUENCE:
JSR COMPUT
Return
REGISTER STATUS: A, X not preserved.
TABLES USED: None.
CALLED BY: MAIN
CALLS: DIVABS, DIV4X2, DIVCNV
EXCEPTION CONDITIONS: None.
DESCRIPTION:

COMPUT moves the scale factor to the divide buffer, calls DIVABS to move the absolute value of the fourier sum to the buffer, and calls DIV4X2 to perform the division. DIVCNV is called to apply the proper sign to the quotient, and the value is moved to the data buffer. This cycle is repeated for each of the four fourier sums, and a return is executed.

Figure 50:
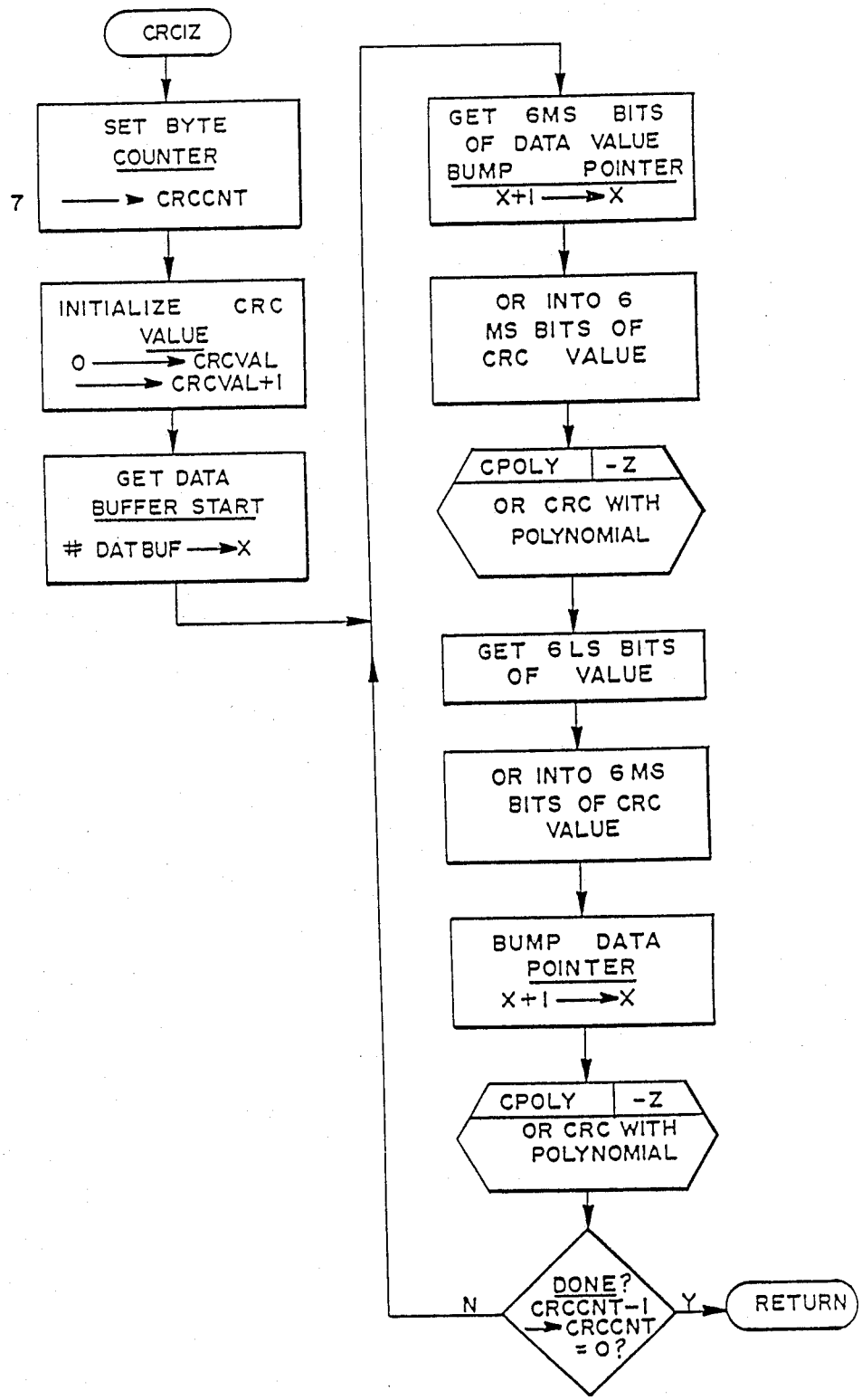

Compute Cyclic Redundancy Check Value (CRC12) FIG. 50

Figure 51:
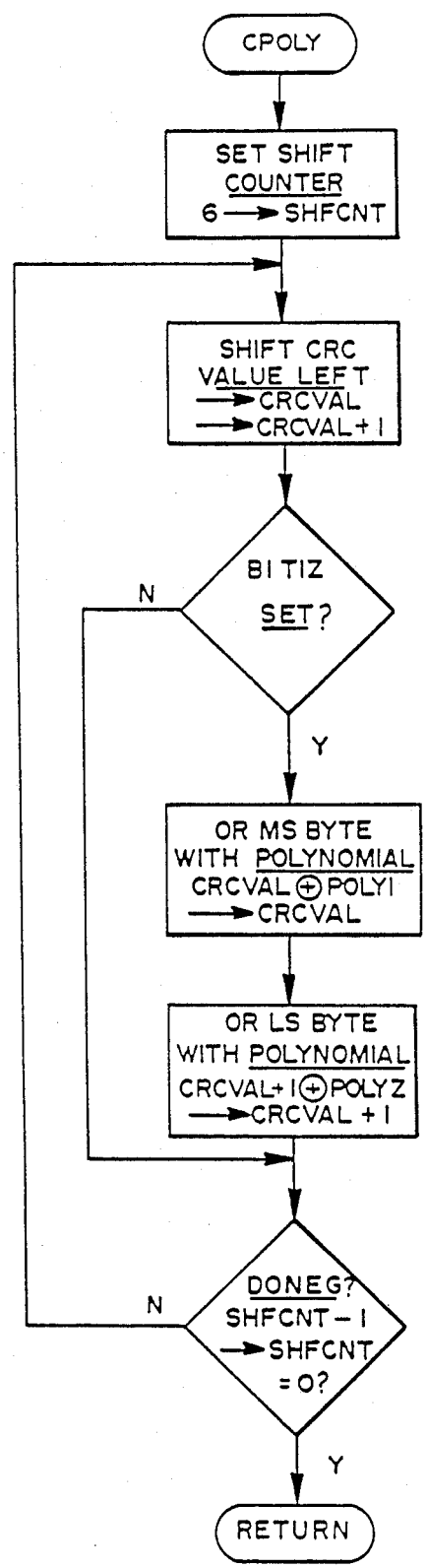

PURPOSE: CRC12 computes the CRC value.
ENTRY POINT: CRC12
CALLING SEQUENCE:
JSR CRC12
Return
REGISTER STATUS: A, X not preserved.
TABLES USED: None.
CALLED BY: MAIN
CALLS: Local Subroutine: CPOLY—FIG. 51
EXCEPTION CONDITIONS: None.
DESCRIPTION:

CRC12 sets a counter to the number of bytes in the data buffer, initializes the CRC value, and gets the data buffer start address. Each 6 bit group of data is exclusively "or"ed into the CRC value, and CPOLY is called to "or" the resulting value with the polynomial value. When all bits have been processed, a return is executed.

CPOLY sets a shift counter for 6 bits. The CRC value is shifted left one bit. If the bit shifted out is a one, the CRC value is exclusively "or"ed with the polynomial value. When 6 bits have been shifted, a return is executed.

Figure 52:
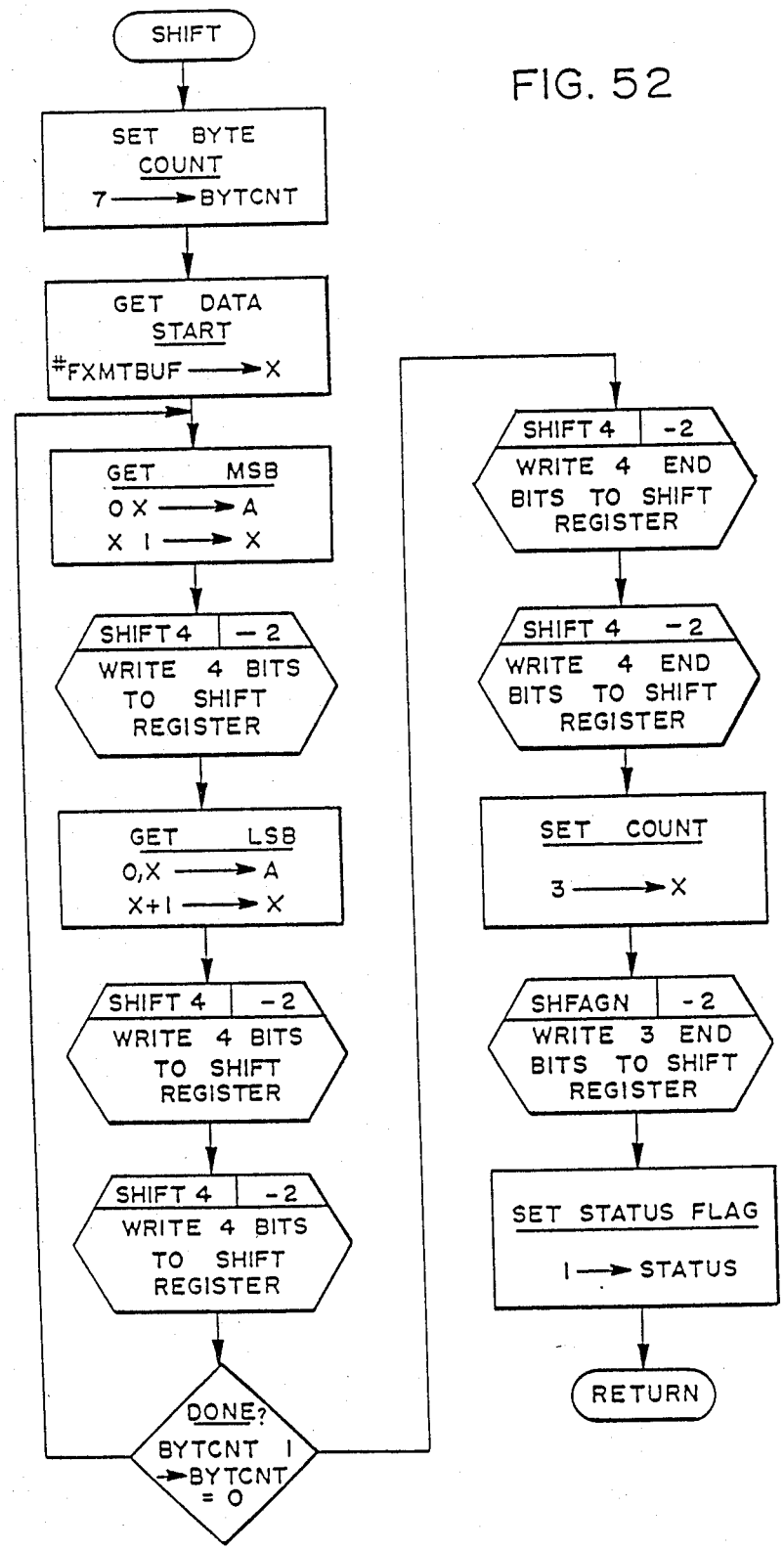

Load Shift Register (SHIFT) FIG. 52

Figure 53:
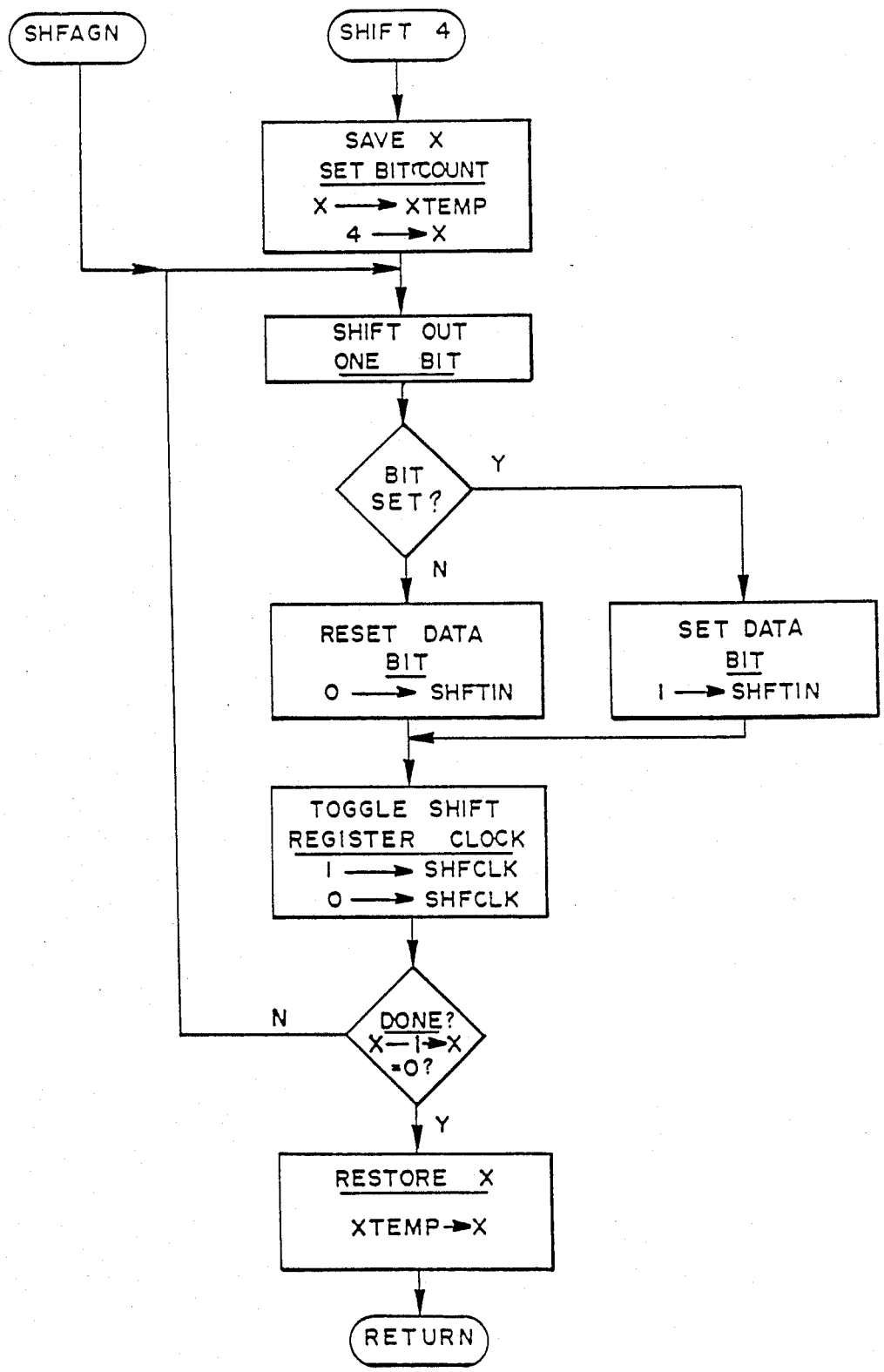

PURPOSE: SHIFT loads the shift register with the data to be transmitted.
ENTRY POINT: SHIFT
CALLING SEQUENCE:
JSR SHIFT
Return
REGISTER STATUS: A, X not preserved.
TABLES USED: None.
CALLED BY: MAIN
CALLS: Local Subroutine: SHIFT4/SHFAGN—FIG. 53
EXCEPTION CONDITIONS: None.
DESCRIPTION:

SHIFT calls SHIFT4 successively to shift four bits of data at a time into the shift register, starting with the most significant bit. When all twelve-bit values have been shifted in, SHIFT4 and SHFAGN are called to fill the shift register with trailing zeroes and a return is executed.

SHIFT4 shifts the four data bits in A(0-3) into the hardware shift register by setting/resetting the data bit and toggling the register clock bit. When four bits have been shifted, a return is executed.

SHFAGN is a special entry to SHIFT4 which allows the desired bit count (1-4) to be passed in X.

Figure 54:
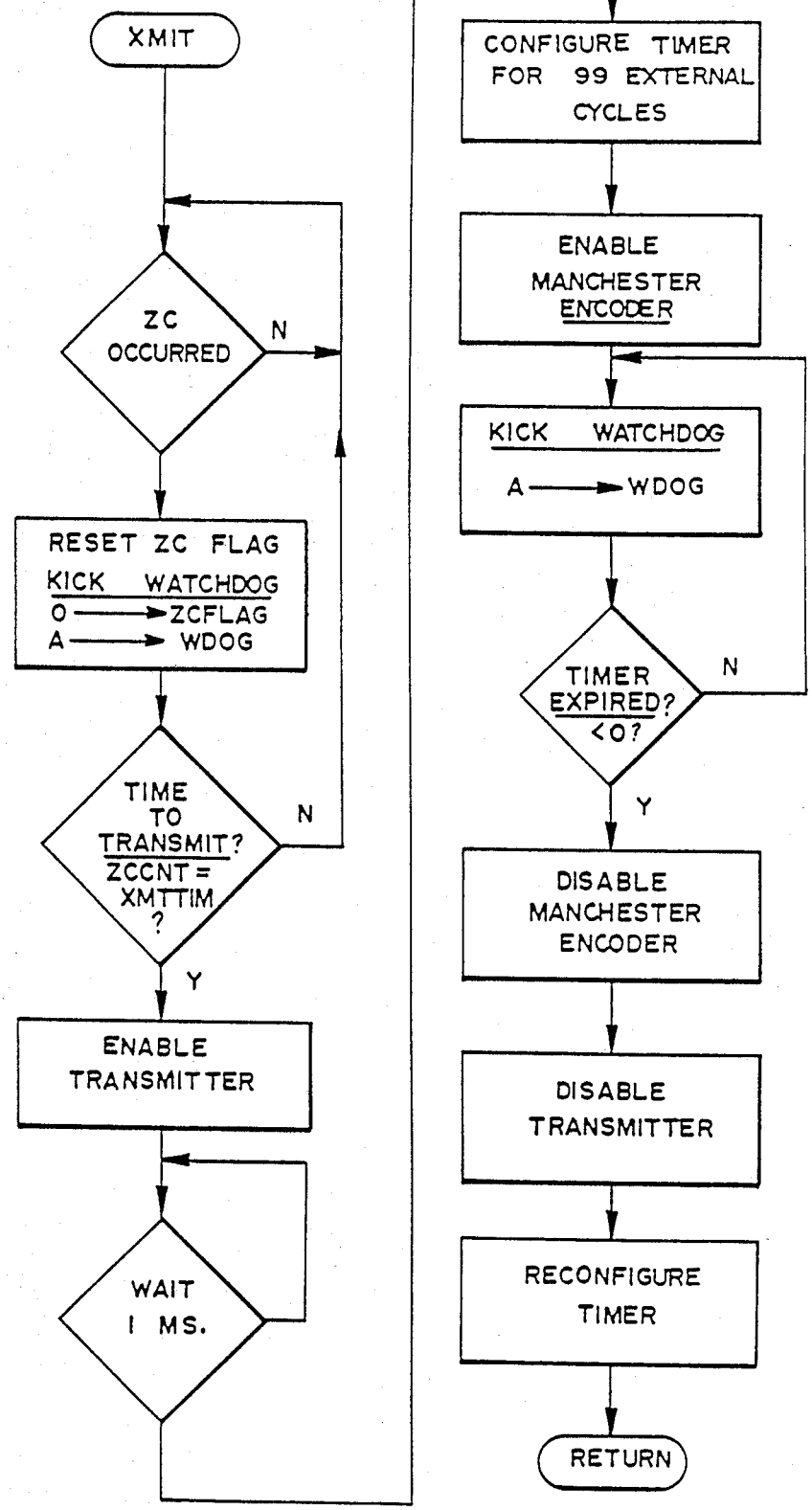

Transmit Data (XMIT) FIG. 54

PURPOSE: XMIT transmits the contents of the shift register to the ground station.
ENTRY POINT: XMIT
CALLING SEQUENCE:
JSR XMIT
Return
REGISTER STATUS: A, X not preserved.
TABLES USED: None.
CALLED BY: MAIN
CALLS: None.
EXCEPTION CONDITIONS: None.
DESCRIPTION:

XMIT monitors the zero-crossing count. When the count reaches the time-to-transmit count, the transmitter is enabled, and a one millisecond warmup delay is executed. The processor clock is initialized for external oscillator, and the clock value is set to the bit count plus shut-off delay. The Manchester encoder is enabled and the watchdog timer is kicked while monitoring the clock. When all data has been sent (clock=0), the Manchester encoder and transmitter are disabled, the timer is reconfigured for its internal oscillator, and a return is executed.

Figure 55:
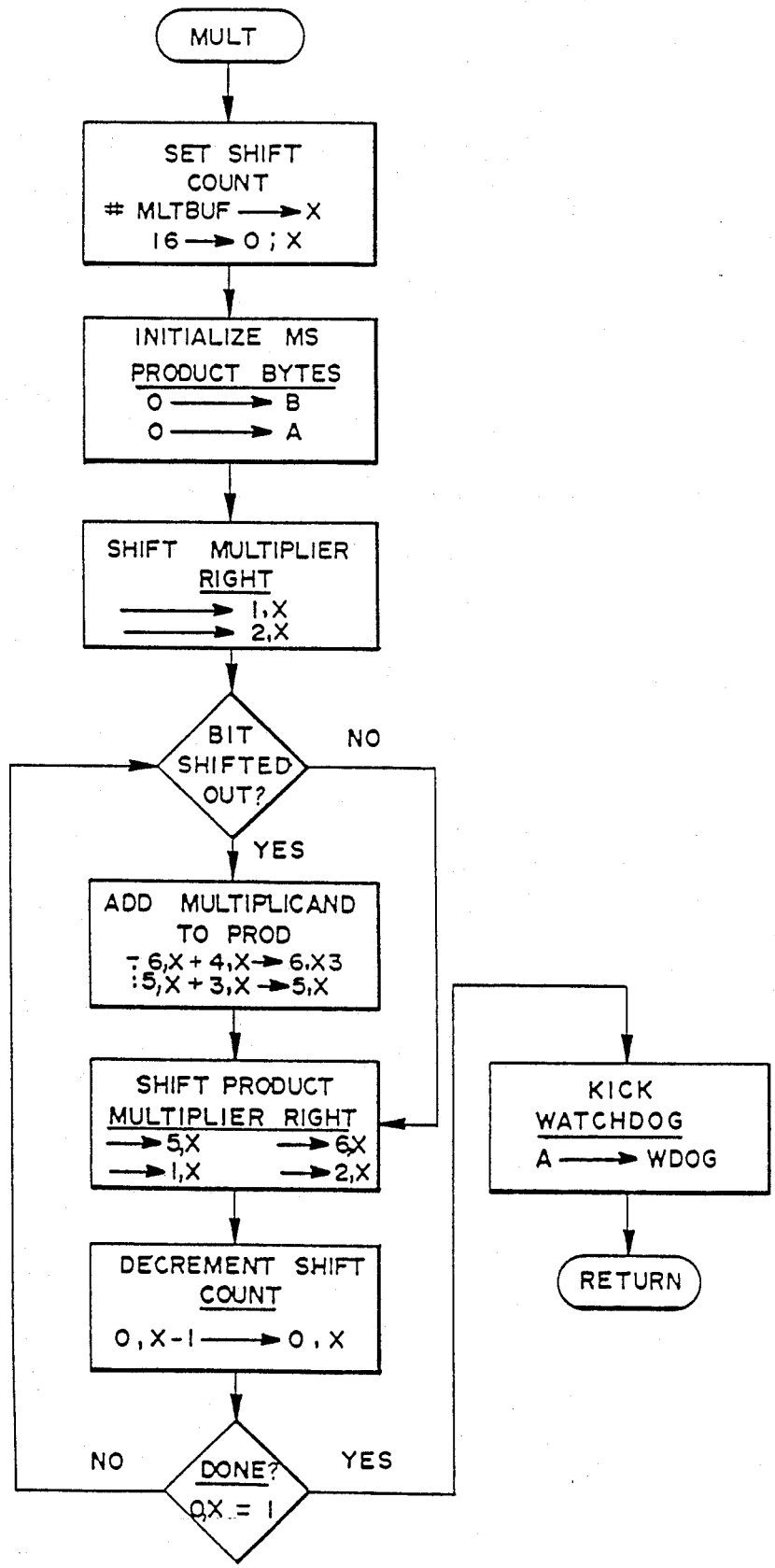

Double Precision Multiply (MULT) FIG. 55

PURPOSE: MULT performs a double precision multiply.
ENTRY POINT: MULT
CALLING SEQUENCE:
MLTBUF+1,2=Multiplier
MLTBUF+3,4=Multiplicand
JSR MULT2
Return
MLTBUF+5,6,1,2=Product
REGISTER STATUS: A, X not preserved.
TABLES USED: None
CALLED BY: COMPUT, SUMS
CALLS: None
EXCEPTION CONDITONS: None
DESCRIPTION:

MULT performs a double precision multiplication by shifting a bit out of the multiplier, successively adding the multiplicand to the product, and shifting the product. When finished, the watchdog timer is kicked, and a return is executed.

Figure 56:
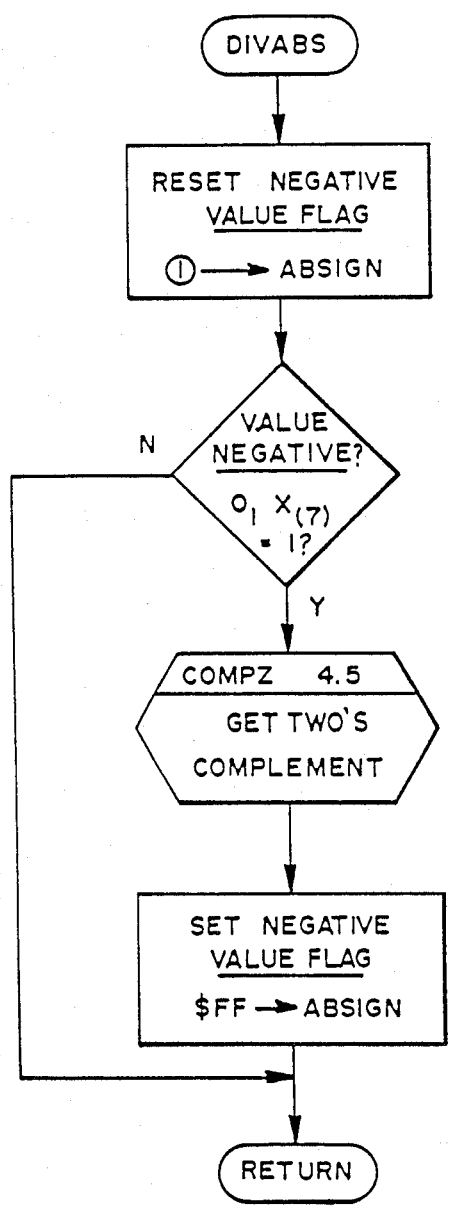

Get Absolute Value (DIVABS) FIG. 56

PURPOSE: DIVABS gets the absolute value of the value at X and sets the sign flag.
ENTRY POINT: DIVABS CALLING SEQUENCE:
X=Value Address
JSR DIVABS
Return
ABSIGN=Sign flag ($FF=Negative)
REGISTER STATUS: X is preserved.
TABLES USED: None.
CALLED BY: COMPUT
CALLS: COMP2
EXCEPTION CONDITIONS: None.
DESCRIPTION:

DIVABS resets the sign flag and tests the most significant bit of the value at X. If set, COMP2 is called to find the two's complement of the four byte value, and the sign flag is set to $FF. A return is then executed.

Figure 57:
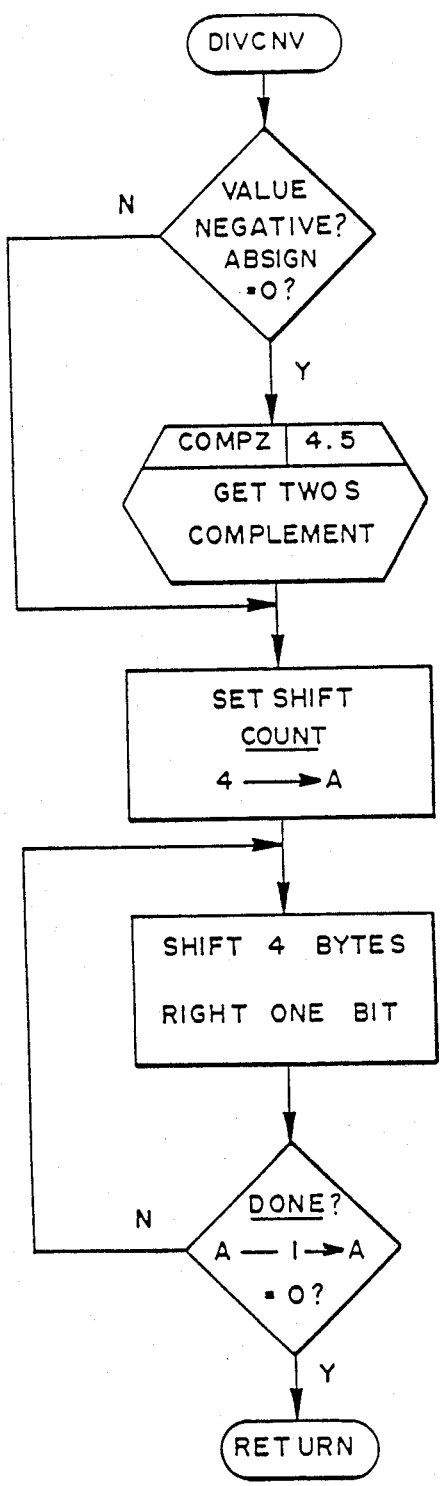

Convert Scaled Value (DIVCNV) FIG. 57

PURPOSE: DIVCNV applies the sign and divides the value by sixteen.
ENTRY POINT: DIVCNV
CALLING SEQUENCE:
X=Value Address
JSR DIVCNV
Return
REGISTER STATUS: A, X not preserved.
TABLES USED: None.
CALLED BY: COMPUT
CALLS: COMP2
EXCEPTION CONDITIONS: None.
DESCRIPTION:

DIVCNV tests the sign flag, ABSIGN. If non-zero, COMP2 is called to find the two's complement of the four byte value at X. The value is then shifted right four bits, and a return is executed.

Figure 58:
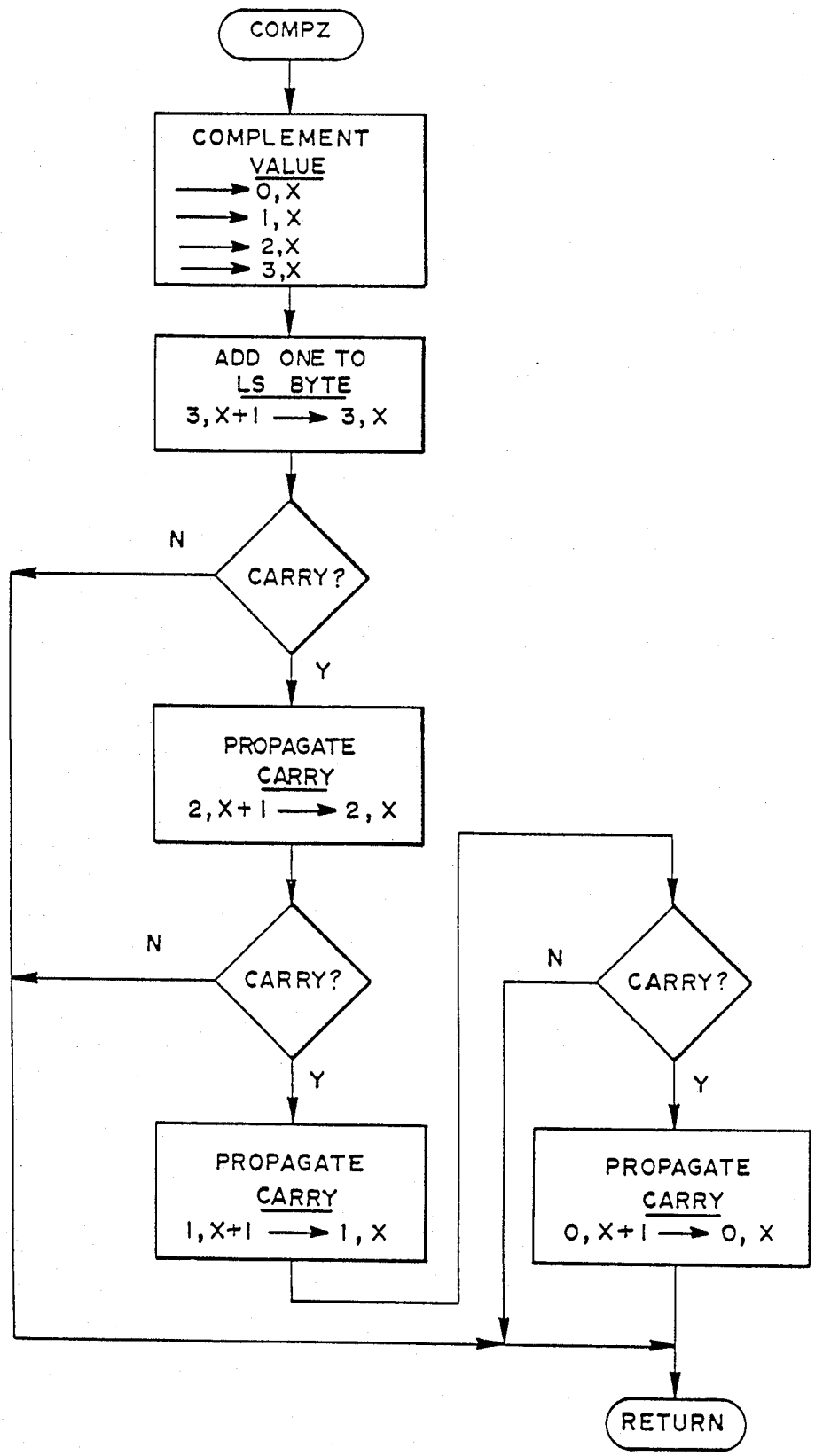

Find Two's Complement Value (COMP2) FIG. 58

PURPOSE: COMP2 finds the two's complement value of the value at X.
ENTRY POINT: COMP2
CALLING SEQUENCE:
X=Value Address
JSR COMP2
Return
REGISTER STATUS: X is Preserved.
TABLES USED: None.
CALLED BY: DIVABS, DIVCNV
CALLS: None.
EXCEPTION CONDITIONS: None.
DESCRIPTION:

COMP2 complements each byte of the four byte value at X, adds one to the least significant byte, and propagates the carry through the remaining bytes.

Figure 59:
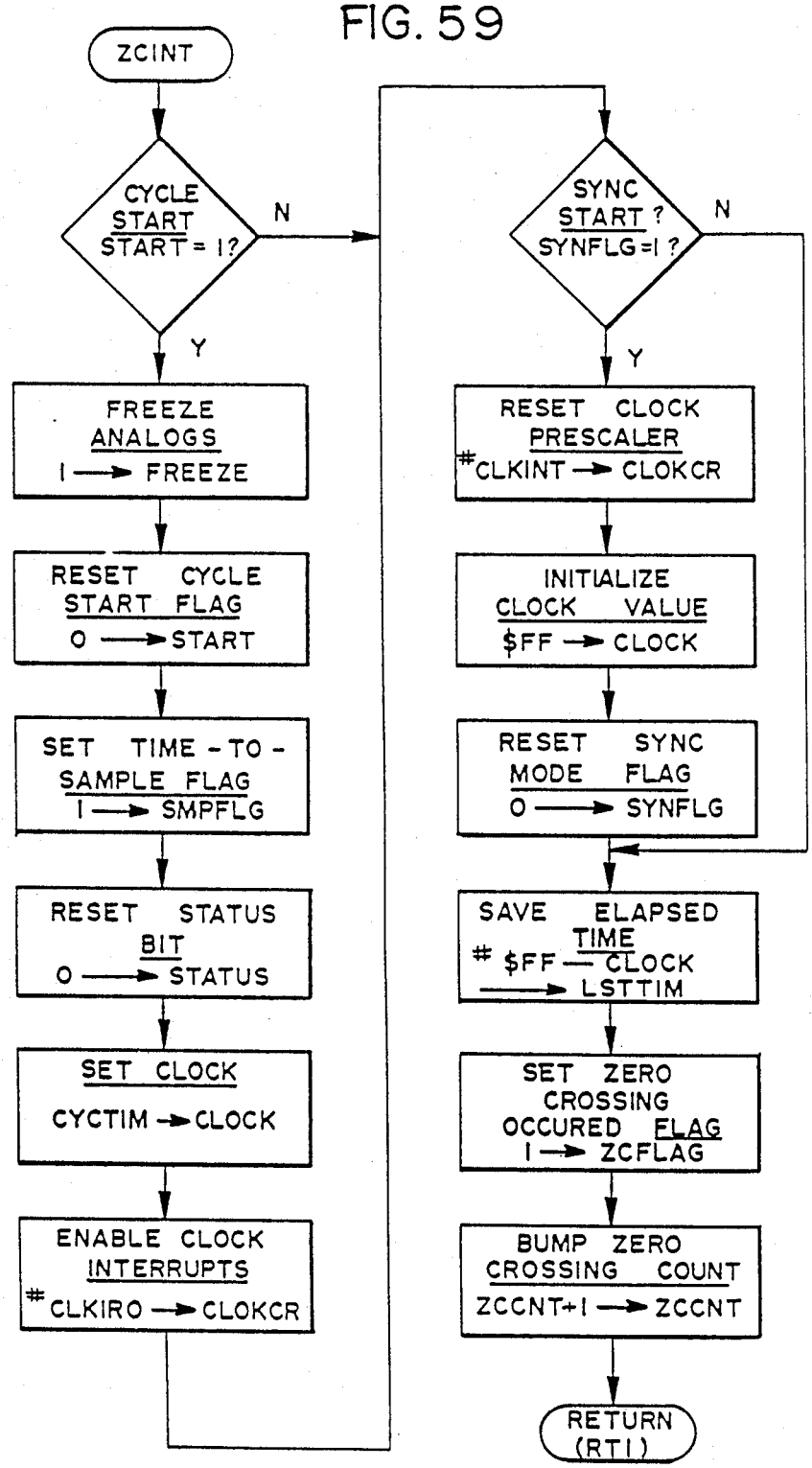

Process Zero Crossing Interrupts (ZCINT) FIG. 59

PURPOSE: ZCINT processes zero crossing interrupts.
ENTRY POINT: ZCINT
CALLING SEQUENCE:
From IRQ Vector
Return (RTI)
REGISTER STATUS: A, X are preserved.
TABLES USED: None.
CALLED BY: Hardware IRQ Vector
CALLS: None.
EXCEPTION CONDITIONS: None.
DESCRIPTION:

ZCINT tests the cycle start flag. If set, the analog tracking register is frozen, the cycle start flag is reset, the time-to-sample flag is set, and the clock is set to the 1-1/9 cycle time.

If the start synchronize flag is set, the clock prescaler is reset, the colck is reset to maximum value, and the start synchronize flag is reset.

The elapsed clock time is saved as the last cycle time, the zero-crossing-occurred flag is set, the zero-crossing count is bumped, and a return is executed.

Figure 60:
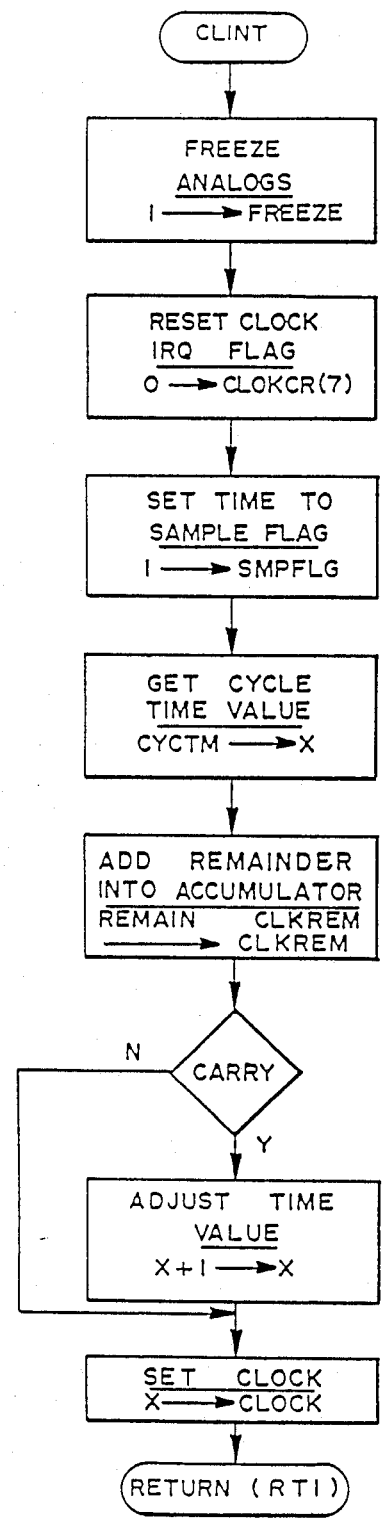

Process Clock Interrupt (CLINT) FIG. 60

PURPOSE: CLINT processes clock interrupts.
ENTRY POINT: CLINT
CALLING SEQUENCE:
From IRQ Vector
Return (RTI)
REGISTER STATUS: A, X are preserved.
TABLES USED: None.
CALLED BY: Hardware Clock IRQ Vector
CALLS: None.
EXCEPTION CONDITIONS: None.
DESCRIPTION:

CLINT freezes the analog tracking register, resets the clock IRQ flag, and sets the time-to-sample flag. The cycle time remainder value is added into the time accumulator. If a carry results, the 1-1/9 cycle time is increased by one. The clock is reset to the cycle time, and a return is executed.

Figure 61:
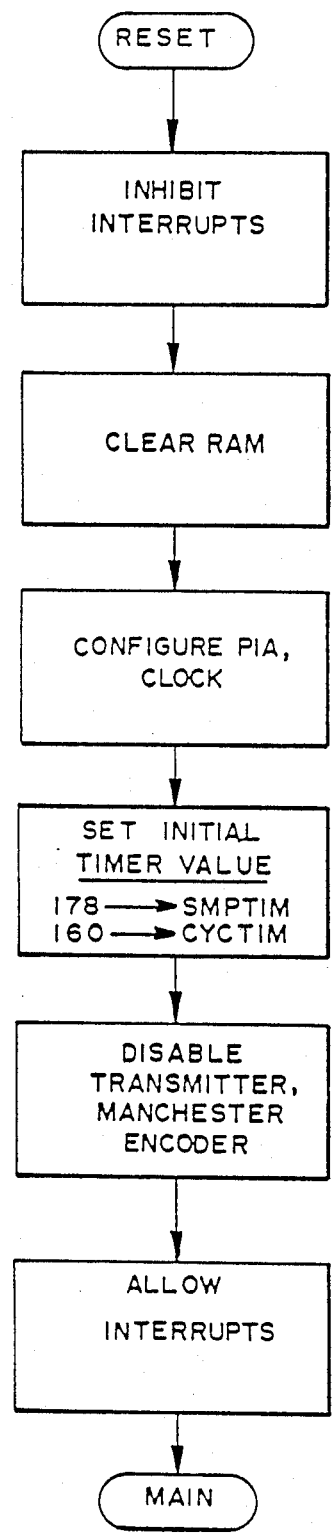

Perform Power-On Reset (RESET) FIG. 61

PURPOSE: RESET performs power-on initialization.
ENTRY POINT: RESET
CALLING SEQUENCE:
From Hardware Reset Vector
JMP MAIN
REGISTER STATUS: A, X not preserved.
TABLES USED: None.
CALLED BY: Hardware Reset Vector
CALLS: MAIN
EXCEPTION CONDITIONS: None.
DESCRIPTION:

RESET inhibits interrupts, clears RAM to zeroes, and initializes the internal clock and PIA's. The initial time values are initialized, and the Manchester encoder and transmitter are disabled. Interrupts are reallowed, and a jump to the background processing loop is executed.

The Receiver

The receiver 24 at a substation 34 as shown in FIG. 4 receives data from fifteen donuts.

Figure 62:
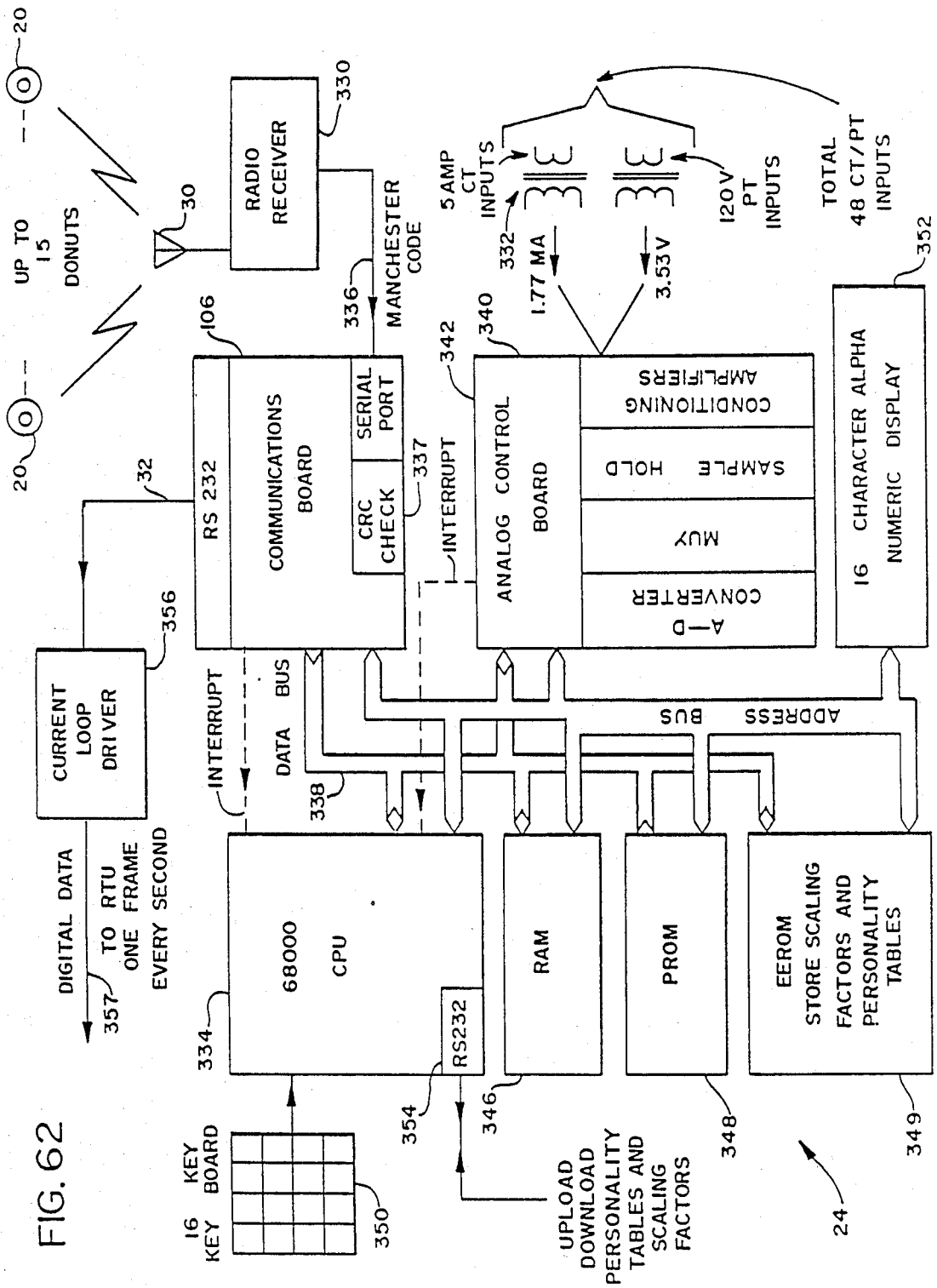
FIG. 62 is an overall block diagram of a ground station receiver remote terminal interface according to the invention.

In FIG. 62 there is shown an overall circuit block diagram for such a receiver 24.

In addition to receiving transmissions from up to fifteen donuts 20, via its antenna 30 and radio receiver 330, the receiver 24 can also receive analog data from up to 48 current transformers and potential transformers generally indicated at 332. The receiver 24 is operated by a type 68000 Central Processing Unit 334. The Manchester coded transmissions from the donuts 20 received by the receiver 330 are transmitted via line 336 to a communication board 106 and thence on data bus 338 to the 68000 CPU 334. The transformer inputs 332 are conditioned in analog board 340 comprising conditioning amplifiers, sample and hold, multiplexing and analog-to-digital conversion circuits under control of analog control board 342. The digitized data is supplied on data bus 338 to the CPU 334. The CPU 334 is provided with a random access memory 346, a programmable read only memory 348 for storing its program, and an electrically erasable read only memory 349 for storing the scaling factors and personality tables.

The central processing unit 334 may be provided with a keyboard 350 and a 16 character single line display 352. It is also provided with an RS232 port 354 for loading and unloading so called personality tables comprising scaling factors and the like for the donuts 20 and the transformer inputs 332. The receiver 24 which is sometimes called herein a remote terminal unit interface, supplies data to a remote terminal unit via current loop 356 from an RS232 communications port on communications board 106.

The Receiver Software

Figure 5:
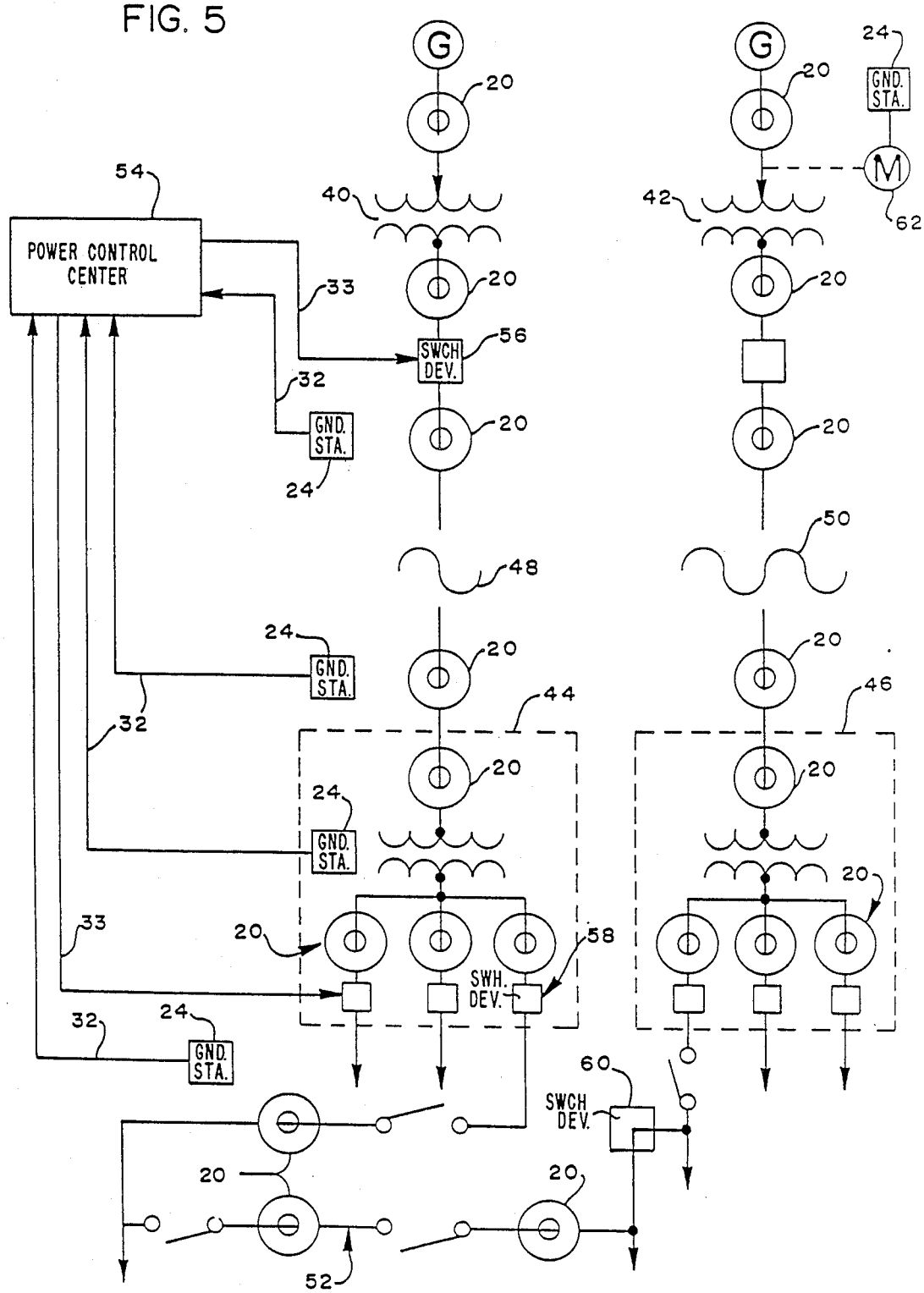
FIG. 5 is a diagrammatic schematic view of a power deliver system monitored and controlled according to the system of the invention.

Copyright © 1983,
Product Development Services, Incorporated (PDS)
Functional Specification of the Receiver The remote terminal unit may be a Moore MPS-9000-S manufactured by Moore Systems, Inc., 1730 Technology Drive, San Jose, Calif. 95110, modified to receive and store a table of digital data each second sent on line 357. Unmodified, the MPS-900-S receives inputs from potential and current transformers, temperature sensors and the like at a substation, and converts these measurements to a digital table for transmission to a power control center 54 (FIG. 5) or for use in local substation control.

Simultaneous transmissions from two or more donuts 20 are ignored since the garbled message received will not produce a check sum (CRC) that matches the check sum as received. The CRC check portion of the circuit is shown at 337.

Overview:

An integral part of commercial power generation is monitoring the amount of power delivered to customers and, if necessary, purchase of power from other companies during peak demand periods. It is advantageous to the power company to be able to make measurements at remote substations, and be able to relay all the measurements to a central point for monitoring. Because of the large voltages and currents involved in commercial power distribution, direct measurement is not feasible. Instead, these values are scaled down to easily measured values through the use of Potential Transformers (PT's) for voltage, and Current Transformers (CT's) for current. Recently, we have developed another means for monitoring power line voltage and current. This is the Remote Line Monitor, a donut shaped (hence the nickname "donut") device which clamps around the power line itself, and transmits the measured values to a radio receiver on the ground.

The Remote Terminal Interface (RTI) monitors power line voltage, current, and temperature by means of Potential Transformers (PT's), Current Transformers (CT's), and temperature transducers respectively. These parameters may also be obtained from Remote Line Monitors, or "donuts" which are attached to the power lines themselves. It is the job of the RTI to receive this data, and in the case of PT's, CT's and temperature transducers, digitize and analyze the data. This data is then used to calculate desired output parameters which include voltage, current, temperature, frequency, kilowatt hours, watts, va, and vars, (the last three being measures of power). These values are then sent to the Remote Terminal Unit (RTU), and are updated once per second.

Data obtained from PT's, CT's, and temperature transducers must be digitized by the RTI before it can be used. Data obtained in this way is termed "analog" data. Donuts, on the other hand, send their data to the RTI in digital form. For this reason, input received from donuts is said to be "digital" input. Each donut supplies three parameters, (voltage, current, and temperature) thus it is equivalent to three analog inputs.

Virtually all commercial power systems in the United States today are three phase systems. There are two configurations used: the 3 conductor or delta configuration, and the 4 conductor or wye configuration. To calculate power (va, vars) it is necessary to measure the voltage and current in all but one of the conductors. That one conductor is used as a reference point for all voltages measured. For a delta configuration, voltage and current in two of the three conductors must be measured (only two phases). This is referred to as the two wattmeter method. It is desirable to use the two wattmeter method whenever possible because only 2 PT's and CT's are required. For a wye configuration however, voltage and current must be measured in all 3 phases. (The fourth conductor is an explicit reference point. No such reference is provided in the delta configuration, so one of the phases must be used instead.) This latter method is known as the three wattmeter method.

The program listings for the receiver remote terminal interface are found in Appendix B of U.S. Pat. No. 4,689,752, incorporated herein by reference. They comprise a number of subroutines on separately numbered sets of pages. The subroutines are in alphabetical order in Appendix B. At the top of page 1 of each subroutine the name of the subroutine is given, (e.g., ACIA at the top of the first page of Appendix B). The routine INIT initializes the computer and begins all tasks.

Appendix C of U.S. Pat. No. 4,689,752, incorporated herein by reference comprises equates and macro definitions used in the system. Those headed STCEQU are for the system timing controller (an AM9513 chip). Those headed XECEQU are for the Executive program EXEC in Appendix B. Those headed RTIEQU are unique to the remote terminal interface and used throughout the programs of Appendix B.

GENERAL

A. Accuracy:
All calculations will be performed to 5 significant digits, representing an accuracy of 0.01% of full scale.

B. Input ranges:
Analog voltages and currents will be digitized to a 12 bit bipolar value ranging from −2048 to 2047.
Analog temperature will also be digitized to a 12 bit value which may or may not be bipolar.
All incoming digital data will be 12 bit values ranging from −2048 to 2047.

C. Number of inputs/outputs:
There shall be no more than 48 analog inputs and 15 digital inputs, and no more than 64 outputs. The analog inputs may monitor no more than 5 separate groups. (A group is defined as a circuit whose voltage is used for the frequency reference and power calculations) The donuts may be used to monitor a maximum of 5 additional groups.

D. Digital inputs:
Digital inputs, if used, will be supplied by 'donuts', (see donut documentation)

E. Scaling Ranges:

1. Range of donut scaling factors will be from 0.5 to 2. In addition, the temperature value may also have an offset from $-1024$ to $+1023$ added to it.
2. Each PT has a scaling factor associated with it. This factor may range from 0.5 to 2.0.
3. Each CT has four scaling factors associated with it. These factors may each range from 0.5 and 2.0.

DATA ACQUISITION

A. Analog data input:

Analog data can come from three sources: Potential Transformers, (PT's), Current Transformers (CT's), or temperature transducers. The order of sampling will be determined by the outputs desired. (see Data Output) For voltage and current, 9 equally spaced samples must be taken over the space of a power line voltage cycle for the purposes of data analysis. (see Data Processing). For each voltage group (maximum of 5), a timer must be maintained to provide proper sampling intervals. This timer will be checked each sampling period and adjusted if necesssary. The first phase of the voltage sampled will be used as the reference for checking the sampling period timer.

The input task knows it may begin sampling for a given group of inputs (cluster) when all of the input buffers connected with it are ready for input. The necessary data is collected from the A/D converter, and stored in the appropriate input buffer. When this sampling is complete, the buffer is marked as unavailable for further input, and made available for Fourier analysis. The sampling timer is then adjusted if necessary, and the input task then proceeds to the next group of buffers in the Input Sequence Table.

B. Digital Input:

Input from the 'donuts' (if used) is already digitized and analyzed. It is only necessary to apply a scaling factor (unique for each parameter from each donut) to the data, and convert it to 2's complement form. After this has been done, the data is in a suitable form to calculate output data.

Donut input is not solicited, but rather is transmitted in a continuous stream to the RTI. When data is received from a donut, the processor is interrupted. The incoming data is then collected in a local buffer until a full message from a donut is received and validated. If the data is not valid, the transmission is ignored, and normal processing continues. If the buffer has already received valid input data for this sampling period, the transmission is ignored. Otherwise, the new data is moved from the receive buffer into the appropriate data buffer, the age count is cleared, is marked as waiting to be processed, and is made available for effective value calculations.

C. Analog Input Error Detection/Action:
None.

D. Digital Input Error Detection/Action:

A Cyclical Redundancy Check (CRC) word will be provided at the end of each donut transmission. If the CRC fails, the last good data transmitted by that particular donut will be reused. If the output task references the buffer before new data comes in, the old data will be reused. If a donut should fail more than N (to be defined) consecutive times, that donut will be considered to be bad, and its data will be reset to zero.

DATA PROCESSING

Analog data must be subjected to Fourier transformation to extract the sine and cosine components of the voltage and current prior to calculating output values. Also, if the input was a voltage, the sine and cosine components must be scaled by a factor between 0.5 and 2.0. This scaling factor is found in the Input Personality Table, and is unique to each input. If the input was a current, the effective value and the Fourier components must be scaled by one of four factors ranging between 0.5 and 2.0. The scale factor used is dependent on the raw value of the effective current (Ieff). Each current input has a unique set of four factors. These may also be found in the Input Personality Table.

The purpose of Fourier transformation is to extract the peak sine and cosine components of an input waveform. These components are then used to calculate the amplitude (effective value) of the waveform. For this application, we are only concerned with the components of the fundamental (60 Hz) line frequency.

If the buffer is an analog input buffer, then the 9 samples are analyzed, yielding the sine and cosine components of the fundamental. The effective value of the waveform is then computed and stored in the buffer. The buffer is then marked as being ready for more raw data.

If the buffer is a digital (donut) buffer, then only the effective voltage and current are computed and stored in the buffer. When these calculations are complete, the buffer is marked as being ready for more raw data.

After the data has been appropriately processed, then the output values may be calculated. Parameters that may be calculated are: voltage, current, kilowatt hours, watts, va, and vars. Also, temperature, and frequency may be output. (These are measured, not calculated parameters).

Error Detection/Action:
None.

DATA OUTPUT

Output data will be transmitted to the host in serial fashion. Data to be transmitted to the host will be stored in a circular FIFO buffer to be emptied by the transmission routine which will be interrupt driven. All data must be converted to offset binary and formatted before transmission. A new set of output data will be transmitted to the host once per second.

When a buffer is ready to be ouput, the wattage must be calculated (If it hasn't been already) and stored in the buffer corresponding to the phase 1 of the current involved in the calculation. When the wattage is calculated, the kilowatt hour value is updated also. After calculating power and updating KWH, the output task will calculate the requested output parameter and output it (if the appropriate buffers to perform the calculation are ready). The output task will then proceed to the next entry in the Output Personality Table. When the end of the table is reached, all buffers, both analog and digital, are marked as ready for analysis. In addition, the output task will enable the transmission of the block of data just calculated, and wait until the start of the next one second interval before starting at the top of the table again.

If the second current input specifier in the output table entry is not $-1$, the parameter will be calculated using the Breaker-and-a-half method. (see glossary)

Error Detection/Action:

If the requested parameter cannot be calculated because the requisite buffers are not yet ready, and the output buffer is empty, we have a fatal error in that we haven't been able to calculate the requisite data in time for transmission. For now we'll just wait until the data does come along.

RTI MONITORING/PROGRAMMING

The RTI will be supplied with an integral 16 key keypad, and single line (16 column) display. From this keyboard, the user may:
continuously monitor any particular output value (the display being updated once per second).
display all diagnostic error counts.
transmit an upload request to the host thru the auxiliary port.
In addition, the RTI will have the capability to upload/download any EEPROM based table through the auxiliary port upon request from the host. All programming of the RTI (configuration and scaling factor entry) will be performed through this link. Communications protocols will be defined in the design spec.

Error Detection/Action:
When each table is up/down loaded, a 16 bit CRC word is transmitted with it. Should this CRC check fail on down load, the RTI will request a retransmission and the table in EEPROM will not be updated. On upload, it is the responsibility of the host to request a retransmission.

INITIALIZATION

A. Various hardware must be initialized prior to start of operation. Presently defined hardware is:
STC (System Timing Controller).
The STC consists of 5 independent timers, any one of which may be selected to generate an interrupt upon timing out. This is used to insure that the analog samples are taken at the proper time. The STC is made by Advanced Micro Devices, and its part number is 9513.
PI/T:
Set timer to provide interrupts at one second intervals to signal the start of data transmission to the host.
ACIA 1: Host interface
4800 baud
Odd parity
1 stop bit
8 data bits
Host interface monitor (RCV Half of ACIA 1)
ACIA 2: Auxiliary link
To be defined.
Error Detection/Action:
None.
B. Software initialization:
The analog and digital buffers must be initialized at startup time. Also at this time, the Input Sequence Table and Cluster Status Masks are built. Finally, the various tasks must be initialized and started.
Equations:
Fourier analysis (voltage and current):

$$Va \text{ (cosine component)} = \sum_{s=1}^{9} Vs \times \cos(s \times 40°)/4.5$$

$$Vb \text{ (sine component)} = \sum_{s=1}^{9} Vs \times \sin(s \times 40°)/4.5$$

Where s is the sample number.
Note: $\sin(s \times 40°)/4.5$ and $\cos(s \times 40°)/4.5$ are constants, and may be stored in a table.
Effective voltage (current):

$$Veff = \sqrt{Va^2 + Vb^2}$$

Temperature: on calculation—the input value is just passed on.
Power:
Watts:
per phase:

$$Watts = (Vb \times Ib) + (Va \times Ia)$$

Total power: (this applies to Watts, VARS, and VA)
Three phase (wattmeter) method:

$$pwr = (\text{Phase 1 pwr} + \text{Phase 2 pwr} + \text{Phase 3 pwr})/6144$$

Two phase (wattmeter) method:

$$pwr = (\text{Phase 1 pwr} + \text{Phase 2 pwr})/4096$$

where pwr may be WATTS, VARS, or VA.
Note: The constants 6144 and 4096 above are included so that full scale voltage and full scale current will yield full scale power. Proper scaling to actual watts, vars, va, or watt-hours will be performed by the host.
VARS:

$$VARS = (Va \times Ib) - (Vb \times Ia) \text{ (per phase)}$$

Total VARS calculated as per total watts above.
VA:

$$VA = Veff \times Ieff$$

Total VA calculated as per total watts above.

TABLES

A. Input Personality Table:
This table is EEPROM based, and binds a specific input number to an input type (voltage, current, temperature), group #, phase #, and set of correction factors. This table is of a fixed size and may have no more than 48 entries. Unused entries will have a value of 0. The values in this table will be determined at installation time.

B. Output Personality Table:
The Output Personality Table is an EEPROM based table which defines each of the parameters to be output, and which parameters are necessary to calculate them. The number of entries (up to 64) in the table is unique to the site, and is determined at installation time. The entries ar arranged in the order in which they are to be output. There may be no more than 64 entries in this table.
When donuts are used, both voltage and current readings from the selected donut(s) will be used for power (volt-amp) calculations. (ie. using voltage from a donut and current from a CT will not be permitted)
Donuts shall have ID's ranging from 1 to 15. Each installation using donuts must start the donut ID's from 1.
Donuts must be used in groups of three. (Their output is suitable only for use in the 3 wattmeter method.) The ID's of the donuts must be consecutive, the lowest numbered one being assumed to be phase one, and the highest numbered one will be assumed to be phase 3.
Zero entries in the table will be ignored.
C. Input Sequence Table The Input Sequence Table is RAM based, and built at RTU startup time, based on the Output and Input Personality tables. For each group, this table specifies which inputs must be sampled simultaneously to calculate the desired outputs. The groups are entered into the table in order of their first reference in the Output Personality Table. The Input Personality Table is then referenced to find the input numbers of all phases of a given input type (ie. current) for any group. Each group is terminated by a zero word. The table is terminated by a word set to all ones.

D. Donut Scale Factor Table

This table is EEPROM based and contains the donut's group number, and scaling factors to be applied to donut inputs. Scale factors are unique to each parameter input from each donut. In addition, the temperatureinput may also have an offset from −1024 to 1023 added to it. This offset is added after the scaling factor has been applied. The entries are arranged in order of donut ID's.

Data Formats:

A. Incoming Donut Data Format:

| word | bits | function |
| --- | --- | --- |
| 1 | 11–8 | don't care |
|   | 7–4 | donut id |
|   | 3–0 | aux. id |
| 2 | 11–0 | Va (cosine component of voltage) |
| 3 | 11–0 | Vb (sine component of voltage) |
| 4 | 11–0 | Ia (cosine component of current) |
| 5 | 11–0 | Ib (sine component of current) |
| 6 | 11–0 | Aux |
| 7 | 11–0 | CRC word |

B. Host Transmission Format
For data types 0–6:

| word | bits | function |
| --- | --- | --- |
| 1 | 7–6 | always zero |
|   | 5–0 | value # |
| 2 | 7–6 | always one |
|   | 5–0 | MS 6 bits of value |
| 3 | 7–6 | always one |
|   | 5–0 | LS 6 bits of value |

For data type 7 (KWH):

| word | bits | function |
| --- | --- | --- |
| 1 | 7 | always one |
|   | 6 | always zero |
|   | 5–0 | value # |
| 2 | 7–6 | always one |
|   | 5–0 | MS 6 bits of value |
| 3 | 7–6 | always one |
|   | 5–0 | LS 6 bits of value |

C. Upload/Download format:

| byte | bits | function |
| --- | --- | --- |
| 0–4 | 0–7 | sync character - SYN ($16) |
| 5 | 0–7 | table I.D. - ASCII digit 0–3 where: |
|   |   | 0 - I.D. table |
|   |   | 1 - Input Personality Table |
|   |   | 2 - Output Personality Table |
|   |   | 3 - Donut Scale Factor Table |
| 6–7 | 0–7 | byte count - # of bytes of table transmitted |
| 8–N | 0–7 | table data -N = byte count + 8 |

-continued

| byte | bits | function |
| --- | --- | --- |
| N+1–N+2 | 0–7 | CRC word. CRC includes bytes 5 thru N |

E. Fourier constant table

In the Fourier analysis, the values sin (s×40)/4.5 and cos (s×40)/4.5 (where s ranges from 1 to 9) are constants, and thus may be stored in a table. This avoids needless computation. Each entry will be a 32 bit floating point number. There will be 9 entries for each table. (sine and cosine)

F. Analog Input Buffer

There are 48 of these buffers, one per A/D channel. The number of buffers actually used is installation dependent. These buffers accept raw input from the A/D, and hold the results of intermedicate calculations until output time. The intermediate values are the cosine and sine components oo the Fourier analysis of the 9 input samples, the effective value (computed from these components), total wattage, watt seconds, and kilowatt hours. The last three parameters are only defined for Analog Input buffers corresponding to phase 1 CT's.

G. Digital Input Buffer

There are 16 digital input buffers in the system. The number of buffers actually used is installation dependent. These buffers are similar in fuction to the analog input buffers, but their format is different due to the fact that data from donuts has already been analyzed, and voltage, current and temperature data are sent from each donut, being equivalent to three analog inputs. The data contained in these tables are the cosine and sine components of voltage, cosine and sine components of current, temperature, effective voltage and current, total watts, watt seconds, and kilowatt hours. The last three parameters are used only in buffers corresponding to donuts connected to phase one of a group.

GLOSSARY

Figure 63:
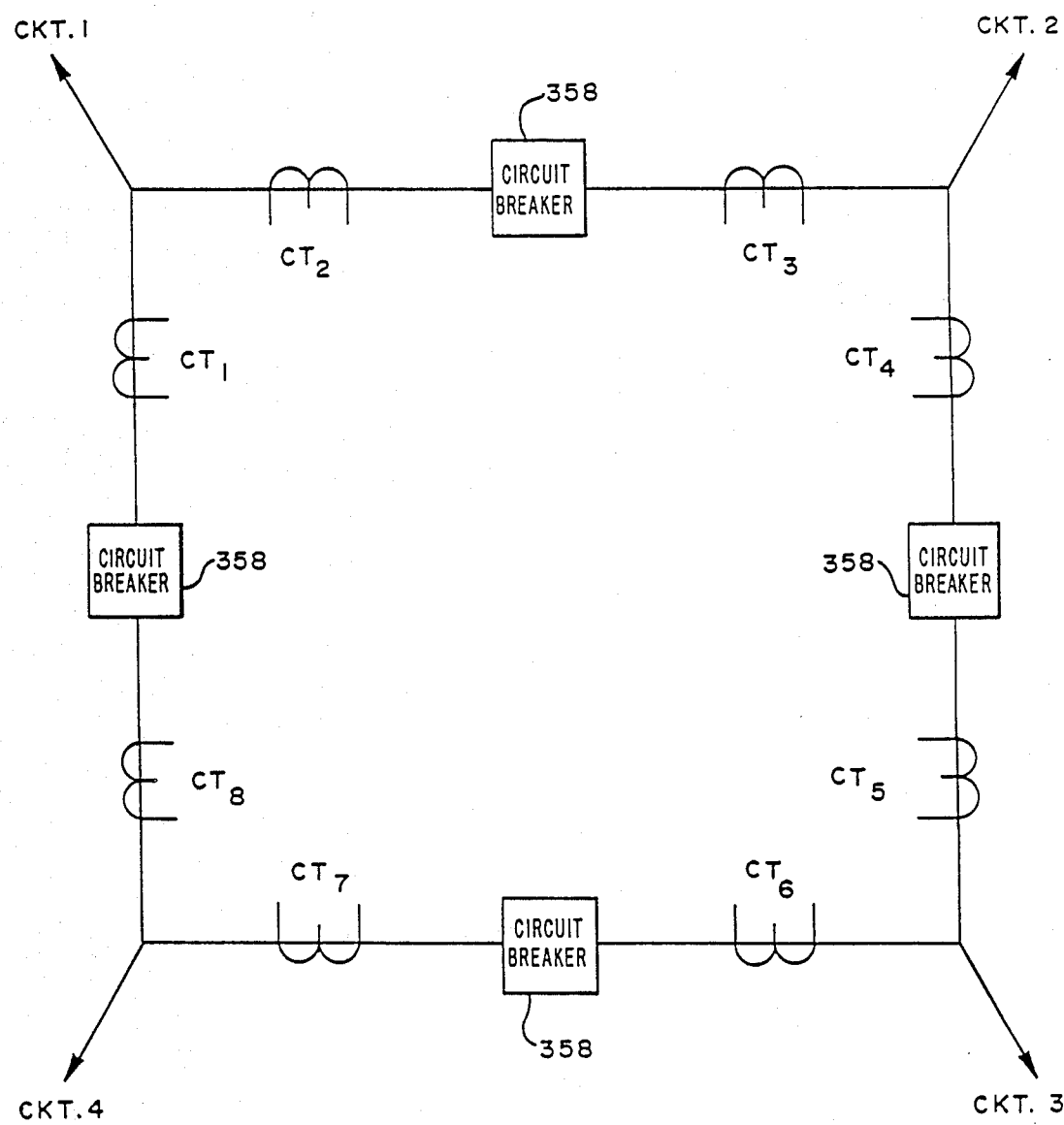
FIG. 63 is a diagram of a type of substation that may be monitored by the electronics shown in FIG. 62.

Speaker-and-a-half method:

Method used to calculate parameters when the substation bus is configured as shown in FIG. 63 Such a configuration is called a Ring Bus. In this configuration, any given circuit is fed from two sources. As a result, two CT's are used to calculate the current in the circuit, one CT on each source. As a result, any parameter requiring current must be calculated in a special way. The currents from each source must be summed and then used in the calculation. This is true whether the effective value (Ieff) is used, or the components (Ia, Ib) are used. To calculate power, then, the results of 3 inputs are now necessary rather than two as before. Circuit breakers are identified as 358.

Circuit: Three (or four) wires whose purpose is to transmit power from the power company. Also called a bus.

Cluster: A collection of inputs which must be sampled at the same time due to phase considerations. (ie. A given voltage group and all the currents related to it through the output personality table constitute a cluster. Also, an 'entry' in the input sequence table)

Current Group: A three phase circuit (3 or 4 conductor) whose current is measured. There may be a maximum of 23 current groups.

Donut: Remote power line monitoring device—linked to RTI via radio link.

I: Current (abbr.)

Ia: Cosine component of current waveform.
Ib: Sine component of current waveform.
Phase: 1. A power carrying wire in a circuit or bus. 2. Time relationship between two signals, (often voltage and current) usually expressed in degrees or radians. (ie. The phase relationship between any two phases of a three phase circuit is 120 degrees)
V: Voltage (abbr.)
Va: Cosine component of voltage waveform.
Vb: Sine component of voltage waveform.
VA: Volt Amps—The vector sum of resistive (watts) and reactive power (VARS).
Voltage Group: A three phase circuit (3 or 4 conductor) whose voltage is used both as a frequency reference and as a voltage reference for subsequent calculations. There may be a maximum of five of these voltage groups (1 per cluster).

Receiver Operation

Figure 64:
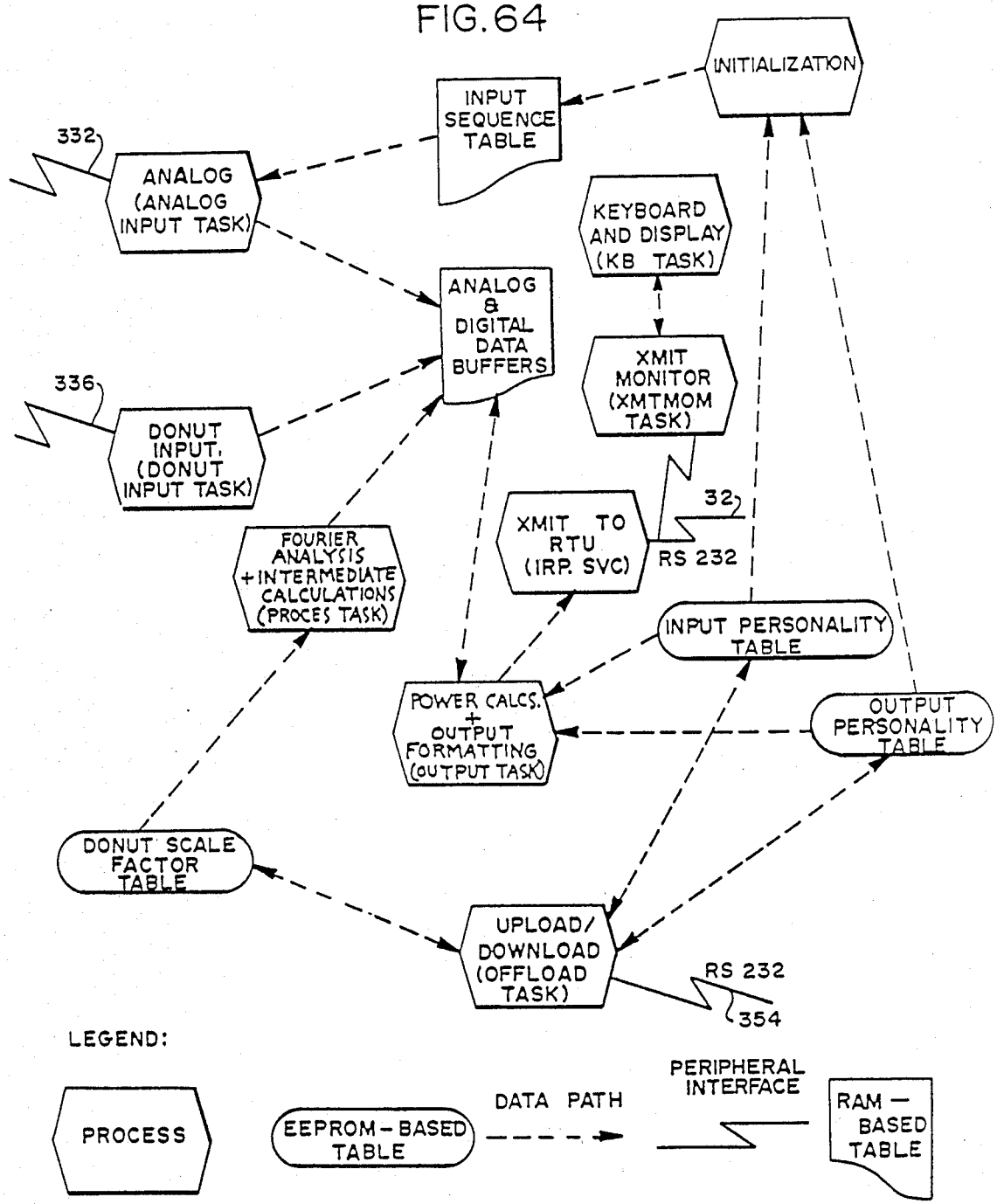
FIG. 64 is a state diagram of a program that may be utilized in the receiver 24.

A state diagram for the program of the central processing unit 334 of FIG. 62 of the receiver 24 is shown in FIG. 64. Processing tasks are indicated by the six-sided blocks. Tables stored in the electrically erasable read only memory 349 are indicated by the elongated oval boxes. Data paths are shown by dotted lines and peripheral interfaces are indicated by zig-zag lines. The transformer inputs 332 and donut input 336 are shown in the upper left. The RS232 port 354 is shown in the lower right and the output RS232 port 32 is indicated in the middle of the diagram.

The donut scale factor table is shown in FIG. 65. Since donuts are normally operated in groups of three for three-phased power measurement, word $\phi$ comprises the group number of the donut (GP), followed by the phase number of the donut (PH). The following words are the voltage scale factor, current scale factor, temperature scale factors, and temperature offset respectively. Temperature offset is an 11 bit value, sign extended to 16 bits. All two word values are a floating point. There is, of course, a separate scale factor table for each of the fifteen donuts provided for. The donut scale factor tables are stored in the electrically erasable read only memory 349.

FIG. 66 is a table of the digital input buffers. There are sixteen required, one to store the received value of each of the fifteen donuts and one to act as a receiver buffer for the serial port of the communication board 106.

Word $\phi$ comprises, in addition to the donut ID and a number called buffer age, indicating how long since the information in the buffer has been updated; the following flags:
DI(Data In)—Set when all data has been received and is ready for analysis. Clear when ready for new data.
AC(Analysis Complete)—Set when effective value and temperature scaling calculations are complete.
VP(Valid Power)—Set if total watts has already been calculated.
IT(Input Type)—Always 3. Identifies this buffer as donut input.

All single word values are 12 bits, sign extended to 16 bits. All double word values are floating point. Buffer age is the number of times this data has been used. The first buffer (buffer $\phi$) is used to assemble incoming donut data. Words 14–16 are defined for $\phi$ 1 donuts only. Word $\phi$ in the buffer number $\phi$ is used for the donut status map. The digital input buffers are stored in the read only memory 346.

FIG. 67 is the input personality table of which there are 48 corresponding to the 48 potential transformer and current transformer inputs. IT identifies the input type which may be voltage, current, or temperature. Link is the input number of the next phase of this group of donuts. It is −1 if there are no other donuts in the group. Correction factor number 1 is used for correcting voltage values. Each of the four correction factors corresponds to a range of input values from the current transformers. Again, as with the donuts, the group number identifies groups of transformers associated with a single power line and PH identifies the phase number of the particular transformer. VG identifies the voltage group that the current is to be associated (that is, sampled) with. It is used, of course, only when the table is used to store values from a current transformer. The input personality tables are stored in the electrically erasable read only memory 349.

48 analog input buffers are provided to store measurements received from the 48 current potential transformers. The form of each of these buffers is shown in FIG. 68.

The follow flags are provided:
DI(Data In)—Set when all raw data has been received and sign extended. Clear when buffer is ready for more data.
AC(Analysis Complete)—Set when Fourier analysis and effective value computations are complete.
VP(Valid Power)—Set if total watts value has already been calculated.
IT(Input Type)—$\phi$=voltage, 1=current, 2=temperature.

Words 1–9 and 10–18 are 12 bit values, sign extended to 16 bits. All 2 word values are floating point. Words 16–18 are defined for $\phi$ 1 of current inputs only. Words 10–18 are undefined for temperature inputs. VP only applies to buffers associated with $\phi$ 1 current inputs. If IT=2 (temperature), the first sample will be converted to floating point and stored at offset 1$\phi$.

In operation, transmissions are received randomly from the donuts 20, transmitted in Manchester code to the serial port to the communications board 106. The checked sum (CRC) is calculated an if it agrees with the check sum (CRC) received, an interrupt is provided to the central processing unit 334, which then transfers the data to data bus 338. The cental processing unit 68000 applies the scale factors and temperature offset to the received values, and calculates the Temperature, effective Voltage ($V_{EFF}$), effective Current ($I_{EFF}$), Scaled Temperature, Total Watts, Watt Seconds and Kilowatt hours from the received data and stores the data in the appropriate Digital Input Buffer in random access memory 346.

In the analog board 340, each of the 48 transformer inputs is sampled in turn. After its condition has been converted to digital form, an interrupt is generated, and the data is supplied to data but 338. It should be noted that the analog board 340 causes the inputs from the potential and current transformers 332 to be Fourier sampled nine times just as current and voltage are sampled in the donuts (see FIG. 34). Thus, the data supplied to the data bus 338 from the analog board 340 comprises 9 successive values over nine alternating current cycles. After all nine have been stored in the random access memory 346, and the appropriate correction factors (FIG. 67) applied, the fundamental sine and cosine Fourier components are calculated just as in the donuts 20.

Then the effective value of current or voltage is calculated and, if appropriate, the Total Watts, Watt Seconds, and Kilowatt hours, and the entire table (FIG. 68) stored in the random access memory 346.

When the receiver 24 is initially set up, the appropriate donut scale factors (FIG. 65) are loaded through RS232 port 354 into the electrical erasable read only memory 349, and these are used to modify the values received from the donuts 20 before they are recorded in the digital input buffers of the random access memory 346. Similarly, an input personality table (FIG. 67) is stored in the electrical erasable read only memory 349 corresponding to each of the current and potential transformers and this is utilized to apply the appropriate corrections to the data received by the analog board 340 before it is recorded in the analog input buffers of the random access memory 346. The scaled data stored in the digital input buffers and the corrected data stored in the analog input buffers is then assembled into a frame or message containing all of the defined data from all of the donuts 20 and all of the transformers 332 and transmitted via transmission link 32 to a receiver which may be the remote terminal interface of the prior art as previously described.

The form of the analog-to-digital, multiplexed input sample and hold circuitry and program in the receiver 24 may be essentially the same as that in the donut. The same is true for the Fourier component calculation program and the calculation of the check sum (CRC). The programs are appropriately modified to run in the 68000 central processing unit with its associated memories.

If harmonic data is desired, then higher Fourier harmonics are calculated in the donuts 20 and transmitted to the receiver 24. The receiver then uses the higher harmonic values to calculate the amplitude of each harmonic it is desired to measure.

The frequency at any donut 20 may be determined, if desired, by measuring the time between transmissions received from the donut as these are an integral multiple (W, see FIG. 34) of the line frequency at the donut. Alternatively, the donut may employ an accurate quartz clock to measure the time between zero crossings (FIG. 34) and transmit this frequency measurement to the receiver.

If desired, power factor may be calculated from the Fourier components and stored in the input buffers (FIGS. 66 and 68). Reactive power (Vars) may be calculated from the Fourier components rather than real power (Watts) as selected by an additional flag in each of the Donut Scale Factor Tables (FIG. 65) and the Input Personality Table (FIG. 67). Alternatively, all of these calculations and others, as well as other information such as frequency, may be stored in expanded Input Buffers (FIGS. 66 and 68).

The electrical erasable read only memory 349 may be unloaded through the RS232 port 354 when desired to check the values stored therein. They may also be displayed in the display 352 and entered or changed by means of the keyboard 350.

The output from the receiver 24 is a frame of 64 (for example) data values from the Input Buffers (FIGS. 66 and 68) chosen by an output Personality Table (not shown) stored in the electrically erasable read only memory 349. This frame of values is transmitted to the Moore remote terminal unit once each second. The output personality table may be displayed on display 352 and entered by keyboard 350 or entered on read out through RS232 port 354.

Practical Application

It will thus be seen that a number of separate novel concepts have been applied to develop a practical state estimator module which may be applied to live power lines; a module which is capable of measuring the temperature of the power line, the ambient temperature, the voltage and current of the line; the frequency and harmonic content of the line; and transmits this information to a receiver where power information such as real and reactive power and power factor may be calculated.

Thus, we have provided a state estimator module which may be installed to all of the live power lines leading to and from a substation and to both sides of power transformers in the substation, and thus provide the totality of information required for complete remote control of the power station from a power control center, and also provide for local control. Our state estimator modules may be installed on live monitored circuits in an existing substation having current and voltage transformers and our receiver used to collect this totality of information and transmit it to a remote terminal unit and thence to a power system control center.

Some of the important concepts which make this novel system possible are the metallic toroidal housing for the module (which is a high frequency but not a low frequency shunt about its contents); the supporting hub and spoke means; spring loaded temperature sensors; novel voltage measuring means; transmission of Fourier components; random burst transmission on a single radio channel with the timing between bursts being artfully chosen to minimize simultaneous transmissions from two or more donuts; novel hinge clamp which may be operated by a novel hot stick mounted tool facilitating the mounting of the module to a energized power conductor; and the concept that such hot stick mounted modules when distributed throughout a power delivery system, can provide for total automatic dynamic state estimator control.

It will thus be seen that the objects set forth above, among those made apparent from the preceding description, are efficiently attained and, since certain changes may be made in the above circuits, constructions and systems, without departing from the scope of the invention, it is intended that all matter contained in the above description, or shown in the accompanying drawings, shall be interpreted as illustrative and not in a limiting sense.

It is also to be understood that the following claims are intended to cover all of the generic and specific features of the invention herein described and all statements of the scope of the invention which as a matter of language might be said to fall therebetween.

Having described our invention, what we claim as new and desire to secure by Letters Patent is:

1. A system for monitoring the state of an electric power delivery network including a plurality of power conductors, said system comprising:
 a plurality of sensor modules distributed within said network, each being removably attached to a respective one of said power conductors of said network, each of said sensor modules adapted to measure at least one characteristic of the conductor to which it is attached, and each of said sensor modules including a radio transmitter for transmitting said measured characteristic;

a radio receiver for receiving said measured characteristic;

a common transmission channel over which said measured characteristic is transmitted from each of said sensor modules to said receiver; and wherein each of said transmitters in each of said sensor modules transmits on said common transmission channel for a transmission period of time duration t with each transmission period being separated by a fixed, preselected time delay interval and said time delay interval between transmissions being different for each of said sensor modules, each of said different time delay intervals being an integral multiple of time duration t, and wherein no two integral multiples of t defining each of said time delay intervals has a common factor.

2. A system as defined in claim 1 wherein each of said sensor modules includes means responsive to a mono frequency signal for determining when said time delay interval associated with each said module has expired;

said mono frequency signal being carried on the power conductor on which each said sensor module is attached.

3. A system as defined in claim 1 wherein each of said sensor modules is assigned a unique identification code and each of said sensor modules includes means for determining said time delay interval for said module based upon said module's identification code.

4. A system as defined in claim 3 wherein each of said sensor modules includes a means for storing a time interval table and said means for determining said time delay interval from said time interval table.

5. A system as defined in claim 1 wherein said transmission period t is smaller than said time delay interval for each of said sensor modules.

6. An information transmission system comprising;

at least two information gathering units, each of said units including a transmitter for transmitting said information;

a receiver for receiving information from said transmitters;

a common transmission channel over which said information is transmitted from each of said transmitters to said receiver; and wherein each of said transmitters transmits on said common transmission channel for a transmission period of time duration t with each transmission period being separated by a fixed, preselected time delay interval and said time delay interval between transmissions being different for each of said units, said time delay interval for a first one of said units being of duration wt where wt is an integral multiple of time duration t, said time delay interval for a second one of said units being yt where yt is an integral multiple of time duration t, and wherein w and y do not have a common factor.

7. A system as defined in claim 6 wherein each of said information gathering units includes timing means responsive to a received signal for determining when a time delay interval associated with each said unit has expired.

8. A system as defined in claim 7 wherein said received signal is an alternating signal with a given frequency.

9. A system as defined in claim 8 wherein said timing means includes means for counting the cycles of said alternating signal.

10. A system as defined in claim 9 wherein each of said units includes means responsive to said means for counting for causing said transmitter of each of said units to transmit said information.

11. A system as defined in claim 8 wherein said alternating signal is provided by a power conductor.

12. A system as defined in claim 11 wherein each of said units is attached to a power conductor for gathering information about said conductor.

* * * * *